(12) United States Patent
Akimoto

(10) Patent No.: US 12,477,886 B2
(45) Date of Patent: Nov. 18, 2025

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 385 days.

(21) Appl. No.: 18/318,104

(22) Filed: May 16, 2023

(65) Prior Publication Data

US 2023/0290808 A1     Sep. 14, 2023

Related U.S. Application Data

(63) Continuation of application No. PCT/JP2021/042841, filed on Nov. 22, 2021.

(30) Foreign Application Priority Data

Nov. 25, 2020 (JP) .................. 2020-195353

(51) Int. Cl.
    *H10H 29/14* (2025.01)
(52) U.S. Cl.
    CPC .................. *H10H 29/142* (2025.01)
(58) Field of Classification Search
    CPC .. H10H 29/142; H10H 20/819; H10H 20/851; H10H 20/857; G09F 9/00; G09F 9/30; G09F 9/33
    See application file for complete search history.

(56) References Cited

U.S. PATENT DOCUMENTS 6,475,923 B1    11/2002  Mitamura
11,961,871 B2 *  4/2024  Kusunoki .............. H10H 20/01
(Continued)

FOREIGN PATENT DOCUMENTS

CN      110459557 A    11/2019
JP      2001-035805 A   2/2001
(Continued)

OTHER PUBLICATIONS

Hyeryun Kim, et al., Fabrication of full-color GaN-based light-emitting diodes on nearly lattice-matched flexible metal foils, Scientific Report, 7:2112, May 18, 2017; DOI: 10.1038/s41598-017-02431-7.

(Continued)

*Primary Examiner* — Victor A Mandala
(74) *Attorney, Agent, or Firm* — Foley & Lardner LLP

(57) ABSTRACT

A method for manufacturing an image display device includes: forming a conductive layer on a first substrate, wherein at least a part of the conductive layer is formed of a single-crystal metal; forming a semiconductor layer on said part of the conductive layer, the semiconductor layer comprising a light-emitting layer; forming a light-emitting element by patterning the semiconductor layer; forming a first insulating film that covers the first substrate, the conductive layer, and the light-emitting element; forming a circuit element on the first insulating film; forming a second insulating film that covers the first insulating film and the circuit element; exposing a surface that includes a light-emitting surface of the light-emitting element by removing a portion of the first insulating film and a portion of the second insulating film; and forming a wiring layer on the second insulating film.

25 Claims, 34 Drawing Sheets

(56) References Cited

U.S. PATENT DOCUMENTS

| | | | |
|---|---|---|---|
| 2017/0373036 A1* | 12/2017 | Yamazaki | H10K 59/38 |
| 2018/0122836 A1* | 5/2018 | Kang | H10H 20/8506 |
| 2018/0122837 A1* | 5/2018 | Kang | H10D 86/60 |
| 2018/0136367 A1 | 5/2018 | Fujii | |
| 2018/0188606 A1* | 7/2018 | Lee | G02F 1/133512 |
| 2018/0294311 A1 | 10/2018 | Hsiang et al. | |
| 2018/0351035 A1 | 12/2018 | Chung et al. | |
| 2019/0081076 A1* | 3/2019 | Okada | G02F 1/136286 |
| 2019/0131343 A1 | 5/2019 | Templier et al. | |
| 2019/0265532 A1* | 8/2019 | Yamazaki | G06F 3/0443 |
| 2019/0273179 A1 | 9/2019 | Iguchi et al. | |
| 2020/0343229 A1 | 10/2020 | Iguchi et al. | |
| 2021/0217805 A1 | 7/2021 | Kusunoki et al. | |
| 2022/0059518 A1 | 2/2022 | Akimoto | |
| 2022/0069187 A1* | 3/2022 | Akimoto | H10H 20/825 |
| 2022/0223776 A1* | 7/2022 | Akimoto | H10H 20/01335 |
| 2023/0215907 A1* | 7/2023 | Akimoto | H10H 29/142 257/72 |
| 2024/0030399 A1* | 1/2024 | Akimoto | H10H 20/857 |

FOREIGN PATENT DOCUMENTS

| | | | |
|---|---|---|---|
| JP | 2002-141492 A1 | 5/2002 | |
| JP | 2008-021745 A | 1/2008 | |
| JP | 2015-015321 A | 1/2015 | |
| JP | 2018-205741 A | 12/2018 | |
| JP | 2019-522894 A | 8/2019 | |
| JP | 2019-152851 A | 9/2019 | |
| JP | 2019-153783 A | 9/2019 | |
| WO | WO-2019/220246 A1 | 11/2019 | |
| WO | WO-2020/226044 A1 | 11/2020 | |
| WO | WO-2020/230667 A1 | 11/2020 | |

OTHER PUBLICATIONS

Jeong Woo Shon, et al., "Fabrication of full-color InGaN—based light-emitting diodes on amorphous substrates by pulsed sputtering", Scientific Reports, 4:5325, Jun. 23, 2014; DOI: 10.1038/srep05325.

International Search Report with English language translation and Written Opinion of the International Searching Authority issued in the corresponding International Patent Application No. PCT/JP2021/042841, dated Jan. 11, 2022.

* cited by examiner

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2021/042841, filed Nov. 22, 2021, which claims priority to Japanese Application No. 2020-195353, filed Nov. 25, 2020. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED, which is a fine light-emitting element, as a self-luminous element. A method has been introduced as a method for manufacturing a display device that uses a micro LED in which individually-formed micro LEDs are sequentially transferred to a drive circuit. However, as the number of elements of micro LEDs increases with higher image quality, such as full HD, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate, an electrode is formed at the semiconductor layer, and bonding is subsequently performed to a circuit board in which a drive circuit is formed (see, e.g., Japanese Patent Publication No. 2002-141492).

SUMMARY

According to certain embodiments of the disclosure, provided are a method for manufacturing an image display device and an image display device in which a transfer process of a light-emitting element is reduced, and the yield is increased.

A method for manufacturing an image display device according to an embodiment of the disclosure includes a process of forming a conductive layer including a first part of a single-crystal metal on a first substrate, a process of forming a semiconductor layer including a light-emitting layer on the first part, a process of patterning the semiconductor layer to form a light-emitting element that includes a bottom surface on the first part and a light-emitting surface which is a surface at a side opposite to the bottom surface, a process of forming a first insulating film that covers the first substrate, the conductive layer, and the light-emitting element, a process of forming a circuit element on the first insulating film, a process of forming a second insulating film that covers the first insulating film and the circuit element, a process of exposing a surface that includes the light-emitting surface by removing a portion of the first insulating film and a portion of the second insulating film, and a process of forming a wiring layer on the second insulating film.

An image display device according to an embodiment of the disclosure includes a substrate including a first surface, a conductive layer that is located on the first surface and includes a first part of a single-crystal metal, a light-emitting element that is located on the first part, includes a bottom surface electrically connected to the first part, and includes a light-emitting surface which is a surface at a side opposite to the bottom surface, a first insulating film that covers the conductive layer, the first surface, and a side surface of the light-emitting element, a circuit element that is located on the first insulating film, a second insulating film that covers the first insulating film and the circuit element, and a wiring layer that is located on the second insulating film.

An image display device according to an embodiment of the disclosure includes a substrate including a first surface, a conductive layer that is located on the first surface and includes a second part of a single-crystal metal, a semiconductor layer that is located on the second part, includes a bottom surface electrically connected to the second part, and includes multiple light-emitting surfaces which are surfaces at a side opposite to the bottom surface, a first insulating film that covers the conductive layer, the first surface, and a side surface of the semiconductor layer, multiple transistors that are located on the first insulating film, a second insulating film that covers the first insulating film and the multiple transistors, and a wiring layer that is located on the second insulating film.

According to an embodiment of the disclosure, a method for manufacturing an image display device is realized in which a transfer process of a light-emitting element is reduced, and the yield is increased.

According to another embodiment of the invention, an image display device is realized in which a transfer process of a light-emitting element is reduced, and the yield is increased.

DETAILED DESCRIPTION

Figure 1:
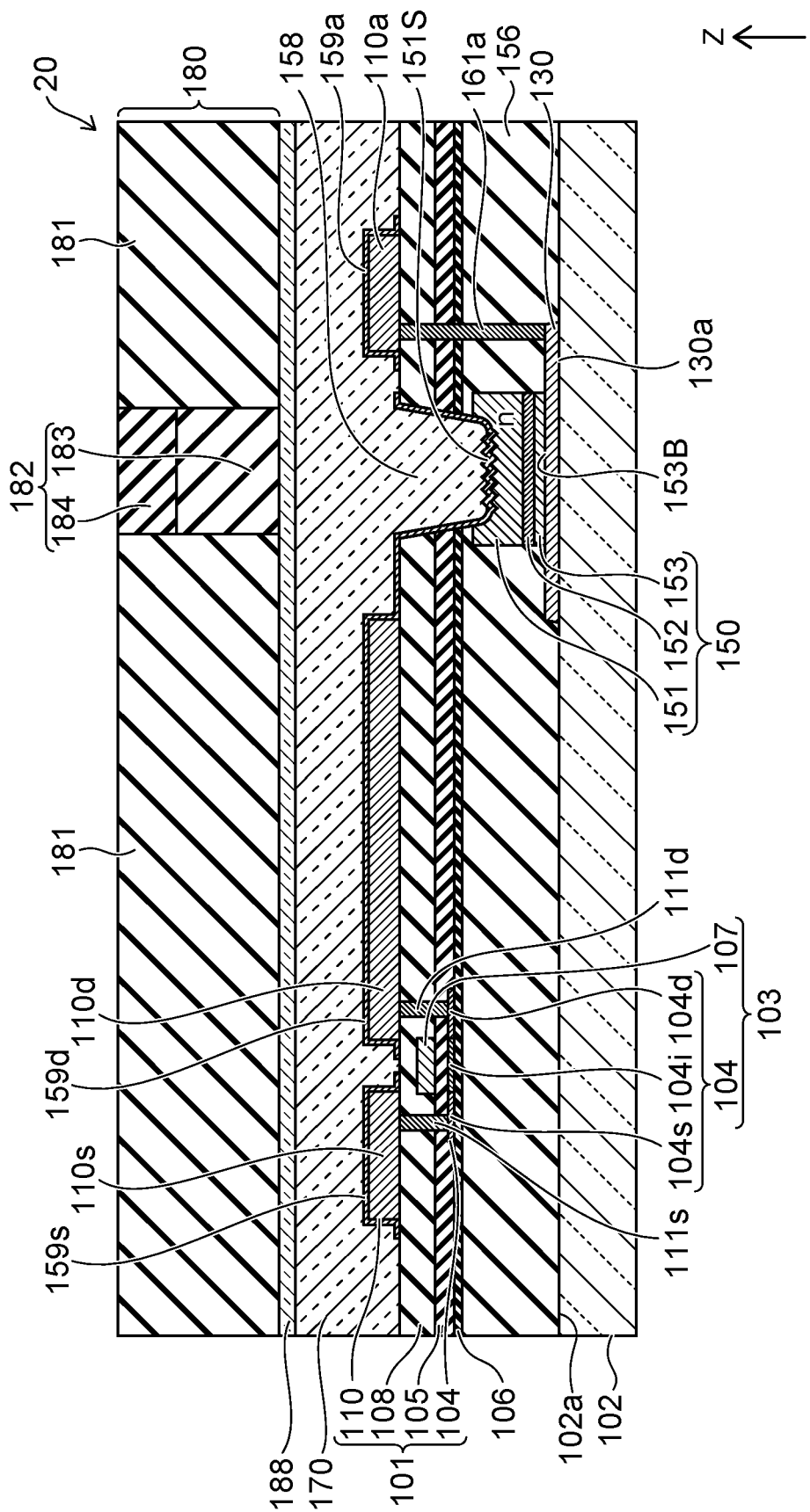
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

The configuration of a subpixel 20 of the image display device of the embodiment is schematically shown in FIG. 1. A pixel that is included in an image displayed in the image display device includes multiple subpixels 20.

Hereinbelow, the description may use an XYZ three-dimensional coordinate system. The subpixels 20 are arranged in a two-dimensional planar configuration. The two-dimensional plane in which the subpixels 20 are arranged is taken as an XY plane. The subpixels 20 are arranged along an X-axis direction and a Y-axis direction. FIG. 1 is an auxiliary cross section along line AA' of FIG. 4 below, and is a cross-sectional view in which cross sections of multiple planes perpendicular to the XY plane are linked in one plane. In the other drawings as well, as in FIG. 1, in a cross-sectional view of multiple planes perpendicular to the XY plane, the X-axis and the Y-axis are not illustrated, and the Z-axis that is perpendicular to the XY plane is shown. That is, in these drawings, the plane perpendicular to the Z-axis is taken as the XY plane. Although the positive direction of the Z-axis may be called "up" or "above" and the negative direction of the Z-axis may be called "down" or "below" for convenience, directions along the Z-axis are not necessarily directions in which gravity acts. Also, a length in a direction along the Z-axis may be called a height.

The subpixel 20 includes a light-emitting surface 151S that is substantially parallel to the XY plane. The light-emitting surface 151S is a surface that radiates light mainly in the positive direction of the Z-axis orthogonal to the XY plane.

As shown in FIG. 1, the subpixel 20 of the image display device includes a substrate 102, a conductive layer 130, a light-emitting element 150, a first inter-layer insulating film 156, a transistor 103, a second inter-layer insulating film 108, and a wiring layer 110.

According to the embodiment, the substrate 102 on which the light-emitting element 150 is formed is a light-transmitting substrate, e.g., a glass substrate. The substrate 102 includes a first surface 102a. The first surface 102a is a surface that is substantially parallel to the XY plane. The light-emitting element 150 is formed on the first surface 102a. The light-emitting element 150 is driven by the transistor 103 provided with the first inter-layer insulating film 156 interposed. The transistor 103 is a thin film transistor (Thin Film Transistor, TFT) and is formed on the first inter-layer insulating film 156. The process of forming the circuit element that includes the TFT on a large glass substrate is advantageous in that the process is established for manufacturing a liquid crystal panel, an organic EL panel, etc., and an existing plant can be utilized.

The subpixel 20 further includes a color filter 180. The color filter (the wavelength conversion member) 180 is located on a surface resin layer 170 with a transparent thin film adhesive layer 188 interposed. The surface resin layer 170 is located on the second inter-layer insulating film 108 and the wiring layer 110.

The configuration of the subpixel 20 will now be described in detail.

The conductive layer 130 is located on the first surface 102a. The conductive layer 130 includes a connection plate (a first part) 130a. The light-emitting element 150 is located on the connection plate 130a. The connection plate 130a is a film-shaped, layer-shaped, or plate-shaped conductive member that has the shape of a rectangle, any polygon, ellipse, circle, etc., when projected onto the XY plane. The connection plate 130a is electrically connected with the light-emitting element 150 at a bottom surface 153B of the light-emitting element 150.

In the example, one connection plate 130a is provided for each subpixel 20. The different connection plates 130a may be connected to each other inside the conductive layer 130, or may not be connected. In the example, different connection plates 130a are connected to, for example, a power supply line 3 of FIG. 3 below by a via 161a and a wiring part (a first wiring part) 110a provided for each connection plate 130a.

A portion or the entire conductive layer 130 is formed of a single-crystal metal. It is favorable for the entire conductive layer 130 to be formed of a single-crystal metal layer. A portion or the entire connection plate 130a is formed of a single-crystal metal. The locations of the connection plate 130a at which the light-emitting elements 150 are located are formed of a single-crystal metal and are, for example, single-crystal metal layers. The single-crystal metal layer may be a portion in the thickness direction including the surface to which the bottom surface 153B of the light-emitting element 150 is connected. When projected onto the XY plane, the outer perimeter of the single-crystal metal layer contains the outer perimeter of the bottom surface 153B when projected onto the single-crystal metal layer. That is, the outer perimeter of the bottom surface 153B is located within the outer perimeter of the single-crystal metal. The area of the single-crystal metal layer is greater than the area of the bottom surface 153B. Hereinbelow, for the other embodiments as well, the entire conductive layer 130 and connection plate 130a are taken to be formed of a single-crystal metal layer.

The metal material that is used to form the conductive layer 130 and the connection plate 130a is, for example, Cu, Hf, etc. The metal material that is included in the conductive layer 130 and the connection plate 130a is not limited to Cu or Hf as long as the metal material can be monocrystallized by annealing treatment that is self-aligning with a LTPS process. Because the connection plate 130a is formed of a metal material or the like, the connection plate 130a has high conductivity and can be electrically connected to the light-emitting element 150 with low resistance.

The light-emitting element 150 includes the bottom surface 153B and the light-emitting surface 151S. The light-emitting element 150 is a prismatic or cylindrical element that has the bottom surface 153B on the connection plate 130a. The bottom surface 153B is located on the connection plate 130a and electrically connected to the connection plate 130a. The light-emitting surface 151S is the surface at the side opposite to the bottom surface 153B of the light-emitting element 150.

Favorably, when projected onto the XY plane, the outer perimeter of the connection plate 130a is set to contain the outer perimeter of the light-emitting element 150 when the light-emitting element 150 is projected. That is, the outer perimeter of the light-emitting element 150 is located within the outer perimeter of the connection plate 130a when projected onto the XY plane. The conductive layer 130 and the connection plate 130a are light-reflective and are formed of a metal material or the like such as those described above. Therefore, the connection plate 130a reflects the downward-scattered light of the light-emitting element 150 toward the light-emitting surface 151S side, and substantially improves the luminous efficiency of the light-emitting element 150.

More favorably, when projected onto the XY plane, the outer perimeter of the connection plate 130a is set not to contain the outer perimeter of the transistor 103 when the transistor 103 is projected onto the plane including the connection plate 130a. That is, the outer perimeter of the connection plate 130a is located outward of the outer perimeter of the transistor 103 when projected onto the XY plane. Thus, the transistor 103 does not easily receive the reflected light from the connection plate 130a, and the probability of a malfunction occurring can be sufficiently reduced. The outer perimeter of the transistor 103 when projected onto the XY plane corresponds to the outer perimeter of a TFT channel 104 when projected onto the XY plane, and this is similar for the embodiments and modifications described below as well.

The light-emitting element 150 includes a p-type semiconductor layer (a first semiconductor layer) 153, a light-emitting layer 152, and an n-type semiconductor layer (a second semiconductor layer) 151. The p-type semiconductor layer 153, the light-emitting layer 152, and the n-type semiconductor layer 151 are stacked in this order from the bottom surface 153B toward the light-emitting surface 151S. Accordingly, the p-type semiconductor layer 153 is electrically connected to the connection plate 130a.

When the light-emitting element 150 has a prism shape, the shape of the light-emitting element 150 when projected onto the XY plane is, for example, substantially square or rectangular. When the shape of the light-emitting element 150 when projected onto the XY plane is polygonal including rectangular, the corner portions may be rounded. When the shape of the light-emitting element 150 when projected onto the XY plane is a cylindrical shape, the shape of the light-emitting element 150 when projected onto the XY plane is not limited to circular and may be, for example, elliptical. The degree of freedom of the layout is increased by appropriately selecting the shape, arrangement, etc., of the light-emitting element when projected onto the XY plane.

For example, a gallium nitride compound semiconductor that includes a light-emitting layer of $In_xAl_yGa_{1-x-y}N$ ($0 \leq X$, $0 \leq Y$, and $X+Y<1$) or the like is favorably included in the light-emitting element 150. Hereinbelow, the gallium nitride compound semiconductor described above may be called simply gallium nitride (GaN). According to an embodiment of the invention, the light-emitting element 150 is a so-called light-emitting diode. The wavelength of the light emitted by the light-emitting element 150 is, for example, about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The areas of the light-emitting layers 152 when projected onto the XY plane are set according to the light emission colors of the red, green, and blue subpixels. Hereinbelow, the area when projected onto the XY plane may be called simply the area. The area of the light-emitting layer 152 is appropriately set according to the luminous efficiency, the conversion efficiency of a color conversion part 182 of the color filter 180, etc. That is, the areas of the light-emitting layers 152 of the subpixels 20 of the light emission colors may be the same or may be different between the light emission colors. The area of the light-emitting layer 152 is the area of the region surrounded with the outer perimeter of the light-emitting layer 152 projected onto the XY plane.

The first inter-layer insulating film (a first insulating film) 156 covers the first surface 102a and the conductive layer 130. The first inter-layer insulating film 156 covers the side surface of the light-emitting element 150. The first inter-layer insulating film 156 does not cover the light-emitting surface 151S. The first inter-layer insulating film 156 insulates the light-emitting elements 150 from each other. The first inter-layer insulating film 156 insulates the light-emitting element 150 from circuit elements such as the transistor 103, etc. The first inter-layer insulating film 156 provides a flat surface for forming a circuit 101 including circuit elements such as the transistor 103, etc. By covering the light-emitting element 150, the first inter-layer insulating film 156 protects the light-emitting element 150 from thermal stress when forming the transistor 103, etc.

The first inter-layer insulating film 156 is formed of an organic or inorganic insulating material. The insulating material included in the first inter-layer insulating film 156 is favorably a white resin. The white resin reflects the light of the light-emitting element 150 emitted in the lateral direction, returning light caused by the interface of the color filter 180, etc.; therefore, the use of a white resin as the first inter-layer insulating film 156 contributes to the substantial improvement of the luminous efficiency of the light-emitting element 150.

The white resin is formed by dispersing fine scattering particles having a Mie (Mie) scattering effect in a silicon resin such as SOG (Spin On Glass) or the like, a transparent resin such as a novolak phenolic resin, etc. The fine scattering particles are colorless or white and have a diameter of about ⅒ to about several times the wavelength of the light emitted by the light-emitting element 150. The fine scattering particles that are favorably used have a diameter of about ½ of the light wavelength. For example, $TiO_2$, $Al_2O_3$, $ZnO$, etc., are examples of such a fine scattering particle.

The white resin also can be formed by utilizing many fine voids or the like dispersed in a transparent resin. When whitening the first inter-layer insulating film 156, for example, a $SiO_2$ film or the like that is formed by ALD (Atomic-Layer-Deposition) or CVD (Chemical Vapor Deposition) may be used instead of SOG, etc.

The first inter-layer insulating film 156 may be a black resin. By using a black resin as the first inter-layer insulating film 156, the scattering of the light inside the subpixel 20 is suppressed, and stray light is more effectively suppressed. An image display device in which stray light is suppressed can display a sharper image.

A TFT underlying film 106 is formed over the first inter-layer insulating film 156. The TFT underlying film 106 is provided to ensure flatness when forming the transistor 103, and to protect the TFT channel 104 of the transistor 103 from contamination, etc., in the heat processing. The TFT underlying film 106 is, for example, a stacked film of $SiO_2$ and SiN.

The transistor 103 is formed on the TFT underlying film 106. In addition to the transistor 103, other circuit elements such as transistors, capacitors, etc., are formed on the TFT underlying film 106, and the circuit 101 is configured using wiring, etc. For example, in FIG. 3 below, the transistor 103 corresponds to a drive transistor 26. Also, a select transistor 24, a capacitor 28, etc., are circuit elements in FIG. 3. The circuit 101 includes the TFT channel 104, an insulating layer 105, the second inter-layer insulating film 108, vias 111s and 111d, and the wiring layer 110.

In the example, the transistor 103 is an n-channel thin film transistor (Thin Film Transistor, TFT). The transistor 103 includes the TFT channel 104 and a gate 107. Favorably, the TFT channel 104 is formed by a low-temperature polysilicon (Low Temperature Poly Silicon, LTPS) process. In the LTPS process, the TFT channel 104 is formed by polycrystallizing and activating a region of amorphous Si formed on the TFT underlying film 106. For example, laser annealing is used to polycrystallize and activate the amorphous Si region. The TFT that is formed by the LTPS process has sufficiently high mobility.

The TFT channel 104 includes regions 104s, 104i, and 104d. The regions 104s, 104i, and 104d each are located on the TFT underlying film 106. The region 104i is located between the region 104s and the region 104d. The regions 104s and 104d are doped with an impurity such as phosphorus (P) or the like by ion implantation, etc., to form n-type semiconductor regions, and have ohmic connections with the vias 111s and 111d.

The gate 107 is located on the TFT channel 104 with the insulating layer 105 interposed. The insulating layer 105 is provided to insulate the TFT channel 104 and the gate 107 and to insulate from other adjacent circuit elements. The current that flows between the regions 104s and 104d can be controlled by a channel formed in the region 104i when a potential higher than that of the region 104s is applied to the gate 107.

The insulating layer 105 is, for example, $SiO_2$. The insulating layer 105 may be a multilevel insulating layer that includes $SiO_2$, $Si_3N_4$, etc., according to the covered region.

For example, the gate 107 may be formed of polycrystalline Si or may be formed of a refractory metal such as W, Mo, etc. For example, the polycrystalline Si film of the gate 107 is formed by CVD, etc.

The second inter-layer insulating film (a second insulating film) 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film of $SiO_2$, etc. The second inter-layer insulating film 108 also functions as a planarization film for forming the wiring layer 110.

The first inter-layer insulating film 156, the TFT underlying film 106, the insulating layer 105, and the second inter-layer insulating film 108 are configured as described above and therefore are not provided above the light-emitting surface 151S. That is, an opening 158 is formed by removing portions of the first inter-layer insulating film 156, the TFT underlying film 106, the insulating layer 105, and the second inter-layer insulating film 108. The light-emitting surface 151S is exposed via the opening 158. As described below, the opening 158 is filled with the surface resin layer 170.

The vias 111s and 111d are provided to extend through the second inter-layer insulating film 108 and the insulating layer 105. The wiring layer 110 is formed on the second inter-layer insulating film 108. The wiring layer 110 includes multiple wiring parts that may have different potentials. In the example, the wiring layer 110 includes wiring parts 110s, 110d, and 110a.

A portion of the wiring part 110s is located above the region 104s. For example, the wiring part 110s is connected to a ground line 4 shown in FIG. 3 below. A portion of the wiring part 110d is located above the region 104d. Another portion of the wiring part 110d is located at the vicinity of the light-emitting surface 151S but is not directly connected to the light-emitting surface 151S. As described below, the wiring part 110d is electrically connected to the light-emitting surface 151S via a light-transmitting electrode 159d. A portion of the wiring part 110a is located above the connection plate 130a. For example, the wiring part 110a is connected to the power supply line 3 shown in FIG. 3 below.

In FIG. 1 and subsequent cross-sectional views, unless otherwise noted, the reference numeral of the wiring layer is displayed at a position beside one wiring part included in the wiring layer to be marked with the reference numeral.

The light-transmitting electrode 159d is provided over the wiring part 110d. The light-transmitting electrode 159d is provided over the light-emitting surface 151S. The light-transmitting electrode 159d also is located between the wiring part 110d and the light-emitting surface 151S and electrically connects the wiring part 110d and the light-emitting surface 151S.

A light-transmitting electrode 159s is provided over the wiring part 110s. For example, the light-transmitting electrode 159s is connected to the ground line 4 of the circuit of FIG. 3 together with the wiring part 110s. A light-transmitting electrode 159a is provided over the wiring part 110a. For example, the light-transmitting electrode 159a is connected to the power supply line 3 of the circuit of FIG. 3 together with the wiring part 110a. The light-transmitting electrode 159d, the light-transmitting electrode 159s, and the light-transmitting electrode 159a are formed of transmissive conductive films. The light-transmitting electrodes 159d, 159s, and 159a favorably include ITO films, ZnO films, etc.

As in the example, favorably, surface roughening of the light-emitting surface 151S is performed. When the light-emitting surface 151S of the light-emitting element 150 is a rough surface, the light extraction efficiency can be increased.

By providing the light-transmitting electrode 159d on the light-emitting surface 151S, the connection area between the light-transmitting electrode 159d and the n-type semiconductor layer 151 can be increased, the area of the light-emitting surface 151S can be substantially increased, and the connection resistance can be reduced. Also, the entire surface exposed via the opening 158 can be used as the light-emitting surface 151S; therefore, the area of the light-emitting surface 151S can be substantially increased, and the luminous efficiency can be increased. Because the light-emitting surface 151S is a rough surface, the luminous efficiency can be further increased by reducing the contact resistance by increasing the connection area between the light-emitting surface 151S and the light-transmitting electrode 159d.

The via 111s is located between the wiring part 110s and the region 104s and electrically connects the wiring part 110s and the region 104s. The via 111d is located between the wiring part 110d and the region 104d and electrically connects the wiring part 110d and the region 104d.

The wiring part 110s and the light-transmitting electrode 159s are connected to the region 104s by the via 111s. The region 104s is a source region of the transistor 103. Accordingly, the source region of the transistor 103 is electrically connected to the ground line 4 by the via 111s, the wiring part 110s, and the light-transmitting electrode 159s.

The wiring part 110d and the light-transmitting electrode 159d are connected to the region 104d by the via 111d. The region 104d is a drain region of the transistor 103. Accordingly, the drain region of the transistor 103 is electrically connected to the n-type semiconductor layer 151 by the via 111d, the wiring part (a second wiring part) 110d, and the light-transmitting electrode 159d.

The via 161a is provided to extend through the second inter-layer insulating film 108, the insulating layer 105, the TFT underlying film 106, and the first inter-layer insulating film 156. The via 161a is located between the wiring part 110a and the connection plate 130a and electrically connects the wiring part 110a and the connection plate 130a. Accordingly, for example, the p-type semiconductor layer 153 is electrically connected to the power supply line 3 of the circuit of FIG. 3 via the connection plate 130a, the via 161a, the wiring part 110a, and the light-transmitting electrode 159a.

For example, the wiring layer 110 and the vias 111s, 111d, and 161a are formed of Al, Cu, or an alloy of Al and Cu. The wiring layer 110 and the vias 111s, 111d, and 161a may be formed of a stacked film of Al, Ti, and the like, etc. For example, in a stacked film of Al and Ti, Al is stacked on a thin film of Ti, and then Ti is stacked on the Al.

The surface resin layer 170 covers the second inter-layer insulating film 108, the wiring layer 110, and the light-transmitting electrodes 159s, 159d, and 159a. The surface resin layer 170 also is filled into the opening 158. The surface resin layer 170 is located on the light-emitting surface 151S with the light-transmitting electrode 159d interposed. The surface resin layer 170 that is filled into the opening 158 is located on the light-transmitting electrode 159d, which is provided to cover the side surfaces of the first inter-layer insulating film 156, the TFT underlying film 106, the insulating layer 105, and the second inter-layer insulating film 108. The surface resin layer 170 is a transparent resin, protects the second inter-layer insulating film 108, the wiring layer 110, and the light-transmitting electrodes 159a, 159d, and 159s, and provides a planarized surface for bonding the color filter 180.

The color filter 180 includes a light-shielding part 181 and the color conversion part 182. The color conversion part 182 is located directly above the light-emitting surface 151S of the light-emitting element 150 to correspond to the shape of the light-emitting surface 151S. The portion of the color filter 180 other than the color conversion part 182 is the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, the first layer is the color conversion layer 183, and the second layer is the filter layer 184. The color conversion layer 183 of the first layer is located at a position that is more proximate to the light-emitting element 150. The filter layer 184 is stacked on the color conversion layer 183.

The color conversion layer 183 converts the wavelength of the light emitted by the light-emitting element 150 into the desired wavelength. When the subpixel 20 emits red, for example, light of the wavelength of the light-emitting element 150, i.e., 467 nm±30 nm, is converted into light of a wavelength of about 630 nm±20 nm. When the subpixel 20 emits green, for example, light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the light-emitting element 150 may output the light via the color conversion layer 183, or may output the light as-is without the light passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide a one-layer color conversion layer 183 to convert the wavelength of the output light into about 467 nm±30 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

Figure 2:
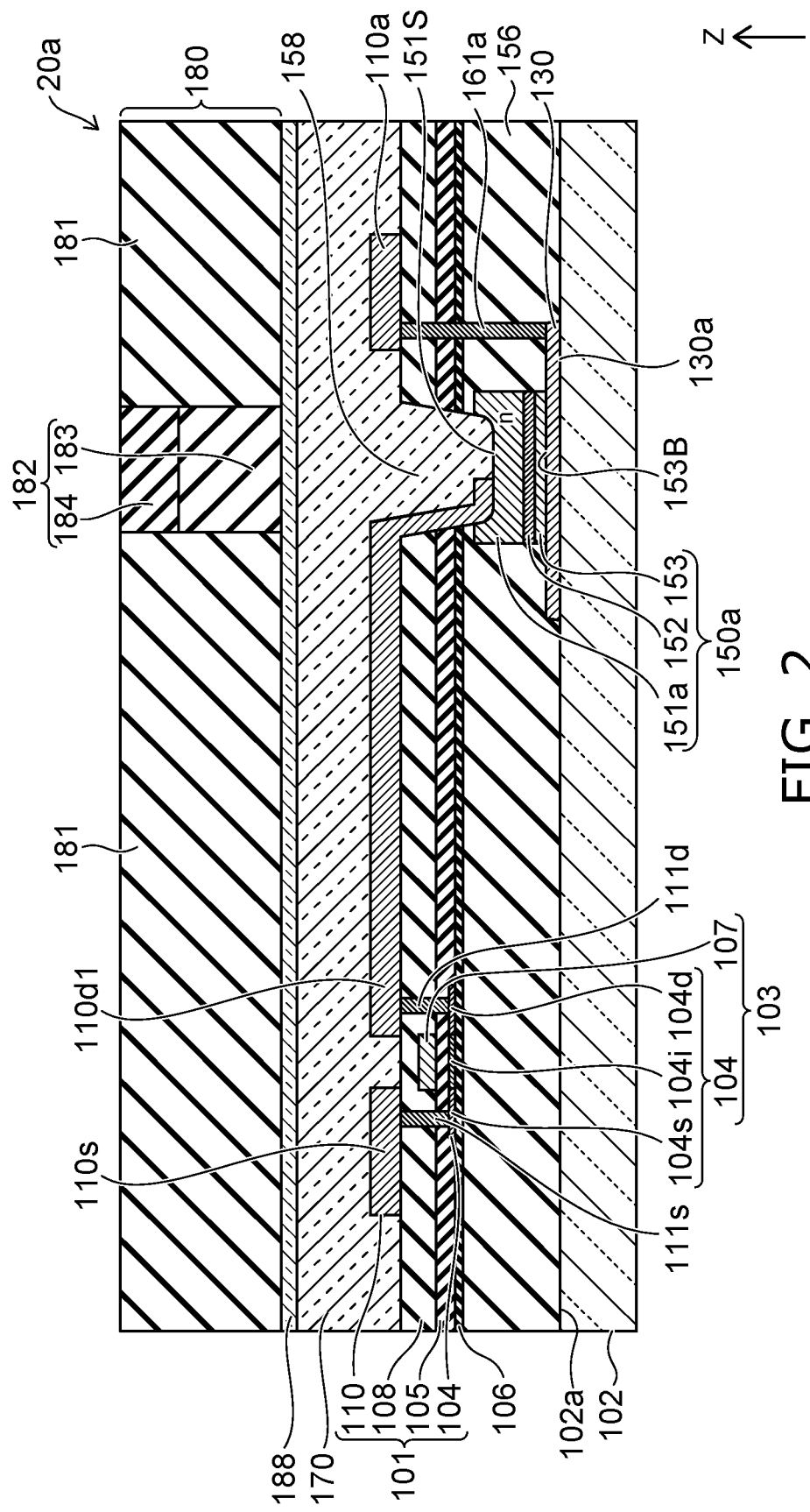
FIG. 2 is a cross-sectional view schematically showing a portion of an image display device according to a modification of the first embodiment.

FIG. 2 is a cross-sectional view schematically showing a portion of an image display device according to a modification of the embodiment.

In a subpixel 20a in the case of FIG. 2, the connection method between a light-emitting element 150a and a wiring part 110d1 is different from that of the first embodiment described above. The modification also differs from the first embodiment in that the light-transmitting electrode is not provided on the wiring parts 110s, 110d1, and 110a. Otherwise, the modification is the same as the first embodiment, the same components are marked with the same reference numerals, and a detailed description is omitted as appropriate. FIG. 2 also displays the structure of the surface resin layer 170 and higher parts. Such an upper structure also is the same as that of the first embodiment.

As shown in FIG. 2, the subpixel 20a includes the light-emitting element 150a and the wiring part 110d1. A portion of the wiring part 110d1 is located above the region 104d. Another portion of the wiring part 110d1 is provided to extend to the light-emitting surface 151S, and has a tip connected to a surface including the light-emitting surface 151S. The surface including the light-emitting surface 151S is a surface in the same plane as the light-emitting surface 151S. The tip of the wiring part 110*d*1 is connected to this surface other than the light-emitting surface 151S. Although the light-emitting surface 151S is not roughened in the example, the light-emitting surface 151S may be roughened. When not roughened, a process for roughening can be omitted.

The embodiment can include either of the configurations of the subpixels 20 and 20*a* described above. Examples in which the surface including the light-emitting surface is electrically connected via a light-transmitting electrode are shown in other embodiments and their modifications described below. The surface including the light-emitting surface is not limited to the example, and a portion of a wiring part may be directly connected without interposing a light-transmitting electrode.

Figure 3:
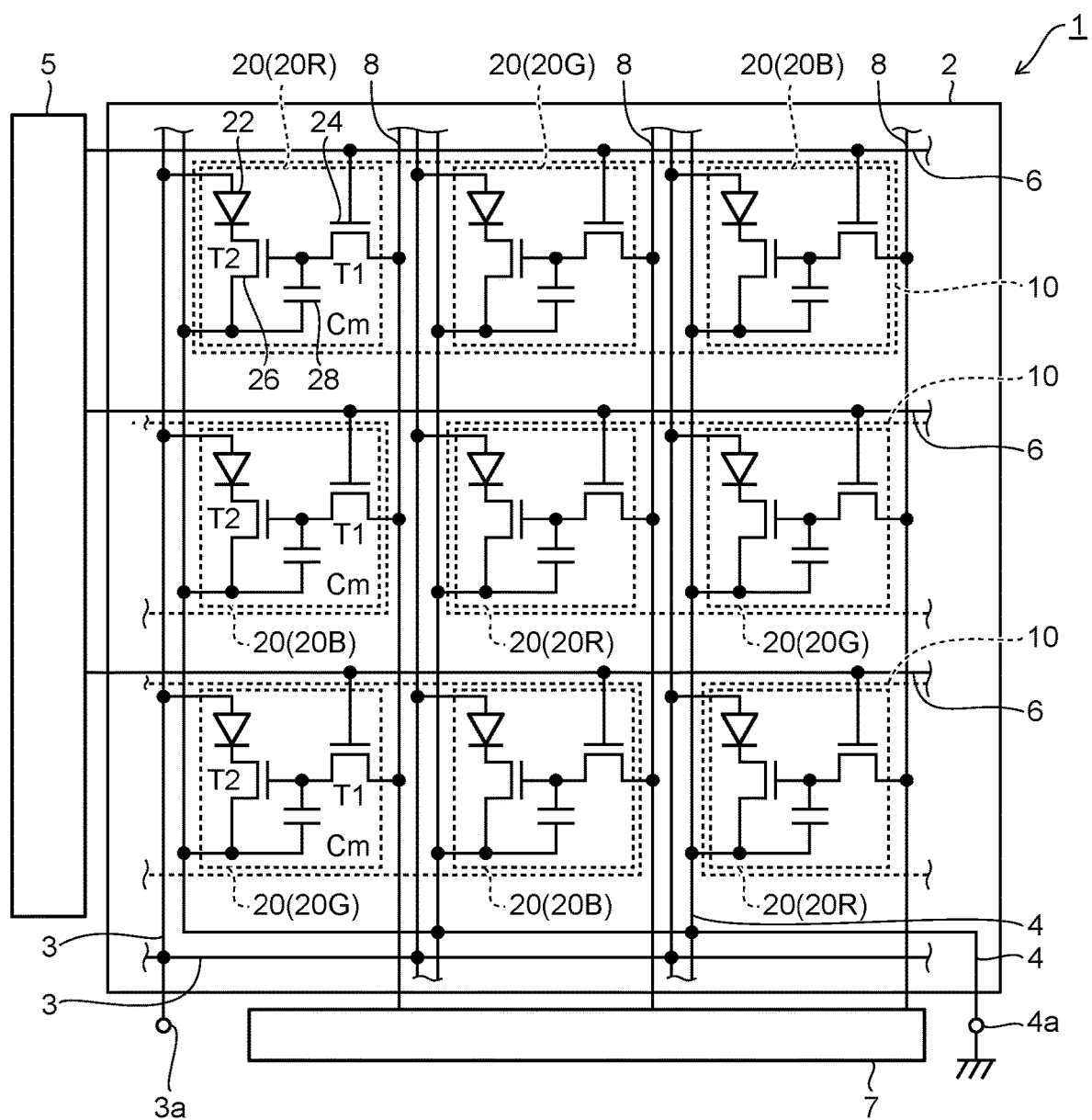
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 is determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and a GND terminal 4*a*. The power supply terminal 3*a* and the GND terminal 4*a* are located respectively at end portions of the power supply line 3 and the ground line 4, and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 3 and in FIG. 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel TFT, and the cathode electrode of the light-emitting element 22 is connected to the drain electrode of the drive transistor 26. Major electrodes of the drive transistor 26 and the select transistor 24 are drain electrodes and source electrodes. The anode electrode of the light-emitting element 22 is connected to a p-type semiconductor layer. The cathode electrode of the light-emitting element is connected to an n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

Figure 4:
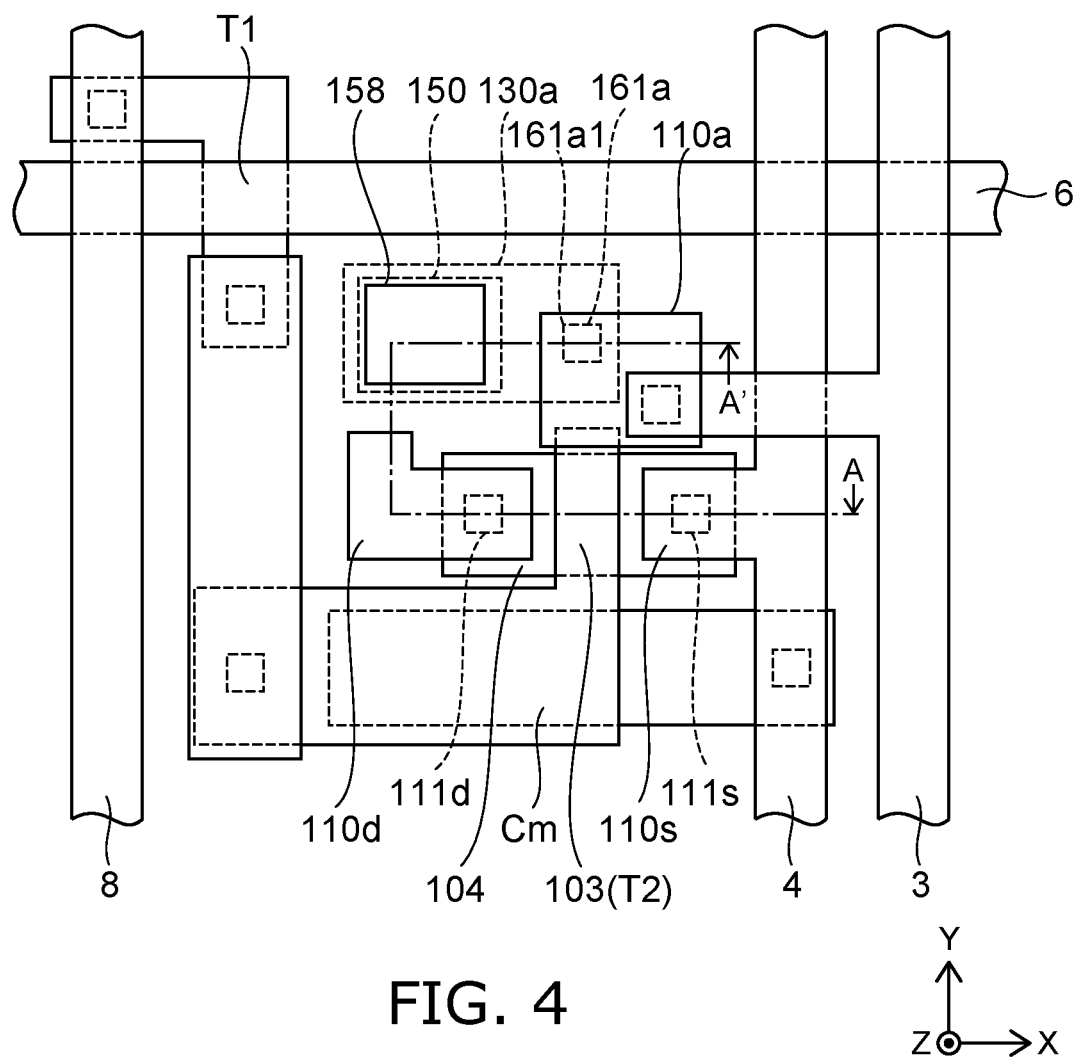
FIG. 4 is a schematic plan view illustrating a portion of the image display device of the first embodiment.

FIG. 4 is a schematic plan view illustrating a portion of the image display device of the embodiment.

According to the embodiment as described in reference to FIG. 1, the light-emitting element 150 and the drive transistor 103 are stacked in the Z-axis direction with the first inter-layer insulating film 156 interposed. In other words, the light-emitting element 150 is formed in a different layer from the layer in which the transistor 103 is formed. The light-emitting element 150 corresponds to the light-emitting element 22 in FIG. 3. The drive transistor 103 corresponds to the drive transistor 26 in FIG. 3 and is labeled as T2. To avoid complexity, the light-transmitting electrode is not illustrated in FIG. 4.

As shown in FIG. 4, the anode electrode of the light-emitting element 150 is located on the connection plate 130a and electrically connected with the connection plate 130a. The connection plate 130a is located in a lower layer than the transistor 103 or the wiring layer 110 shown in FIG. 1. The connection plate 130a is electrically connected to the wiring part 110a by the via 161a. More specifically, one end of the via 161a is connected to the connection plate 130a, and the other end of the via 161a is connected to the wiring part 110a via a contact hole 161a1.

The cathode electrode of the light-emitting element 150 is provided by the n-type semiconductor layer 151 shown in FIG. 1. The wiring part 110d is covered with the light-transmitting electrode 159d shown in FIG. 1. The light-transmitting electrode 159d covers the light-emitting surface 151S. The light-transmitting electrode 159d also is located between the wiring part 110d and the light-emitting surface 151S; therefore, the cathode electrode of the light-emitting element 150 is electrically connected to the wiring part 110d.

A portion of the wiring part 110d is connected to the drain electrode of the transistor 103 by the via 111d. The drain electrode of the transistor 103 is the region 104d shown in FIG. 1. The source electrode of the transistor 103 is connected to the wiring part 110s by the via 111s. The source electrode of the transistor 103 is the region 104s shown in FIG. 1. In the example, the wiring layer 110 includes the ground line 4, and the wiring part 110s is connected to the ground line 4.

In the example, the power supply line 3 is located in a higher layer than the wiring layer 110. Although not illustrated in FIG. 1, an inter-layer insulating film also is provided on the wiring layer 110. The power supply line 3 is located on the inter-layer insulating film of the uppermost layer and is insulated from the ground line 4.

Thus, by using the via 161a, the light-emitting element 150 can be electrically connected to the wiring part 110a located in a higher layer than the light-emitting element 150. Also, the light-emitting element 150 can be electrically connected to the transistor 103 located in a higher layer than the light-emitting element 150 via the wiring part 110d by exposing the light-emitting surface 151S via the opening 158 and by providing the light-transmitting electrode 159d over the opening 158.

A method for manufacturing the image display device 1 of the embodiment will now be described.

FIGS. 5A to 7B are schematic cross-sectional views illustrating the method for manufacturing the image display device of the embodiment.

Figure 5A:
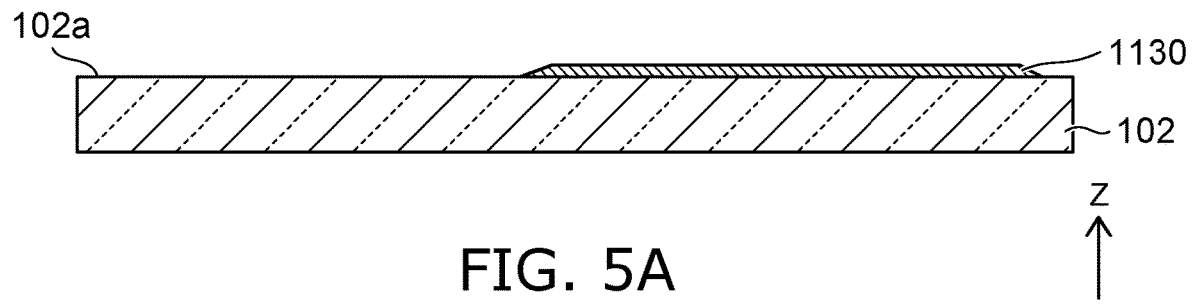
FIG. 5A is a schematic cross-sectional view illustrating a method for manufacturing the image display device of the first embodiment.

According to the method for manufacturing the image display device 1 of the embodiment as shown in FIG. 5A, a substrate (a first substrate) 102 is prepared. The substrate 102 is a light-transmitting substrate and is, for example, a substantially rectangular glass substrate of about 1500 mm×1800 mm. A conductive layer 1130 is formed on the first surface 102a. For example, the conductive layer (a metal layer) 1130 is formed by forming a layer of a metal material by sputtering, etc., on the entire surface of the first surface 102a and then patterning so that the location at which the light-emitting layer will be formed remains.

Or, the conductive layer 1130 may be formed by providing, on the first surface 102a, a mask including a pattern having an opening at the location at which the light-emitting layer will be formed, and by subsequently forming a patterned conductive layer 1130.

For example, the conductive layer 1130 is formed using a metal material such as Cu, Hf, etc. To form at a low temperature, sputtering or the like is favorably used to form the conductive layer 1130.

The patterned conductive layer 1130 is monocrystallized by annealing treatment. Favorably, annealing treatment is performed to monocrystallize the entire patterned conductive layer 1130. To monocrystallize the conductive layer 1130, for example, it is favorable to use annealing treatment by laser irradiation. In pulsed laser annealing, the conductive layer 1130 can be monocrystallized in a state in which the effects of the temperature on the layers lower than the conductive layer 1130 are suppressed to a low temperature of about to 500° C. of 400° C.; therefore, the substrate 102 can include glass, a flexible substrate made of an organic resin described below, etc.

Figure 5B:
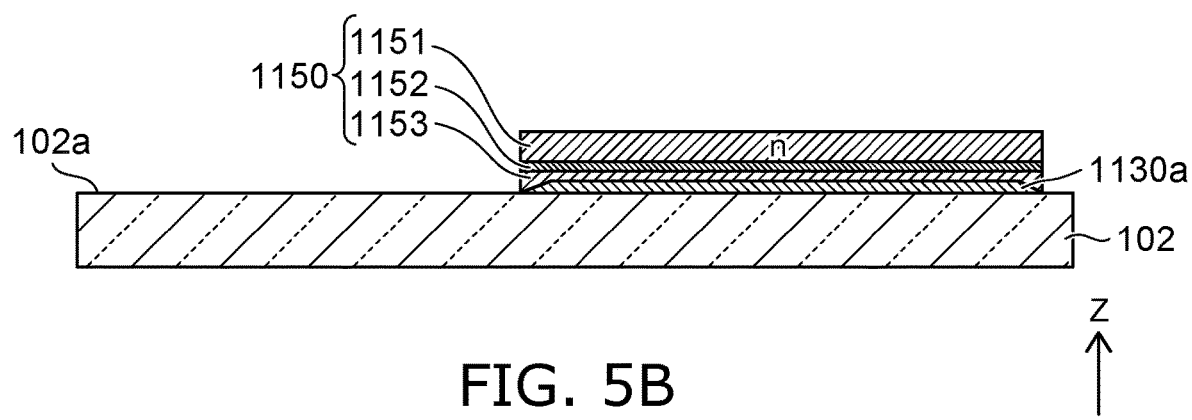
FIG. 5B is a schematic cross-sectional view illustrating the method for manufacturing the image display device of the first embodiment.

As shown in FIG. 5B, a semiconductor layer 1150 is formed over a monocrystallized conductive layer 1130a. The semiconductor layer 1150 includes a p-type semiconductor layer 1153, a light-emitting layer 1152, and an n-type semiconductor layer 1151 formed in this order from the conductive layer 1130a toward the positive direction of the Z-axis.

To form the semiconductor layer 1150, physical vapor deposition such as vapor deposition, ion beam deposition, molecular beam epitaxy (Molecular Beam Epitaxy, MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the single-crystal metal layer in low-temperature sputtering at a low temperature of about 400° C. to about 700° C. (see Non-Patent Literature 1 and 2, etc.). Such low-temperature sputtering is self-aligning when forming the semiconductor layer 1150 on a circuit board including TFTs, etc., formed by a LTPS process.

By using appropriate film formation technology, the semiconductor layer 1150 that is monocrystallized and includes the light-emitting layer 1152 is formed on the conductive layer 1130a monocrystallized over the entire surface by growing the GaN semiconductor layer 1150 on the conductive layer 1130a. Although not illustrated, there are also cases where amorphous deposits that include Ga, etc., i.e., materials of the growth species, are deposited at locations at which the conductive layer 1130a does not exist in the growth process of the semiconductor layer 1150.

According to the embodiment, the crystal formation of GaN is promoted by using the conductive layer 1130a of the single-crystal metal as a seed. When forming the semiconductor layer 1150 on the monocrystallized conductive layer 1130a, a conductive buffer layer may be provided on the conductive layer 1130a, and the semiconductor layer may be grown by performing the low-temperature sputtering described above or the like on the buffer layer. The buffer layer can be any type of material that promotes GaN crystal formation. Graphene sheets of other embodiments described below may be used.

Figure 5C:
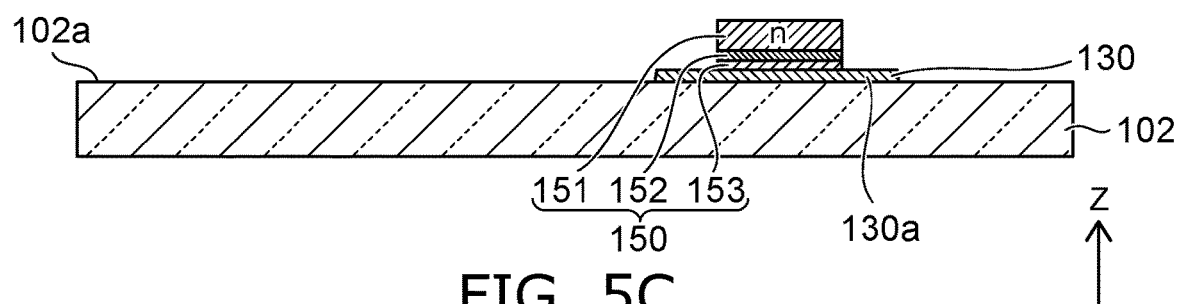
FIG. 5C is a schematic cross-sectional view illustrating the method for manufacturing the image display device of the first embodiment.

As shown in FIG. 5C, the light-emitting element 150 is formed by shaping the semiconductor layer 1150 shown in FIG. 5B into the desired shape by etching, etc. For example, a dry etching process is used to form the light-emitting element 150, and it is favorable to use anisotropic plasma etching (Reactive Ion Etching, RIE). When deposits are formed at locations at which the conductive layer 1130a does not exist, the formed deposits are removed in the etching process of forming the light-emitting element 150.

After forming the light-emitting element 150, the conductive layer 130 is formed by etching the conductive layer 1130a shown in FIG. 5B. The connection plate (the first part) 130a is formed in the formation process of the conductive layer 130. The connection plate 130a may be formed by etching the conductive layer 1130a together with the semiconductor layer 1150 and by subsequently forming the light-emitting element 150. Thus, the connection plate 130a is formed on the first surface 102a, and the light-emitting element 150 is formed on the connection plate 130a. When projected onto the XY plane, the outer perimeter of the connection plate 130a is set to contain the outer perimeter of the light-emitting element 150 when the light-emitting element 150 is projected. That is, the outer perimeter of the light-emitting element 150 is located within the outer perimeter of the connection plate 130a when projected onto the XY plane.

Figure 6A:
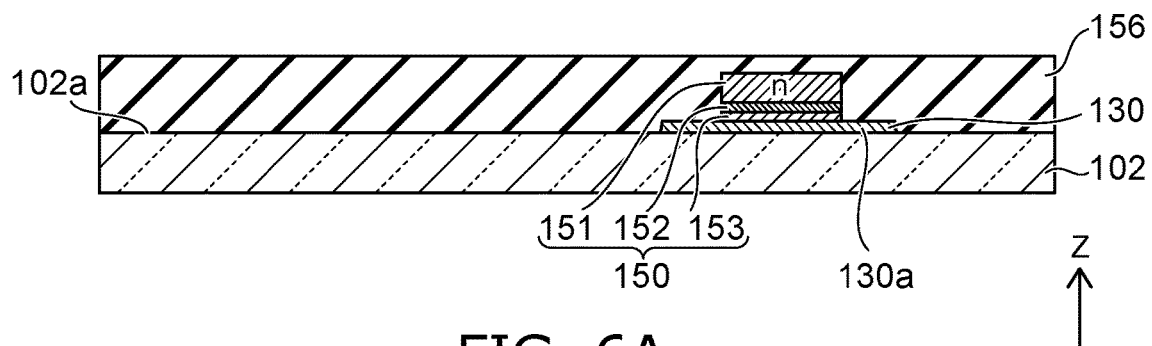
FIG. 6A is a schematic cross-sectional view illustrating the method for manufacturing the image display device of the first embodiment.

As shown in FIG. 6A, the first inter-layer insulating film (the first insulating film) 156 is formed to cover the first surface 102a, the conductive layer 130, and the light-emitting element 150.

Figure 6B:
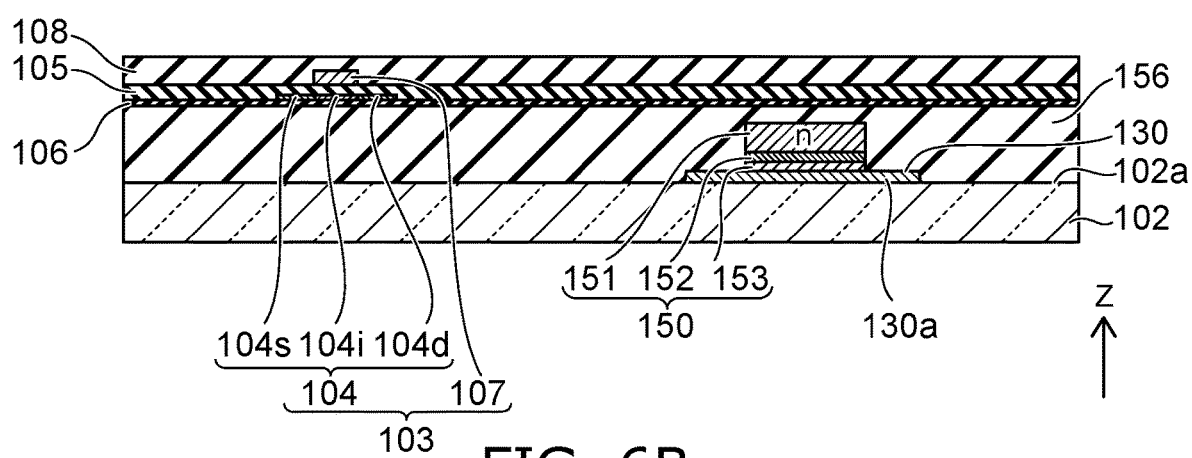
FIG. 6B is a schematic cross-sectional view illustrating the method for manufacturing the image display device of the first embodiment.

As shown in FIG. 6B, the TFT underlying film 106 is formed on the first inter-layer insulating film 156. For example, the TFT underlying film 106 is formed by CVD, etc.

The TFT channel (the circuit element) 104 is formed on the TFT underlying film 106. For example, the TFT channel 104 is formed as follows in a LTPS process. First, amorphous Si is formed as a film in the shape of the TFT channel 104. For example, CVD or the like is used to form the amorphous Si. The amorphous Si film that is formed is polycrystallized by laser annealing to form the TFT channel 104.

Subsequently, for example, the source electrode and drain electrode of the TFT channel 104 are formed as n-type semiconductor regions by using ion implantation technology or the like to introduce an impurity such as phosphorus (P) or the like to the regions 104s and 104d. The formation process of the source electrode and the drain electrode may be performed after the formation process of the gate 107.

The insulating layer 105 is formed over the TFT underlying film 106 and the TFT channel 104. For example, the insulating layer 105 is formed by CVD, etc. The gate 107 is formed at a position on the TFT channel 104 with the insulating layer 105 interposed. An appropriate formation method according to the material of the gate 107 is used to form the gate 107. For example, when the gate 107 is polycrystalline Si, the gate 107 is formed by performing laser annealing to polycrystallize amorphous Si similarly to the TFT channel 104. Or, the gate 107 may be formed by patterning by etching a refractory metal film of W, Mo, etc., formed by sputtering. Thus, the transistor (the circuit element) 103 is formed.

The second inter-layer insulating film 108 is provided to cover the insulating layer 105 and the gate 107. An appropriate formation method according to the material of the second inter-layer insulating film 108 is applied to form the second inter-layer insulating film 108. For example, technology such as ALD, CVD, or the like is used when the second inter-layer insulating film 108 is formed of $SiO_2$.

It is sufficient for the flatness of the second inter-layer insulating film 108 to be such that the wiring layer 110 can be formed, and a planarizing process may not always be performed. The number of processes can be reduced when a planarizing process is not performed on the second inter-layer insulating film 108. For example, when there is a location at the periphery of the light-emitting element 150 at which the thickness of the second inter-layer insulating film 108 is thin, a sufficient opening diameter of the via hole extending through the first and second inter-layer insulating films 156 and 108 can be ensured because the depth of the via hole is shallow. It is therefore easier to ensure the electrical connection by the via, and the reduction of the yield due to defects of the electrical characteristics can be suppressed.

Figure 7A:
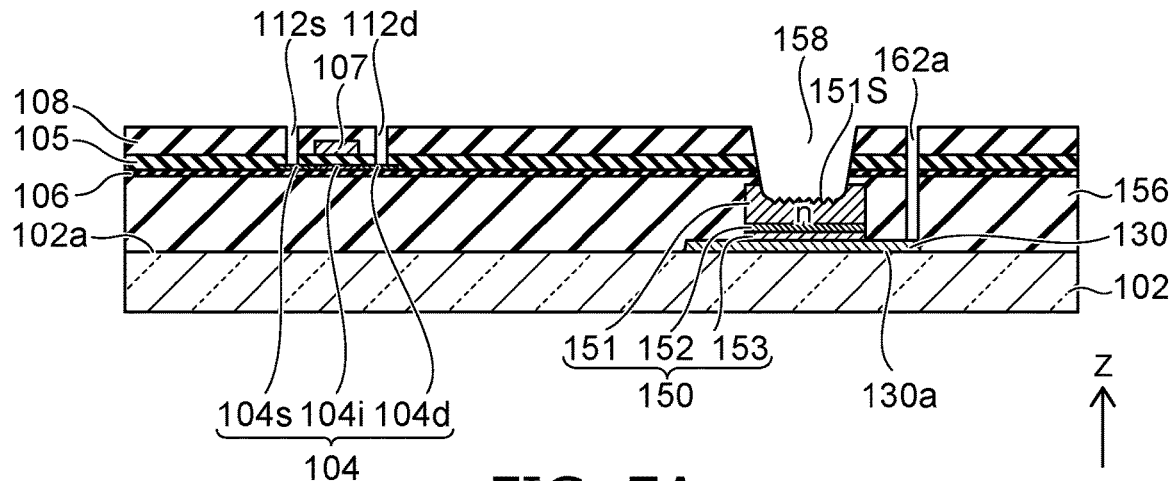
FIG. 7A is a schematic cross-sectional view illustrating the method for manufacturing the image display device of the first embodiment.

As shown in FIG. 7A, a via hole 162a extends through the second inter-layer insulating film 108, the insulating layer 105, the TFT underlying film 106, and the first inter-layer insulating film 156 and is formed to reach the connection plate 130a. The opening 158 is formed to reach the light-emitting surface 151S by removing a portion of the second inter-layer insulating film 108, a portion of the insulating layer 105, a portion of the TFT underlying film 106, and a portion of the first inter-layer insulating film 156. As in the example, the light-emitting surface 151S may be formed by etching, in the thickness direction of the n-type semiconductor layer 151, the central part of the surface of the n-type semiconductor layer 151 exposed by removing the first inter-layer insulating film 156, etc. It is favorable for the light-emitting surface 151S to be roughened as in the example.

A via hole 112d is formed to extend through the second inter-layer insulating film 108 and the insulating layer 105 and reach the region 104d. A via hole 112s is formed to extend through the second inter-layer insulating film 108 and the insulating layer 105 and reach the region 104s. For example, RIE or the like is used to form the via holes 162a, 112d, and 112s and the opening 158.

Figure 7B:
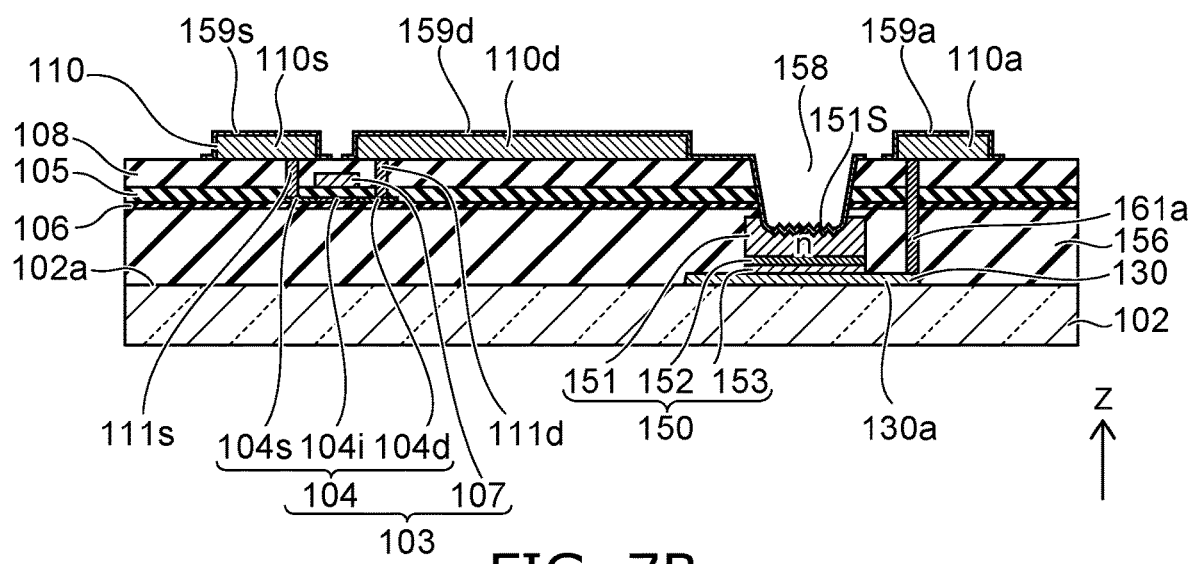
FIG. 7B is a schematic cross-sectional view illustrating the method for manufacturing the image display device of the first embodiment.

As shown in FIG. 7B, the via 161a is formed by filling a conductive material into the via hole 162a shown in FIG. 7A. The vias 111d and 111s also are formed by filling a conductive material respectively into the via holes 112d and 112s shown in FIG. 7A. Subsequently, the wiring layer 110 that includes the wiring parts 110a, 110d, and 110s is formed on the second inter-layer insulating film 108. The wiring parts 110a, 110d, and 110s are connected respectively to the vias 161a, 111d, and 111s. The wiring layer 110 may be formed simultaneously with the formation of the vias 161a, 111d, and 111s.

The light-transmitting electrodes 159a, 159d, and 159s are formed by forming a light-transmitting conductive film on the wiring layer 110 and on the second inter-layer insulating film 108.

Thereafter, the subpixel 20 of the image display device 1 of the embodiment is formed by providing the color filter (the wavelength conversion member) 180, etc.

Figure 8A:
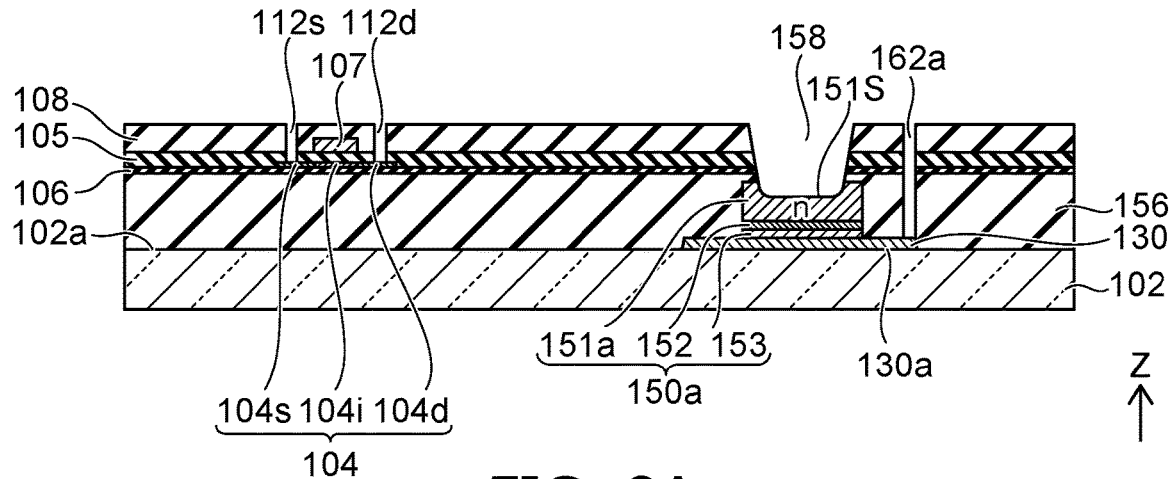
FIG. 8A is a schematic cross-sectional view illustrating a method for manufacturing the image display device according to the modification of the first embodiment.
Figure 8B:
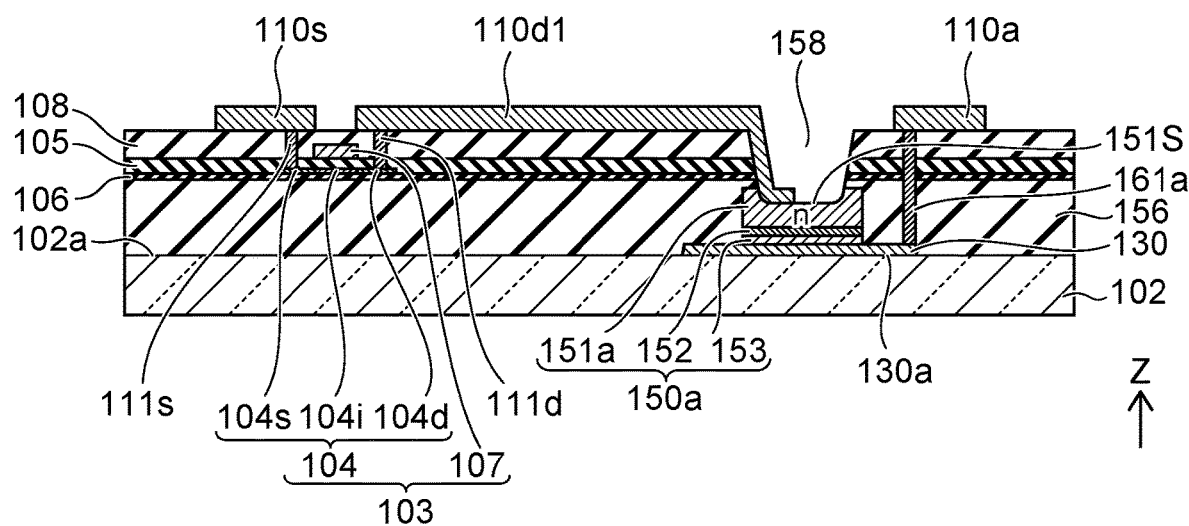
FIG. 8B is a schematic cross-sectional view illustrating the method for manufacturing the image display device according to the modification of the first embodiment.

FIGS. 8A and 8B are schematic cross-sectional views illustrating a method for manufacturing the image display device according to the modification of the embodiment.

FIGS. 8A and 8B show processes for forming the subpixel 20a shown in FIG. 2. In the example, the same processes as the processes up to the process shown in FIG. 6B above in which the TFT channel 104, the insulating layer 105, and the gate 107 are formed and the second inter-layer insulating film 108 covering the TFT channel 104, the insulating layer 105, and the gate 107 is formed. In the following description, the processes of FIGS. 8A and 8B are applied to the processes after the process shown in FIG. 6B.

The via holes 162a, 112d, and 112s are formed as shown in FIG. 8A. The opening 158 is formed to reach an n-type semiconductor layer 151*a*. In the example, the etching process for roughening can be omitted because the n-type semiconductor layer 151*a* is not roughened.

As shown in FIG. 8B, the vias 161*a*, 111*d*, and 111*s* are formed by filling a conductive material into the via holes 162*a*, 112*d*, and 112*s* shown in FIG. 8A. Subsequently, the wiring layer 110 is formed, and the wiring parts 110*a*, 110*d*1, and 110*s* are formed. Here, one end of the wiring part 110*d*1 is connected with the via 111*d*. The wiring part 110*d*1 is provided to extend to the light-emitting surface 151S from a position connected with the via 111*d*. Another end of the wiring part 110*d*1 is connected to the surface including the light-emitting surface 151S. That is, the surface including the light-emitting surface 151S is the n-type semiconductor layer 151*a*, and the wiring part 110*d*1 is directly connected to the n-type semiconductor layer 151*a*.

Thereafter, the subpixel 20*a* of the modification is formed by providing the color filter 180, etc.

For example, the circuit of FIG. 3 is a drive circuit driving the light-emitting element 150 by the select transistor 24, the drive transistor 26, and the capacitor 28. Such a drive circuit is formed in the subpixels 20 and 20*a*. A portion of the circuit other than the drive circuit is formed, for example, in the peripheral edge part of the display region 2 shown in FIG. 1 outside the subpixels 20 and 20*a*. For example, the row selection circuit 5 shown in FIG. 3 is formed simultaneously with the drive transistor, the select transistor, etc., and is formed in the peripheral edge part of the display region 2. That is, the row selection circuit 5 can be simultaneously embedded by the manufacturing processes described above.

It is desirable for the signal voltage output circuit 7 to be embedded in a semiconductor device manufactured by manufacturing processes capable of higher integration by fine patterning. The signal voltage output circuit 7 is mounted to another substrate together with a CPU and/or other circuit components, and is connected to the subpixels 20 and 20*a* via, for example, connectors and the like located in the peripheral edge part of the display region before embedding the color filter described below or after embedding the color filter.

Figure 9:
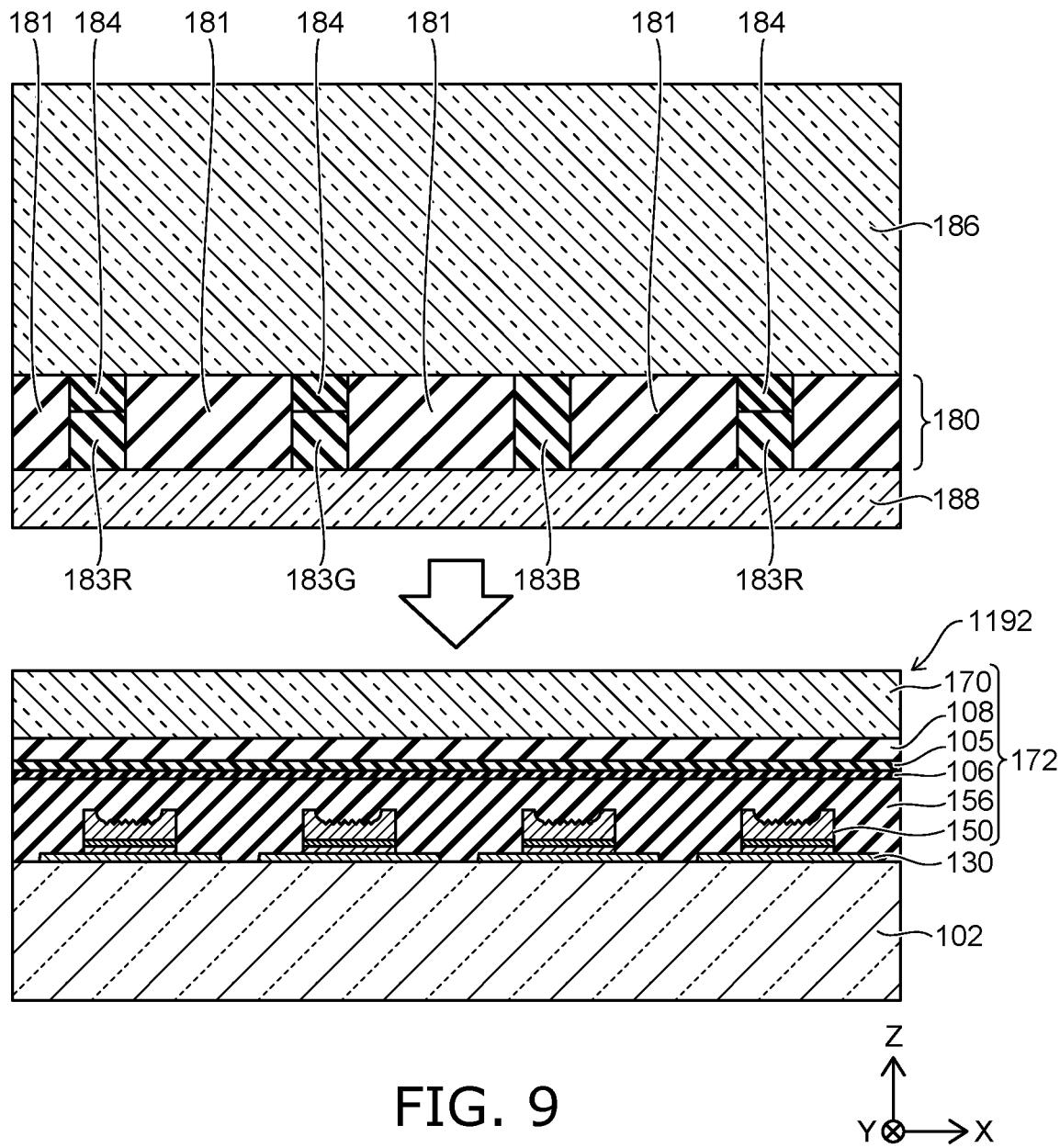
FIG. 9 is a schematic cross-sectional view illustrating the method for manufacturing the image display device of the first embodiment.

FIG. 9 is a schematic cross-sectional view illustrating the method for manufacturing the image display device of the embodiment.

In FIG. 9, the diagram above the arrow shows a configuration including the color filter 180, and the diagram below the arrow shows a structural component including the light-emitting element 150, etc., formed in the processes described above. The arrow of FIG. 9 indicates the process of bonding the color filter to the structural component including the light-emitting element 150, etc.

To avoid complexity in FIG. 9, the components other than the illustrated components on the substrate 102 are not illustrated. The components that are not illustrated are the TFT channel 104, the circuit 101 including the wiring layer 110, etc., and the via 161*a* shown in FIG. 1. In the description related to FIG. 9 and FIGS. 10A to 10D, the structural component that includes the light-emitting element 150, the first inter-layer insulating film 156, the TFT underlying film 106, the insulating layer 105, the second inter-layer insulating film 108, and the surface resin layer 170 is called a light-emitting circuit part 172. The structural component that includes the substrate 102, the conductive layer 130, the light-emitting circuit part 172, and the components that are not illustrated is called a structure body 1192. In FIG. 9, the TFT channel 104, the gate 107, the vias 111*s* and 111*d*, and the wiring layer 110 in the circuit 101 shown in FIG. 1 are not illustrated.

As shown in FIG. 9, the color filter (the wavelength conversion member) 180 is bonded to the structure body 1192 at one surface. The other surface of the color filter 180 is bonded to a glass substrate 186. The transparent thin film adhesive layer 188 is located at one surface of the color filter 180, and bonding to the exposed surface of the surface resin layer 170 of the structure body 1192 is performed via the transparent thin film adhesive layer 188.

In the color filter 180 of the example, color conversion parts are arranged in the positive direction of the X-axis in the order of red, green, and blue. For red, a red color conversion layer 183R is located in the first layer; for green, a green color conversion layer 183G is located in the first layer, and the filter layer 184 is located in the second layer for both red and green. For blue, a single-layer color conversion layer 183B may be provided, and the filter layer 184 may be provided. The light-shielding part 181 is located between the color conversion parts, and it goes without saying that the frequency characteristics of the filter layer 184 can be modified for each color of the color conversion parts.

The color filter 180 is adhered to the structure body 1192 so that the positions of the color conversion layers 183R, 183G, and 183B of each color match the positions of the light-emitting elements 150.

FIGS. 10A to 10D are schematic cross-sectional views showing a modification of the method for manufacturing the image display device of the embodiment.

FIGS. 10A to 10D show a method of using an inkjet method to form the color filter.

Figure 10A:
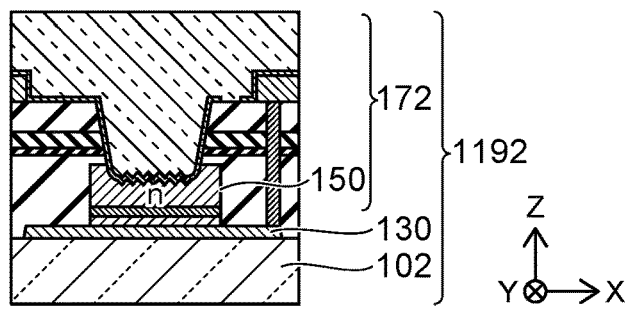
FIG. 10A is a schematic cross-sectional view illustrating a modification of the method for manufacturing the image display device of the first embodiment.

As shown in FIG. 10A, the structure body 1192 in which the components such as the light-emitting element 150, etc., are formed on the substrate 102 is prepared.

Figure 10B:
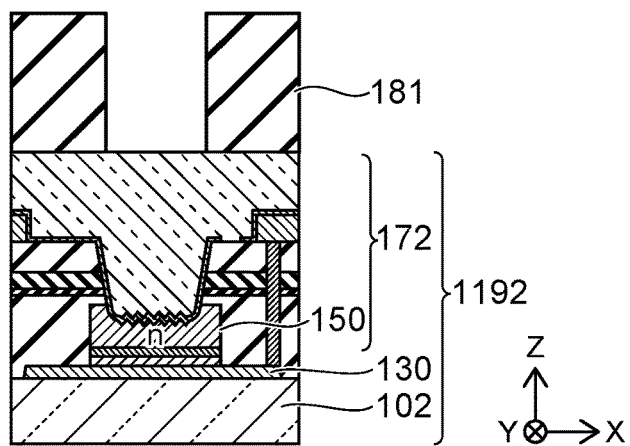
FIG. 10B is a schematic cross-sectional view illustrating the modification of the method for manufacturing the image display device of the first embodiment.

As shown in FIG. 10B, the light-shielding part 181 is formed on the structure body 1192. For example, the light-shielding part 181 is formed using screen printing, photolithography technology, etc.

Figure 10C:
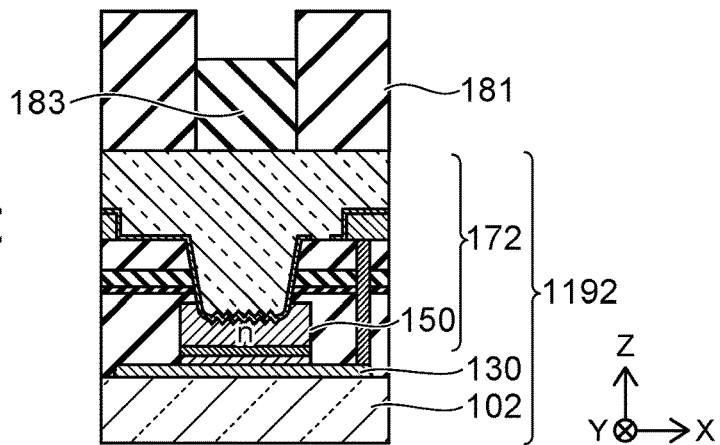
FIG. 10C is a schematic cross-sectional view illustrating the modification of the method for manufacturing the image display device of the first embodiment.

As shown in FIG. 10C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the color conversion layer 183 is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be about equal to the thickness of the light-shielding part 181.

Figure 10D:
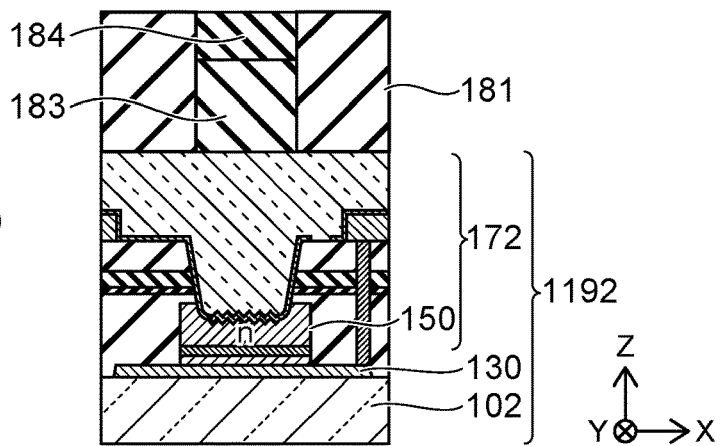
FIG. 10D is a schematic cross-sectional view illustrating the modification of the method for manufacturing the image display device of the first embodiment.

As shown in FIG. 10D, the coating for the filter layer 184 is dispensed from the inkjet nozzle. The coating is applied to overlap the coating of the fluorescer. The total thickness of the color conversion layer 183 and the filter layer 184 is set to be about equal to the thickness of the light-shielding part 181.

It is desirable to make the color conversion layer 183 as thick as possible to increase the color conversion efficiency for both a film-type color filter and an inkjet-type color filter. On the other hand, when the color conversion layer 183 is too thick, the light emitted by the color-converted light approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

Figure 11:
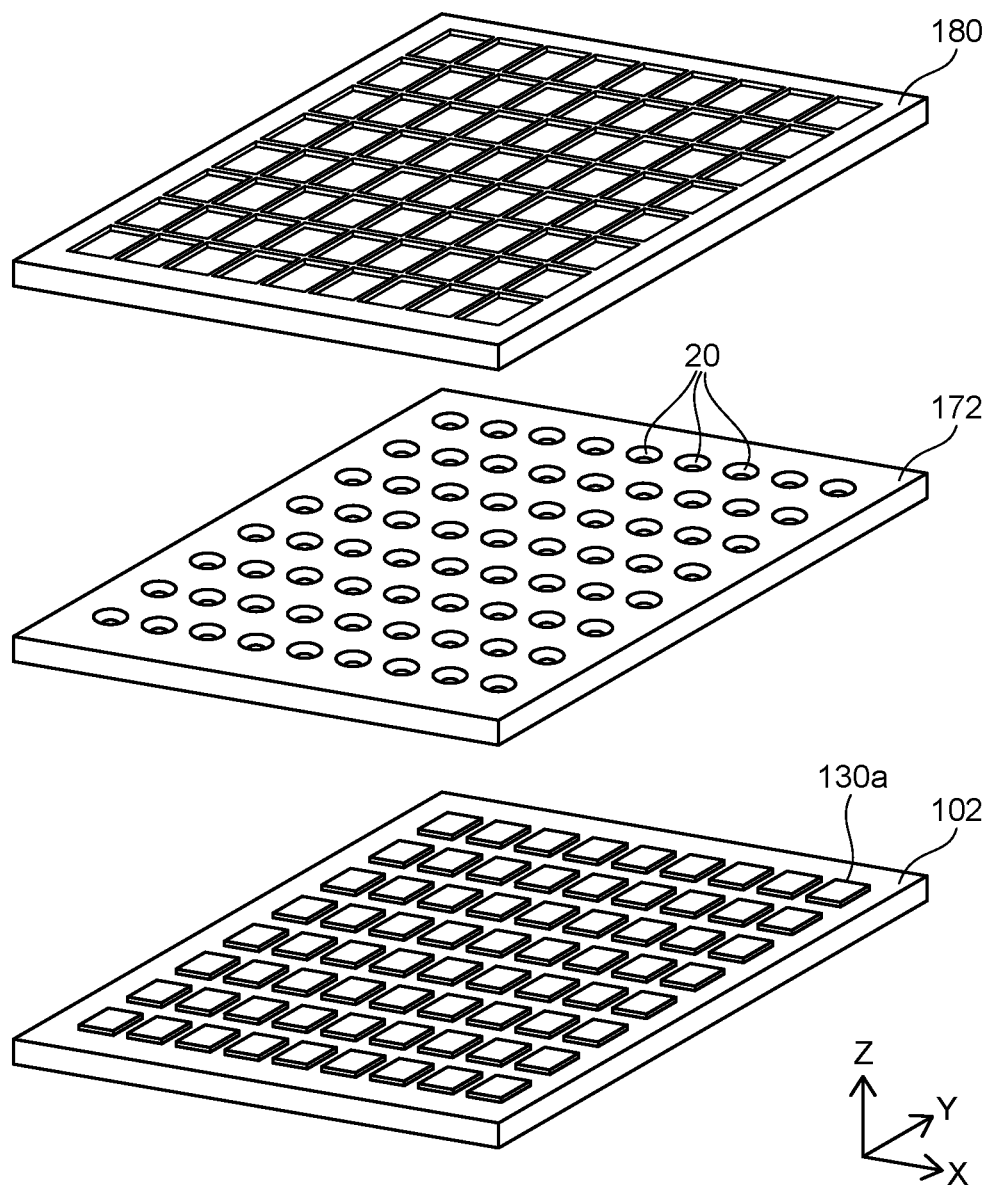
FIG. 11 is a schematic perspective view illustrating the image display device according to the first embodiment.

FIG. 11 is a schematic perspective view illustrating the image display device according to the embodiment.

In the image display device of the embodiment as shown in FIG. 11, the light-emitting circuit part 172 that includes many subpixels 20 is located on the substrate 102. The conductive layer 130 shown in FIG. 9 includes the connection plate 130*a*. The connection plates 130*a* are provided on the substrate 102 to correspond respectively to the subpixels 20. The color filter 180 is located on the light-emitting circuit part 172. The other embodiments and modifications described below also have configurations similar to the configuration shown in FIG. 11.

Effects of the image display device 1 of the embodiment will now be described.

According to the method for manufacturing the image display device 1 of the embodiment, the light-emitting element 150 is formed by etching the semiconductor layer 1150 formed by crystal growth on the substrate 102. Subsequently, the light-emitting element 150 is covered with the first inter-layer insulating film 156, and the circuit 101 that includes circuit elements such as the transistor 103 driving the light-emitting element 150, etc., is made on the first inter-layer insulating film 156. Therefore, the manufacturing processes are markedly reduced compared to when singulated light-emitting elements are individually transferred to the substrate 102.

According to the method for manufacturing the image display device 1 of the embodiment, the conductive layer 1130*a* can be formed by monocrystallizing the conductive layer 1130 formed on the substrate 102, and can be used as the seed for crystal growing the semiconductor layer 1150. For example, sufficiently high productivity can be realized because the monocrystallization of the conductive layer 1130 can be performed by laser annealing treatment.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable.

In contrast, according to the method for manufacturing the image display device 1 of the embodiment, the transfer process of the light-emitting elements 150 can be eliminated because the light-emitting elements 150 are formed after forming the entire semiconductor layer 1150 on the conductive layer 1130 formed on the substrate 102. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the conductive layer 1130*a* of the single-crystal metal, the light-emitting elements 150 can be self-aligningly positioned by appropriately patterning the conductive layer 1130*a*. This is favorable for a higher definition display because alignment of the light-emitting elements on the substrate 102 is unnecessary, and it is easy to downsize the light-emitting element 150.

The light-emitting elements 150 and the circuit elements formed in the layer on the light-emitting elements 150 are electrically connected by via formation after the light-emitting elements are directly formed on the substrate 102 by etching, etc.; therefore, a uniform connection structure can be realized, and the reduction of the yield can be suppressed.

According to the embodiment, for example, a glass substrate formed as described above can be covered with an inter-layer insulating film, and drive circuits, scanning circuits, and the like that include TFTs, etc., can be formed on the planarized surface by using a LTPS process, etc. Therefore, an advantage is provided in that existing flat panel display manufacturing processes and plants can be utilized.

According to the embodiment, the light-emitting element 150 that is formed in a lower layer than the transistor 103, etc., can be electrically connected to power supply lines, ground lines, drive transistors, etc., formed in the upper layer by forming vias extending through the first inter-layer insulating film 156, the TFT underlying film 106, the insulating layer 105, and the second inter-layer insulating film 108. Thus, a uniform connection structure can be easily realized using technically-established multilevel wiring technology, and the yield can be increased. Accordingly, the reduction of the yield due to connection defects of the light-emitting elements, etc., is suppressed.

According to the embodiment, the conductive layer 130 is formed on the first surface 102*a* of the substrate 102. The conductive layer 130 includes the connection plate 130*a*. The light-emitting element 150 is formed on the connection plate 130*a* and electrically connected to the connection plate 130*a* at the bottom surface 153B. The connection plate 130*a* is formed of a material having high conductivity such as a metal material, etc. Therefore, the p-type semiconductor layer 153 of the light-emitting element 150 can be electrically connected with another circuit with low resistance.

Also, the p-type semiconductor layer 153 of the lower layer is connected to the connection plate 130*a* having a high conductivity at the bottom surface 153B; it is therefore unnecessary to form a connection part in the lateral direction, and the thickness of the entire light-emitting element 150 can be reduced. Accordingly, the thickness of the first inter-layer insulating film 156 also can be reduced, and the via 161a can have a shallow depth and a small diameter. Therefore, the patterning accuracy of the via hole for forming the via 161a can be substantially increased.

The connection plate 130a can be formed of a light-reflective metal material such as Cu, Hf, etc. When projected onto the XY plane, the outer perimeter of the connection plate 130a is formed to contain the outer perimeter of the light-emitting element 150 when the light-emitting element 150 is projected. That is, the outer perimeter of the light-emitting element 150 is located within the outer perimeter of the connection plate 130a when projected onto the XY plane. Therefore, the connection plate 130a also can function as a light-reflecting plate, reflect the downward-scattered light of the light-emitting element 150, etc., toward the light-emitting surface 151S, and substantially improve the luminous efficiency of the light-emitting element 150.

Second Embodiment

Figure 12:
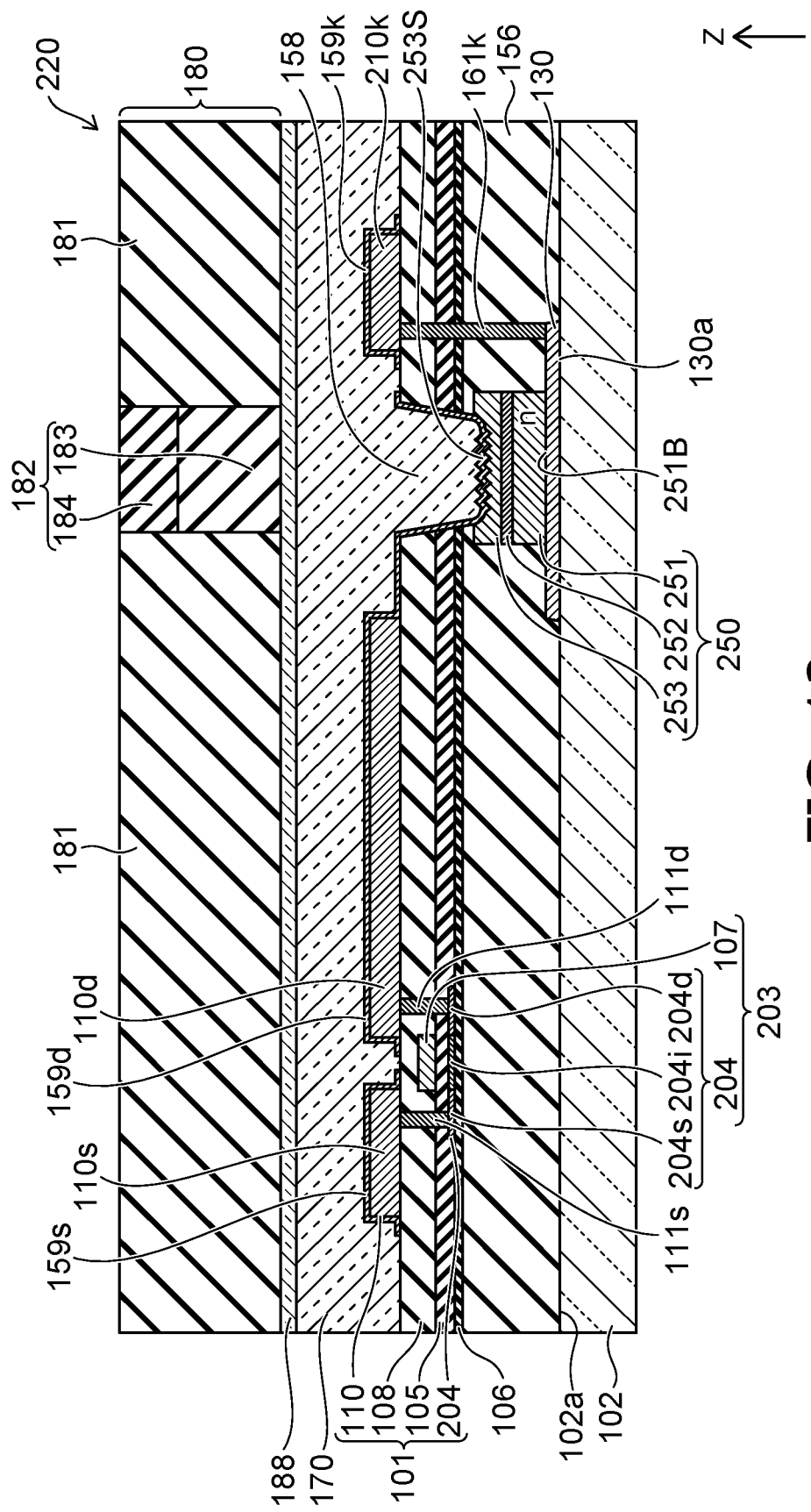
FIG. 12 is a schematic cross-sectional view illustrating a portion of an image display device according to a second embodiment.

FIG. 12 is a schematic cross-sectional view illustrating a portion of an image display device according to the embodiment.

The embodiment differs from the other embodiment described above in that a p-type semiconductor layer 253 provides a light-emitting surface 253S, and the configuration of a transistor 203 is different. The same components as the other embodiment are marked with the same reference numerals, and a detailed description is omitted as appropriate.

As shown in FIG. 12, a subpixel 220 of the image display device of the embodiment includes the substrate 102, the conductive layer 130, a light-emitting element 250, the first inter-layer insulating film 156, the transistor 203, the second inter-layer insulating film 108, and the wiring layer 110.

The light-emitting element 250 is located on the connection plate 130a. When projected onto the XY plane, the outer perimeter of the connection plate 130a is set to contain the outer perimeter of the light-emitting element 250 when the light-emitting element 250 is projected. That is, the outer perimeter of the light-emitting element 250 is located within the outer perimeter of the connection plate 130a when projected onto the XY plane. Therefore, similarly to the other embodiment described above, the downward-scattered light of the light-emitting element 250, etc., can be reflected toward the light-emitting surface 253S side, and the luminous efficiency of the light-emitting element 250 is substantially improved.

The light-emitting element 250 includes the light-emitting surface 253S. Similarly to the other embodiment described above, the light-emitting element 250 is a prismatic or cylindrical element that has a bottom surface 251B on the connection plate 130a. The light-emitting surface 253S is the surface of the light-emitting element 250 at the side opposite to the bottom surface 251B. The bottom surface 251B is connected to the connection plate 130a.

The light-emitting element 250 includes an n-type semiconductor layer 251, a light-emitting layer 252, and the p-type semiconductor layer 253. The n-type semiconductor layer 251, the light-emitting layer 252, and the p-type semiconductor layer 253 are stacked in this order from the bottom surface 251B toward the light-emitting surface 253S. According to the embodiment, the light-emitting surface 253S is provided by the p-type semiconductor layer 253.

The light-emitting element 250 has a shape similar to that of the light-emitting element 150 shown in FIG. 1 when projected onto the XY plane. An appropriate shape is selected according to the layout of the circuit elements, etc.

The light-emitting element 250 is a light-emitting diode similar to the light-emitting element 150 of the other embodiment described above. Namely, the wavelength of the light emitted by the light-emitting element 250 is, for example, a blue light emission of about 467 nm±30 nm or a bluish-violet light emission of about 410 nm±30 nm. The wavelength of the light emitted by the light-emitting element 250 is not limited to the values described above and can be an appropriate value.

The transistor 203 is located on the TFT underlying film 106. The transistor 203 is a p-channel TFT. The transistor 203 includes the TFT channel 204 and the gate 107. Favorably, similarly to the other embodiment described above, the transistor 203 is formed by a LTPS process, etc. According to the embodiment, the circuit 101 includes the TFT channel 204, the insulating layer 105, the second inter-layer insulating film 108, the vias 111s and 111d, and the wiring layer 110.

The TFT channel 204 includes regions 204s, 204i, and 204d. The regions 204s, 204i, and 204d are located on the TFT underlying film 106. The regions 204s and 204d are doped with an impurity such as boron (B) or the like by ion implantation, etc., to form p-type semiconductor regions. The region 204s has an ohmic connection with the via 111s. The region 204d has an ohmic connection with the via 111d.

The gate 107 is located on the TFT channel 204 with the insulating layer 105 interposed. The insulating layer 105 insulates the TFT channel 204 and the gate 107.

In the transistor 203, a channel is formed in the region 204i when a lower voltage than that of the region 204s is applied to the gate 107. The current that flows between the regions 204s and 204d is controlled by the voltage of the gate 107 with respect to the region 204s. The TFT channel 204 and the gate 107 are formed using materials and formation methods similar to those of the other embodiment described above.

The wiring layer 110 includes the wiring parts 110s, 110d, and 210k. The wiring parts 110s and 110d are the same as those of the first embodiment. A portion of the wiring part 210k is located above the connection plate 130a. For example, another portion of the wiring part 210k extends to the ground line 4 shown in FIG. 13 below and is connected to the ground line 4.

The vias 111s and 111d are provided to extend through the second inter-layer insulating film 108. The via 111s is located between the wiring part 110s and the region 204s. The via 111s electrically connects the wiring part 110s and the region 204s. The via 111d is located between the wiring part 110d and the region 204d. The via 111d electrically connects the wiring part 110d and the region 204d. The vias 111s and 111d are formed using materials and formation methods similar to those of the other embodiment described above.

A via 161k is provided to extend through the second inter-layer insulating film 108, the insulating layer 105, the TFT underlying film 106, and the first inter-layer insulating film 156. The via 161k is located between the wiring part 210k and the connection plate 130a and electrically connects the wiring part 210k and the connection plate 130a.

For example, the wiring part 110s is electrically connected to the power supply line 3 shown in FIG. 13 below.

The wiring part 110*d* is electrically connected to the p-type semiconductor layer 253 via the light-transmitting electrode 159*d*.

According to the embodiment, the light-transmitting electrode 159*d* is provided over the roughened light-emitting surface 253S of the p-type semiconductor layer 253. The light-transmitting electrode 159*d* is provided over the wiring part 110*d*. The light-transmitting electrode 159*d* also is located between the light-emitting surface 253S and the wiring part 110*d* and electrically connects the p-type semiconductor layer 253 and the wiring part 110*d*. According to the modification of the first embodiment described above, as in the example shown in FIG. 2, the wiring part 110*d*1 may be extended to be directly connected to the p-type semiconductor layer 253.

Figure 13:
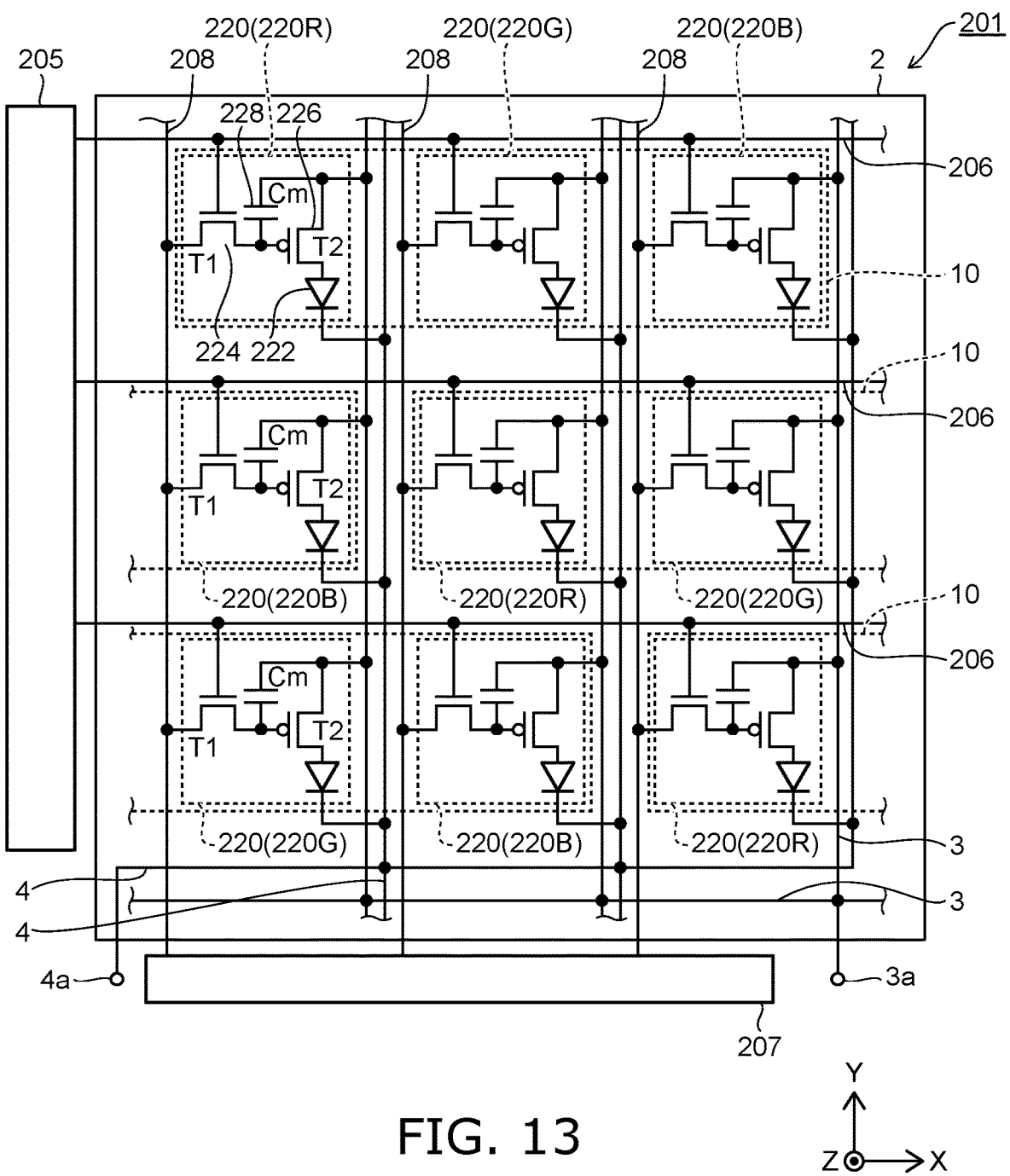
FIG. 13 is a schematic block diagram illustrating the image display device of the second embodiment.

FIG. 13 is a schematic block diagram illustrating an image display device according to the embodiment.

As shown in FIG. 13, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, the pixel 10 includes multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes the three subpixels 220R, 220G, and 220B; for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 13, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a lower potential side than the light-emitting element 222. The drive transistor 226 is a p-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is a p-channel transistor, the row selection circuit 205 and the signal voltage output circuit 207 supply a signal voltage that has a different polarity from that of the other embodiment described above to the signal line 208.

According to the embodiment, because the polarity of the drive transistor 226 is a p-channel, the polarities of the signal voltage and the like are different from those of the other embodiment described above. Namely, the row selection circuit 205 supplies a select signal to a scanning line 206 to sequentially select one row from the arrangement of the m rows of the subpixels 220. The signal voltage output circuit 207 supplies a signal voltage having an analog voltage value necessary for each subpixel 220 of the selected row. The drive transistors 226 of the subpixels 220 of the selected row allow currents corresponding to the signal voltages to flow in the light-emitting elements 222. The light-emitting elements 222 emit light of luminances corresponding to the currents flowing in the light-emitting elements 222.

A method for manufacturing the image display device of the embodiment will now be described.

FIGS. 14A to 16B are schematic cross-sectional views illustrating the method for manufacturing the image display device of the embodiment.

In the example, the substrate 102 in which the conductive layer 1130 described with reference to FIG. 5A of the other embodiment described above is formed on the first surface 102*a* can be used. In the following description, the process of FIG. 14A and subsequent processes are applied to the process of FIG. 5A and subsequent processes.

Figure 14A:
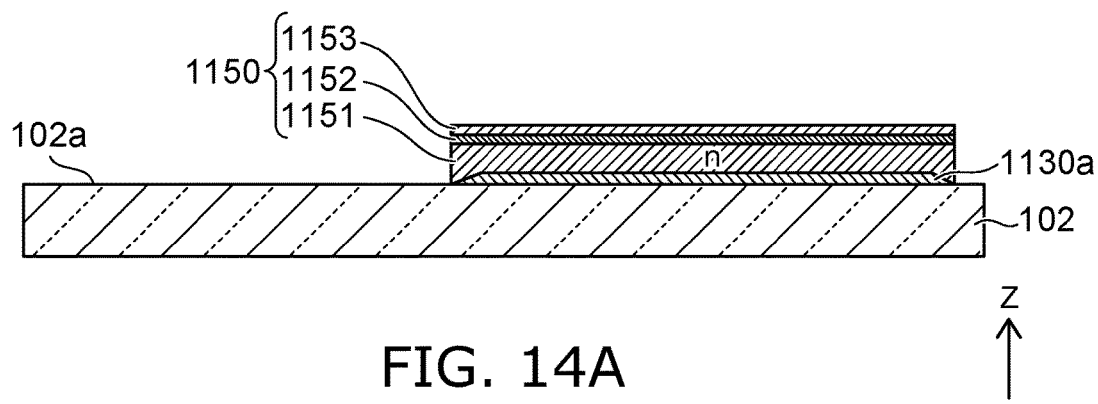
FIG. 14A is a schematic cross-sectional view illustrating a method for manufacturing the image display device of the second embodiment.

According to the method for manufacturing the image display device of the embodiment as shown in FIG. 14A, the monocrystallized conductive layer 1130*a* is formed on the first surface 102*a* by performing monocrystallization treatment of the conductive layer 1130 shown in FIG. 5A. The semiconductor layer 1150 is formed on the conductive layer 1130*a*. According to the embodiment, the semiconductor layer 1150 is formed in the order of the n-type semiconductor layer 1151, the light-emitting layer 1152, and the p-type semiconductor layer 1153 from the conductive layer 1130*a* toward the positive direction of the Z-axis. The semiconductor layer 1150 is formed using film formation technology similar to that of the other embodiment described above. In other words, to form the semiconductor layer 1150, physical vapor deposition such as vapor deposition, ion beam deposition, MBE, or the like is used, and it is favorable to use low-temperature sputtering.

In the initial growth of the semiconductor layer 1150, crystal defects caused by a mismatch of the crystal lattice easily occur, and crystals having GaN as a major component generally have n-type semiconductor characteristics. Therefore, according to the embodiment, the yield can be increased by growing the semiconductor layer 1150 from the n-type semiconductor layer 1151 on the conductive layer 1130*a*. Similarly to the other embodiment described above, there are cases where deposits including materials of the growth species are deposited at locations at which the conductive layer 1130*a* does not exist.

Figure 14B:
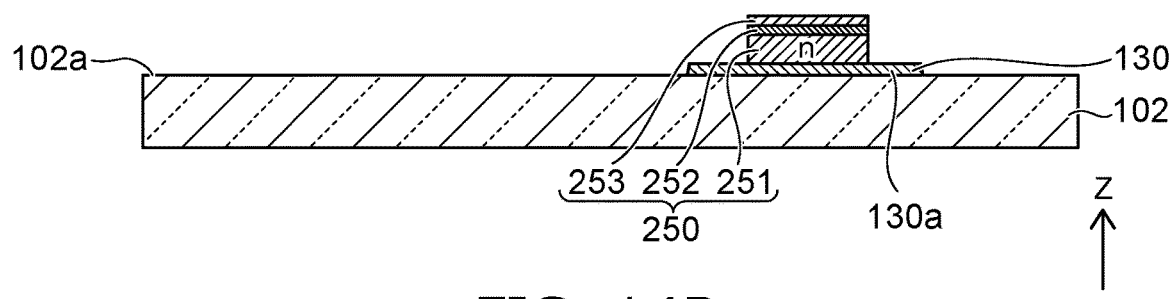
FIG. 14B is a schematic cross-sectional view illustrating the method for manufacturing the image display device of the second embodiment.

As shown in FIG. 14B, the light-emitting element 250 is formed by shaping the semiconductor layer 1150 shown in FIG. 14A into the desired shape. For example, a dry etching process is used to form the light-emitting element 250, and it is favorable to use RIE.

The conductive layer 1130*a* shown in FIG. 14A is shaped into the conductive layer 130 including the connection plate 130*a* by etching. Thus, the connection plate 130*a* is formed under the light-emitting element 250.

Figure 15A:
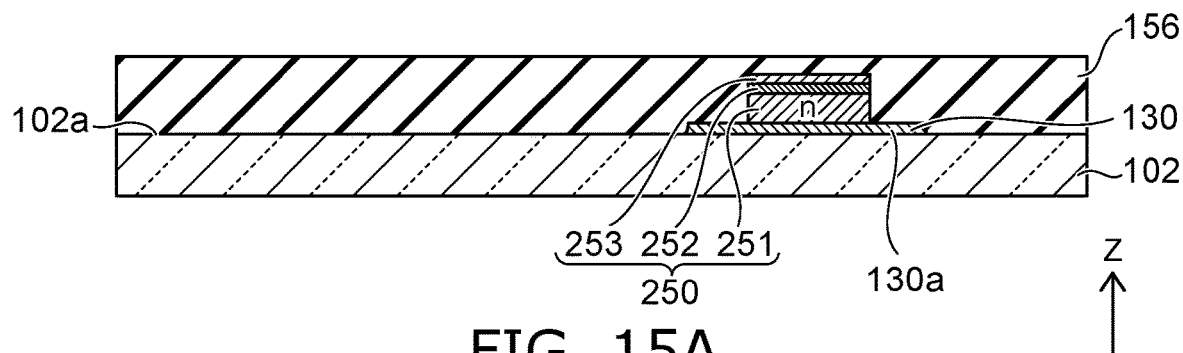
FIG. 15A is a schematic cross-sectional view illustrating the method for manufacturing the image display device of the second embodiment.

As shown in FIG. 15A, the first inter-layer insulating film 156 is formed to cover the first surface 102*a*, the conductive layer 130, and the light-emitting element 250.

Figure 15B:
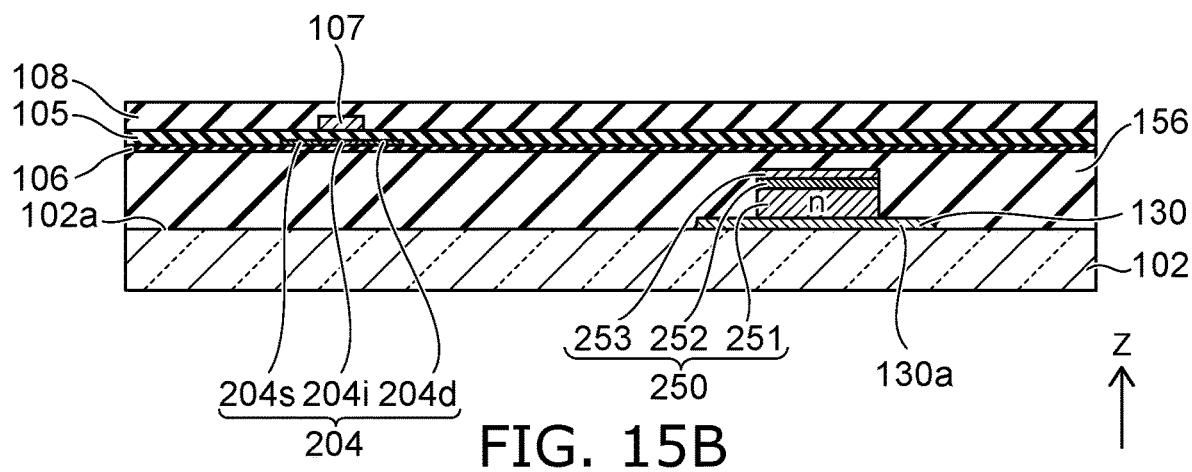
FIG. 15B is a schematic cross-sectional view illustrating the method for manufacturing the image display device of the second embodiment.

As shown in FIG. 15B, the TFT underlying film 106 is formed over the exposed surface of the first inter-layer insulating film 156. CVD or the like is used to form the TFT underlying film 106. The TFT channel 204 is formed at the prescribed position on the TFT underlying film 106 and is activated, etc. Also, the insulating layer 105 is formed over the TFT underlying film 106 and over the TFT channel 204.

The gate 107 is formed on the TFT channel 204 with the insulating layer 105 interposed. Similarly to the other embodiment described above, it is favorable to use a LTPS process as these formation processes.

The second inter-layer insulating film 108 is formed over the insulating layer 105 and over the gate 107.

Figure 16A:
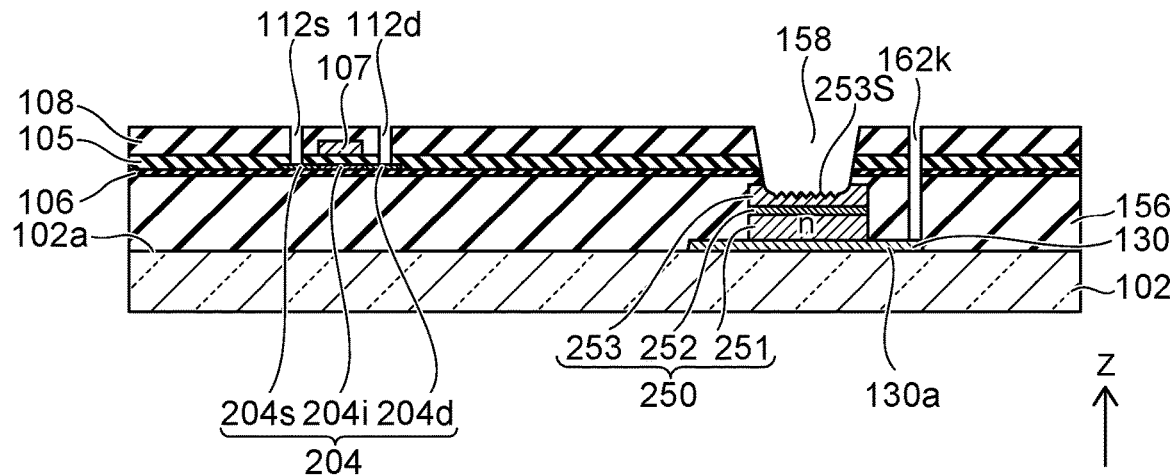
FIG. 16A is a schematic cross-sectional view illustrating the method for manufacturing the image display device of the second embodiment.

As shown in FIG. 16A, a via hole 162k is formed to extend through the second inter-layer insulating film 108, the insulating layer 105, the TFT underlying film 106, and the first inter-layer insulating film 156 and reach the connection plate 130a. The opening 158 is formed to reach the light-emitting surface 253S by removing a portion of the second inter-layer insulating film 108, a portion of the insulating layer 105, a portion of the TFT underlying film 106, and a portion of the first inter-layer insulating film 156. As in the example, similarly to the other embodiment described above, the light-emitting surface 253S may be formed by etching, in the thickness direction of the p-type semiconductor layer 253, the central part of the surface of the p-type semiconductor layer 253 exposed by removing the first inter-layer insulating film 156, etc., and it is favorable for the light-emitting surface 253S to be roughened.

The via holes 112d and 112s are formed similarly to those of the other embodiment described above.

Figure 16B:
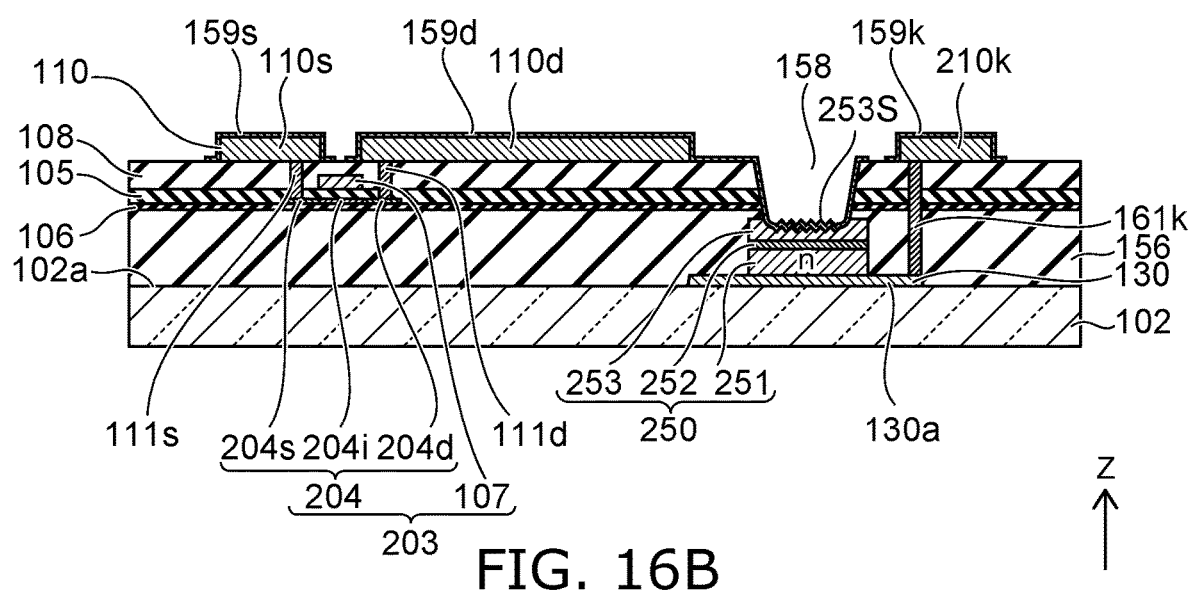
FIG. 16B is a schematic cross-sectional view illustrating the method for manufacturing the image display device of the second embodiment.

As shown in FIG. 16B, the vias 161k, 111d, and 111s are formed by filling a conductive material into the via holes 162k, 112d, and 112s shown in FIG. 16A. Subsequently, similarly to the other embodiment described above, the wiring layer 110 that includes the wiring parts 210k, 110d, and 110s is formed, and the wiring parts 210k, 110d, and 110s are connected respectively to the vias 161k, 111d, and 111s.

Transmissive conductive films that include light-transmitting electrodes 159k, 159d, and 159s are formed respectively over the wiring parts 210k, 110d, and 110s. For example, the wiring part 210k and the light-transmitting electrode 159k are electrically connected to the ground line 4 of the circuit shown in FIG. 13.

Thereafter, the subpixel 220 of the image display device 201 of the embodiment is formed by providing the color filter 180, etc.

Effects of the image display device of the embodiment will now be described.

In the image display device of the embodiment, similarly to the other embodiment described above, in addition to the effects of reducing the time of the transfer process for forming the light-emitting element 250 and reducing the number of processes, the light-emitting surface 253S can be of the p-type semiconductor layer 253 by setting the polarity of the TFT to be a p-channel. Therefore, advantages are provided in that the degree of freedom of the circuit element arrangement and circuit design is increased, etc.

According to the method for manufacturing the image display device of the embodiment, the semiconductor layer is grown from the n-type semiconductor layer; therefore, the yield when forming can be increased.

Third Embodiment

Figure 17:
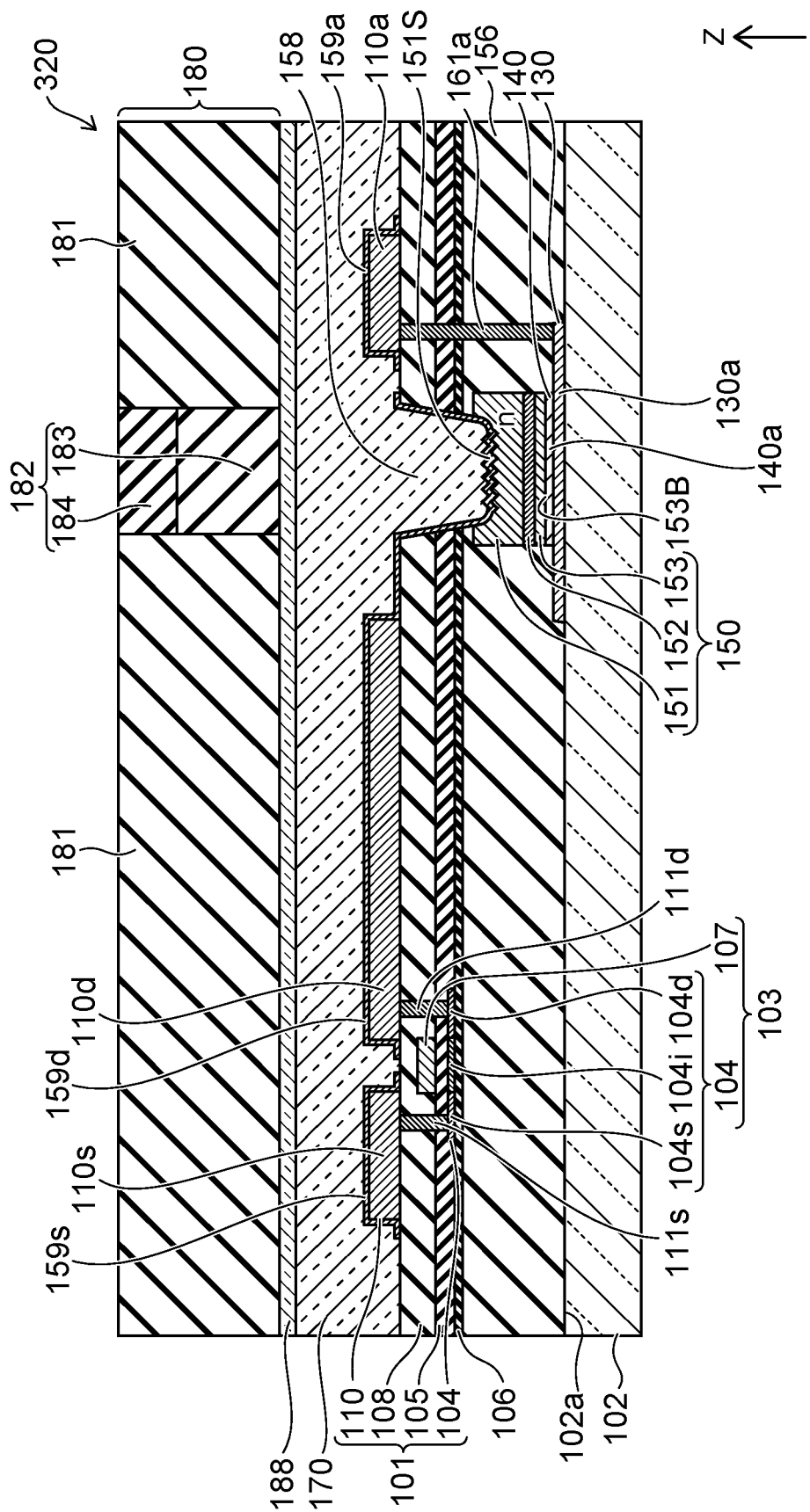
FIG. 17 is a schematic cross-sectional view illustrating a portion of an image display device according to a third embodiment.

FIG. 17 is a schematic cross-sectional view illustrating a portion of an image display device according to the embodiment.

The embodiment differs from the other embodiments described above in that a graphene layer 140 is located on the conductive layer 130, and a graphene sheet 140a is located between the connection plate 130a and the light-emitting element 150. The same components as those of the other embodiments described above are marked with the same reference numerals, and a detailed description is omitted as appropriate.

As shown in FIG. 17, a subpixel 320 of the image display device of the embodiment includes the graphene layer 140. The graphene layer 140 is located on the conductive layer 130. The graphene layer 140 includes the graphene sheet 140a. The graphene sheet (a graphene-including layer) 140a is located between the connection plate 130a and the light-emitting element 150. The graphene sheet 140a is conductive, and therefore electrically connects the light-emitting element 150 and the connection plate 130a. The graphene layer 140 and the graphene sheet 140a are layered bodies in which several layers to about 10 layers of single-layer graphene are stacked.

The outer perimeter of the graphene sheet 140a substantially corresponds to the outer perimeter of the light-emitting element 150 when projected onto the XY plane.

According to the embodiment, the light-emitting element 150 is configured similarly to that of the first embodiment. Namely, the p-type semiconductor layer 153, the light-emitting layer 152, and the n-type semiconductor layer 151 are stacked in this order from the bottom surface 153B toward the light-emitting surface 151S.

The bottom surface 153B is of the p-type semiconductor layer 153, and the p-type semiconductor layer 153 is electrically connected to the connection plate 130a via the graphene sheet 140a. Although the light-emitting surface 151S is roughened in the example, the roughening also can be omitted.

The configurations of the first inter-layer insulating film 156, the transistor 103, etc., are similar to those of the first embodiment, and a detailed description is omitted.

A method for manufacturing the image display device of the embodiment will now be described.

FIGS. 18A to 20B are schematic cross-sectional views illustrating the method for manufacturing the image display device of the embodiment.

Figure 18A:
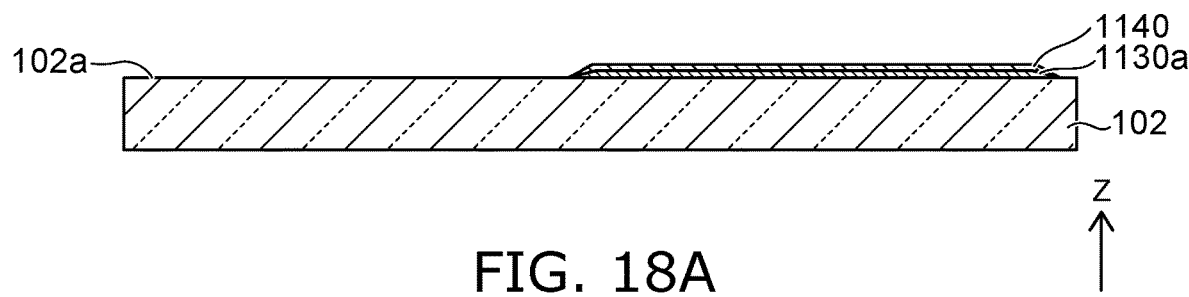
FIG. 18A is a schematic cross-sectional view illustrating a method for manufacturing the image display device of the third embodiment.

As shown in FIG. 18A, a graphene layer (a graphene-including layer) 1140 is patterned to be formed over the conductive layer 1130a monocrystallized by annealing treatment. For example, the graphene layer 1140 is formed by a low-temperature process technique such as pulse sputtering, etc.

Figure 18B:
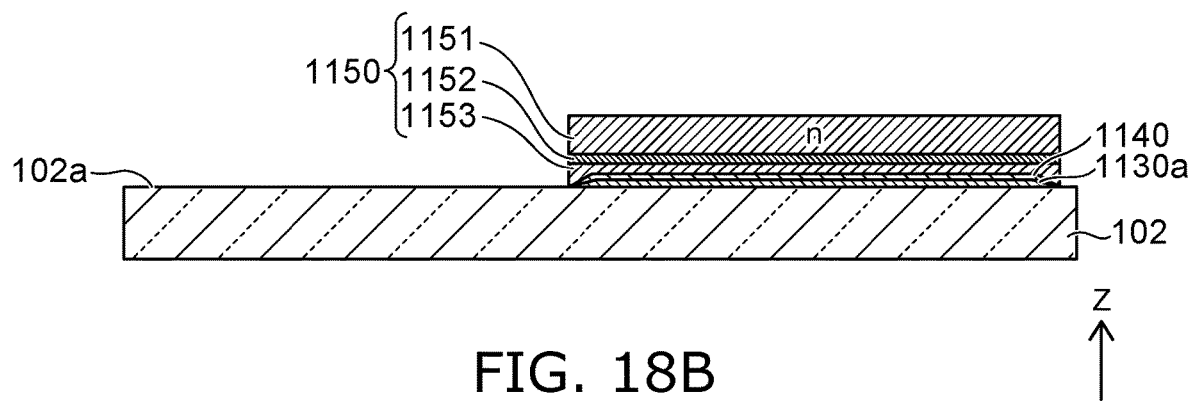
FIG. 18B is a schematic cross-sectional view illustrating the method for manufacturing the image display device of the third embodiment.

As shown in FIG. 18B, the semiconductor layer 1150 is formed over the graphene layer 1140. According to the embodiment, the semiconductor layer 1150 is formed in the order of the p-type semiconductor layer 1153, the light-emitting layer 1152, and the n-type semiconductor layer 1151 from the conductive layer 1130a and graphene layer 1140 side toward the positive direction of the Z-axis.

To form the semiconductor layer 1150, similarly to the other embodiments, physical vapor deposition such as vapor deposition, ion beam deposition, MBE, sputtering, or the like is used, and it is favorable to use low-temperature sputtering. By growing the GaN semiconductor layer 1150 on the graphene layer 1140, the monocrystallized semiconductor layer 1150 including the light-emitting layer 1152 is formed over the graphene layer 1140 (see Non-Patent Literature 1 and 2, etc.).

It is known that crystal growth of GaN on a layer of graphene is promoted when using pulse sputtering to crystal growth GaN. According to the embodiment, the semiconductor layer 1150 is formed so that the graphene layer 1140 grown over the conductive layer 1130a which is a single-crystal metal layer is interposed; therefore, the semiconductor layer 1150 that includes a high-quality GaN crystal can be more stably formed.

Also, according to the embodiment, the conductive layer 130 and the connection plate 130a shown in FIG. 17 are formed of single-crystal metal layers, and therefore can be electrically connected with the semiconductor layer 1150 at low resistance.

Figure 18C:
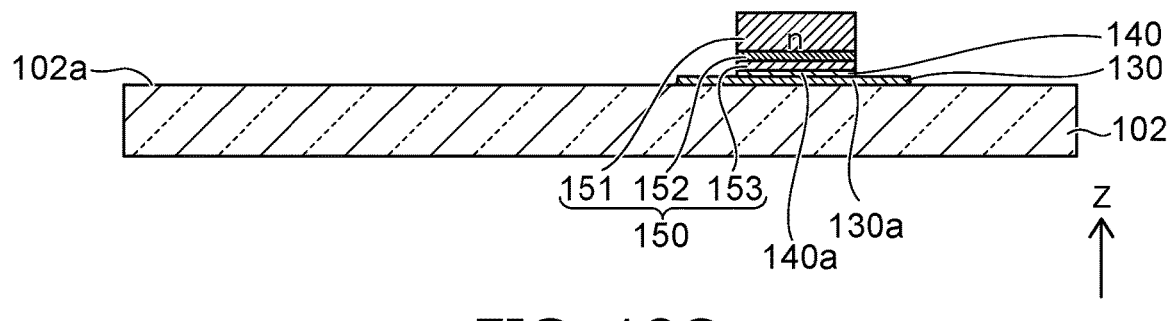
FIG. 18C is a schematic cross-sectional view illustrating the method for manufacturing the image display device of the third embodiment.

As shown in FIG. 18C, the light-emitting element 150 is formed by shaping the semiconductor layer 1150 into the necessary shape by RIE, etc. At this time, the graphene layer 1140 shown in FIG. 18B is over-etched and shaped into the graphene sheet (the graphene-including layer) 140a having an outer perimeter shape corresponding to the outer perimeter shape of the light-emitting element 150. Subsequently, the connection plate 130a is formed in the desired shape by shaping the conductive layer 1130a shown in FIG. 18B into the conductive layer 130 by etching.

Figure 19A:
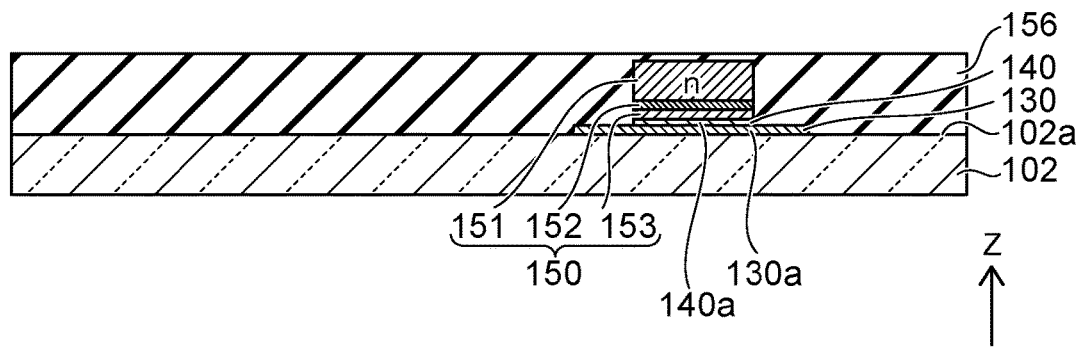
FIG. 19A is a schematic cross-sectional view illustrating the method for manufacturing the image display device of the third embodiment.

As shown in FIG. 19A, the first inter-layer insulating film 156 is formed to cover the first surface 102a, the conductive layer 130, the graphene sheet 140a, and the light-emitting element 150.

Figure 19B:
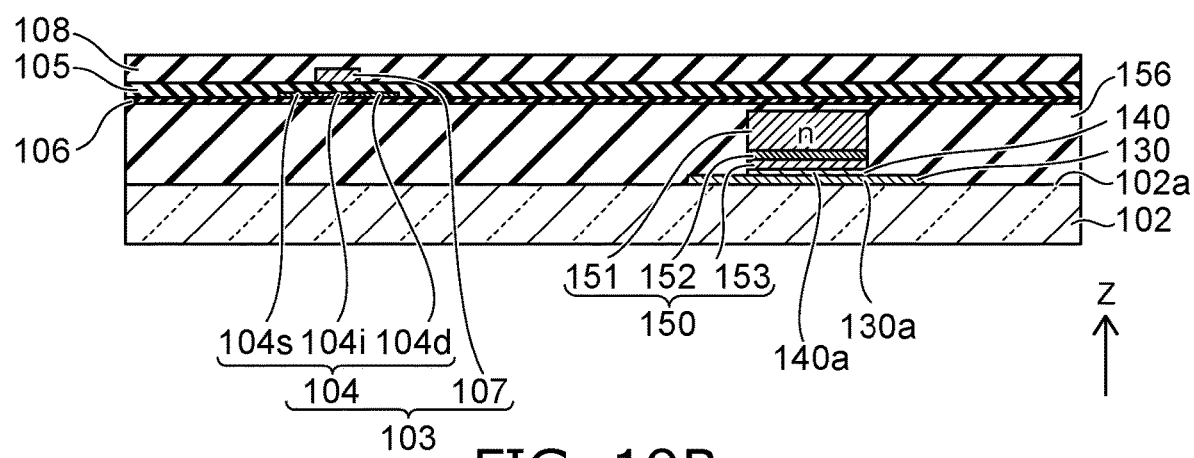
FIG. 19B is a schematic cross-sectional view illustrating the method for manufacturing the image display device of the third embodiment.

As shown in FIG. 19B, the TFT underlying film 106 is formed on the exposed surface of the first inter-layer insulating film 156; thereafter, similarly to the other embodiments described above, the transistor 103 is formed by a LTPS process, etc., and the second inter-layer insulating film 108 is formed.

Figure 20A:
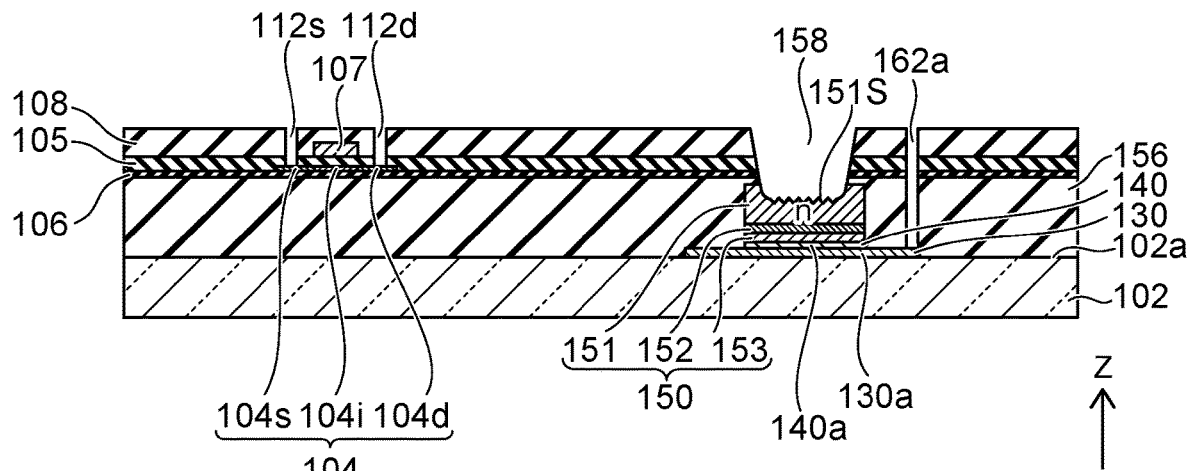
FIG. 20A is a schematic cross-sectional view illustrating the method for manufacturing the image display device of the third embodiment.

As shown in FIG. 20A, the via holes 162a, 112d, and 112s are formed, and the light-emitting surface 151S is exposed via the opening 158.

Figure 20B:
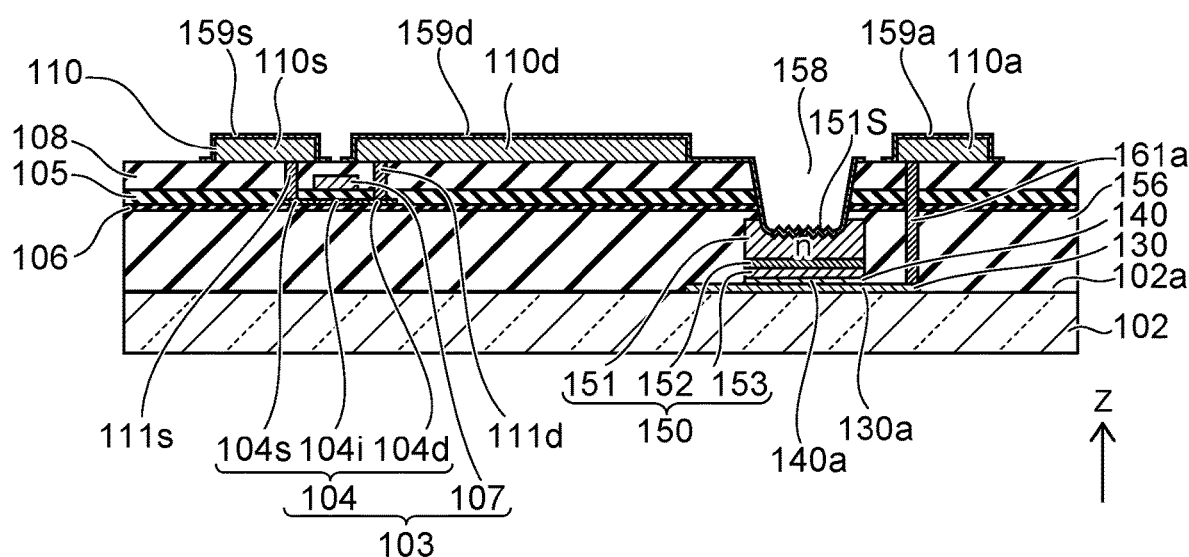
FIG. 20B is a schematic cross-sectional view illustrating the method for manufacturing the image display device of the third embodiment.

The vias 161a, 111d, and 111s are formed as shown in FIG. 20B. The wiring layer 110 that includes the wiring parts 110a, 110d, and 110s is formed, and the wiring parts 110a, 110d, and 1110s are connected respectively to the vias 161a, 111d, and 111s. The light-transmitting electrodes 159a, 159d, and 159s are formed respectively over the wiring parts 110a, 110d, and 110s.

Thereafter, the color filter is formed similarly to the other embodiments.

Effects of the image display device of the embodiment will now be described.

The embodiment also has effects such as the following in addition to the effects of reducing the time of the transfer process for forming the light-emitting element 150 and reducing the number of processes similarly to the other embodiments described above. Namely, according to the embodiment, the light-emitting element 150 is formed so that the graphene sheet 140a formed on the connection plate 130a of the single-crystal metal is interposed. Therefore, the image display device of the embodiment can obtain the light-emitting element 150 that has a higher-quality crystal structure. Accordingly, the yield of the image display device can be increased.

The aspect in which the graphene layer 140 and the graphene sheet 140a are added is not limited to the embodiment and can be applied also to the modifications of the first and second embodiments described above, and can be applied to other embodiments described below as well.

Fourth Embodiment

Figure 21:
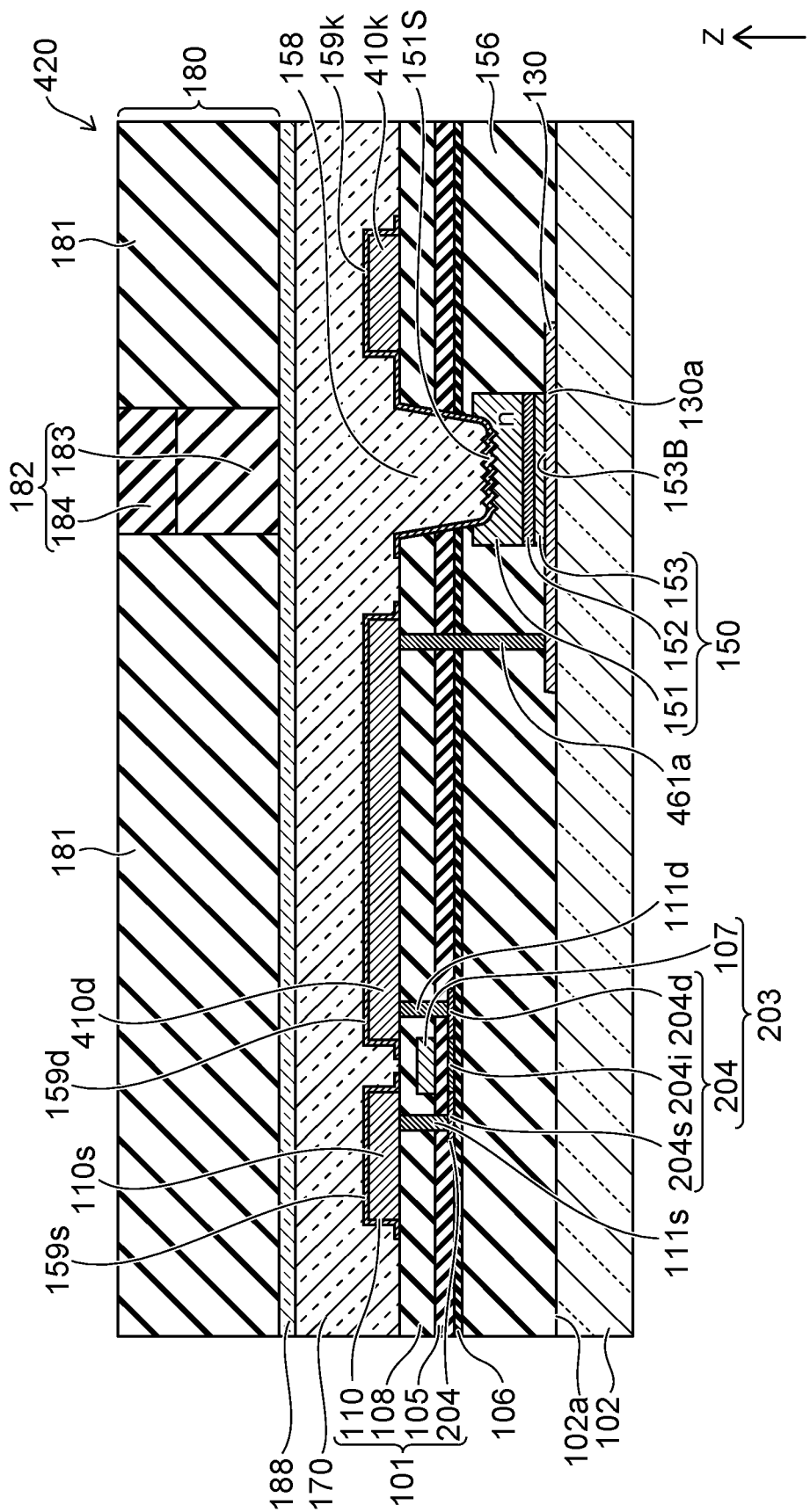
FIG. 21 is a schematic cross-sectional view illustrating a portion of an image display device according to a fourth embodiment.

FIG. 21 is a schematic cross-sectional view illustrating a portion of an image display device according to the embodiment.

The embodiment differs from the first embodiment in that a via 461a is provided between the connection plate 130a and a wiring part 410d. The embodiment differs from the first embodiment also in that the light-emitting element 150 is driven by the p-type transistor 203. The same components as those of the other embodiments described above are marked with the same reference numerals, and a detailed description is omitted as appropriate.

As shown in FIG. 21, a subpixel 420 of the image display device of the embodiment includes the substrate 102, the conductive layer 130, the light-emitting element 150, the first inter-layer insulating film 156, the transistor 203, the second inter-layer insulating film 108, the via 461a, and the wiring layer 110. The transistor 203 is a p-channel TFT. The light-emitting element 150 provides the light-emitting surface 151S made of the n-type semiconductor layer 151. The bottom surface 153B of the light-emitting element 150 is located on the connection plate 130a, and the p-type semiconductor layer 153 is electrically connected to the connection plate 130a.

The connection plate 130a is provided similarly to that of the first embodiment. In other words, the connection plate 130a is located directly under the light-emitting element 150, and when projected onto the XY plane, the outer perimeter of the connection plate 130a is set to contain the outer perimeter of the light-emitting element 150 when the light-emitting element 150 is projected onto the connection plate 130a. That is, the outer perimeter of the light-emitting element 150 is located within the outer perimeter of the connection plate 130a when projected onto the XY plane. Therefore, the connection plate 130a also functions as a light-reflecting plate, and the substantial luminous efficiency of the light-emitting element 150 is increased.

The wiring layer 110 is formed on the second inter-layer insulating film 108. The wiring layer 110 includes wiring parts 410k, 410d, and 110s. For example, the wiring part 410k is connected to the ground line 4 of the circuit shown in FIG. 13.

A portion of the wiring part (a third wiring part) 410d is located above the transistor 203 and is connected to the region 204d by the via 111d. Another portion of the wiring part 410d is located at the vicinity of the light-emitting element 150 and is connected to the connection plate 130a by the via 461a. That is, the via 461a is provided to extend through the second inter-layer insulating film 108, the insulating layer 105, the TFT underlying film 106, and the first inter-layer insulating film 156. The via 461a is located between the connection plate 130a and the wiring part 410d and electrically connects the connection plate 130a and the wiring part 410d.

The light-transmitting electrode 159k is provided over the wiring part 410k. The light-transmitting electrode 159k is provided over the light-emitting surface 151S. The light-transmitting electrode 159k is located between the wiring part 410k and the light-emitting surface 151S. Accordingly, the n-type semiconductor layer 151 is electrically connected to the ground line 4 of the circuit shown in FIG. 13 via, for example, the light-transmitting electrode 159k and the wiring part (a fourth wiring part) 410k.

The light-transmitting electrode 159d is provided over the wiring part 410d. Accordingly, the p-type semiconductor layer 153 is electrically connected to the region 204d, i.e., the drain electrode of the transistor 203, via the connection plate 130a, the via 461a, the wiring part 410d, the light-transmitting electrode 159d, and the via 111d.

The light-transmitting electrode 159s is provided over the wiring part 110s. For example, the wiring part 110s and the light-transmitting electrode 159s are connected to the power supply line 3 shown in FIG. 13. Accordingly, the region 204s of the transistor 203 is electrically connected to the power supply line 3 of the circuit shown in FIG. 13 by the via 111s, the wiring part 110s, and the light-transmitting electrode 159s.

The vias 461*a*, 111*d*, and 111*s* and the wiring parts 410*k*, 410*d*, and 110*s* are formed using materials and formation methods similar to those of the other embodiments and their modifications described above.

Also, the color filter 180, etc., are provided similarly to the other embodiments described above.

A method for manufacturing the image display device of the embodiment will now be described.

Figure 22A:
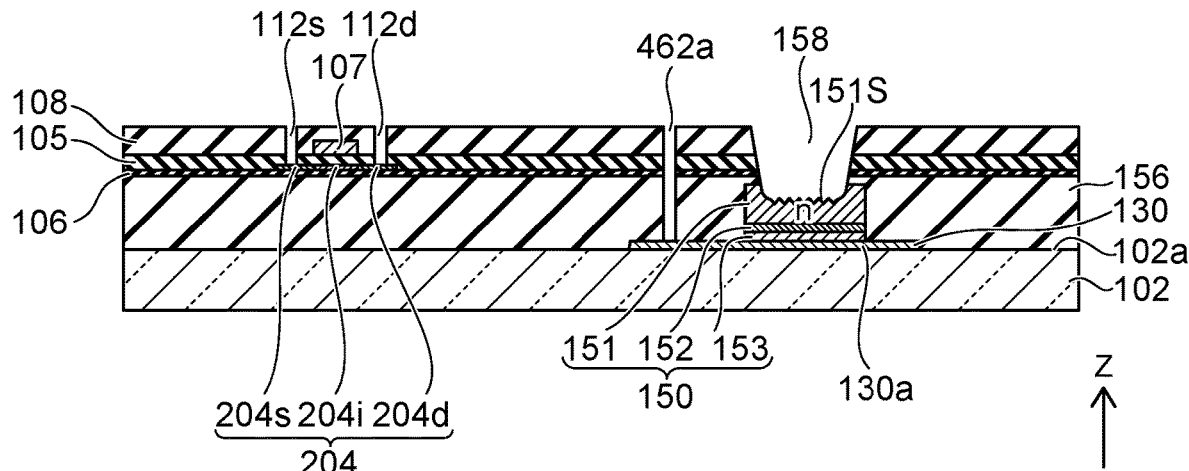
FIG. 22A is a schematic cross-sectional view illustrating a method for manufacturing the image display device of the fourth embodiment.
Figure 22B:
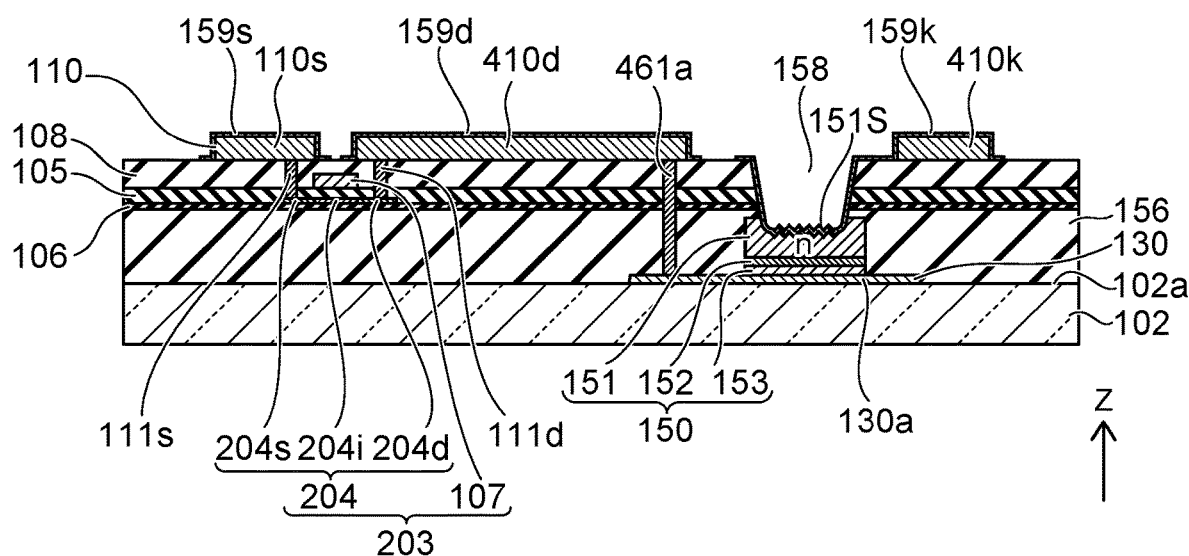
FIG. 22B is a schematic cross-sectional view illustrating the method for manufacturing the image display device of the fourth embodiment.

FIGS. 22A and 22B are schematic cross-sectional views illustrating the method for manufacturing the image display device of the embodiment.

The manufacturing method of the embodiment is the same as the manufacturing method of the first embodiment partway through the procedure. In the following description, the processes of FIGS. 22A and 22B are performed after the process of forming the second inter-layer insulating film 108 in FIG. 6B. However, while the n-channel transistor 103 is formed on the TFT underlying film 106 in FIG. 6B, the embodiment differs in that the p-channel transistor 203 is formed on the TFT underlying film 106. The method for forming the p-channel transistor 203 is similar to that of the second embodiment already described, and a detailed description is omitted.

As shown in FIG. 22A, a via hole 462*a* is formed to extend through the second inter-layer insulating film 108, the insulating layer 105, the TFT underlying film 106, and the first inter-layer insulating film 156 and reach the connection plate 130*a*. The opening 158 and the via holes 112*d* and 112*s* are formed similarly to the other embodiments described above.

As shown in FIG. 22B, the vias 461*a*, 111*d*, and 111*s* are formed by filling a conductive material into the via holes 462*a*, 112*d*, and 112*s* shown in FIG. 22A. The wiring layer 110 is formed on the second inter-layer insulating film 108. The light-transmitting electrodes 159*k*, 159*d*, and 159*s* are formed by forming a transmissive conductive film on the wiring layer 110.

Effects of the image display device of the embodiment will now be described.

The image display device of the embodiment has the following effects in addition to the effects of the first embodiment described above. Namely, according to the embodiment, a circuit configuration in which the light-emitting element 150 is driven by the p-channel transistor 203 can be used while using the light-emitting surface 151S as the n-type semiconductor layer 151. Therefore, wider variation of the circuit layout, etc., is possible, and flexible circuit design is possible.

Fifth Embodiment

Figure 23:
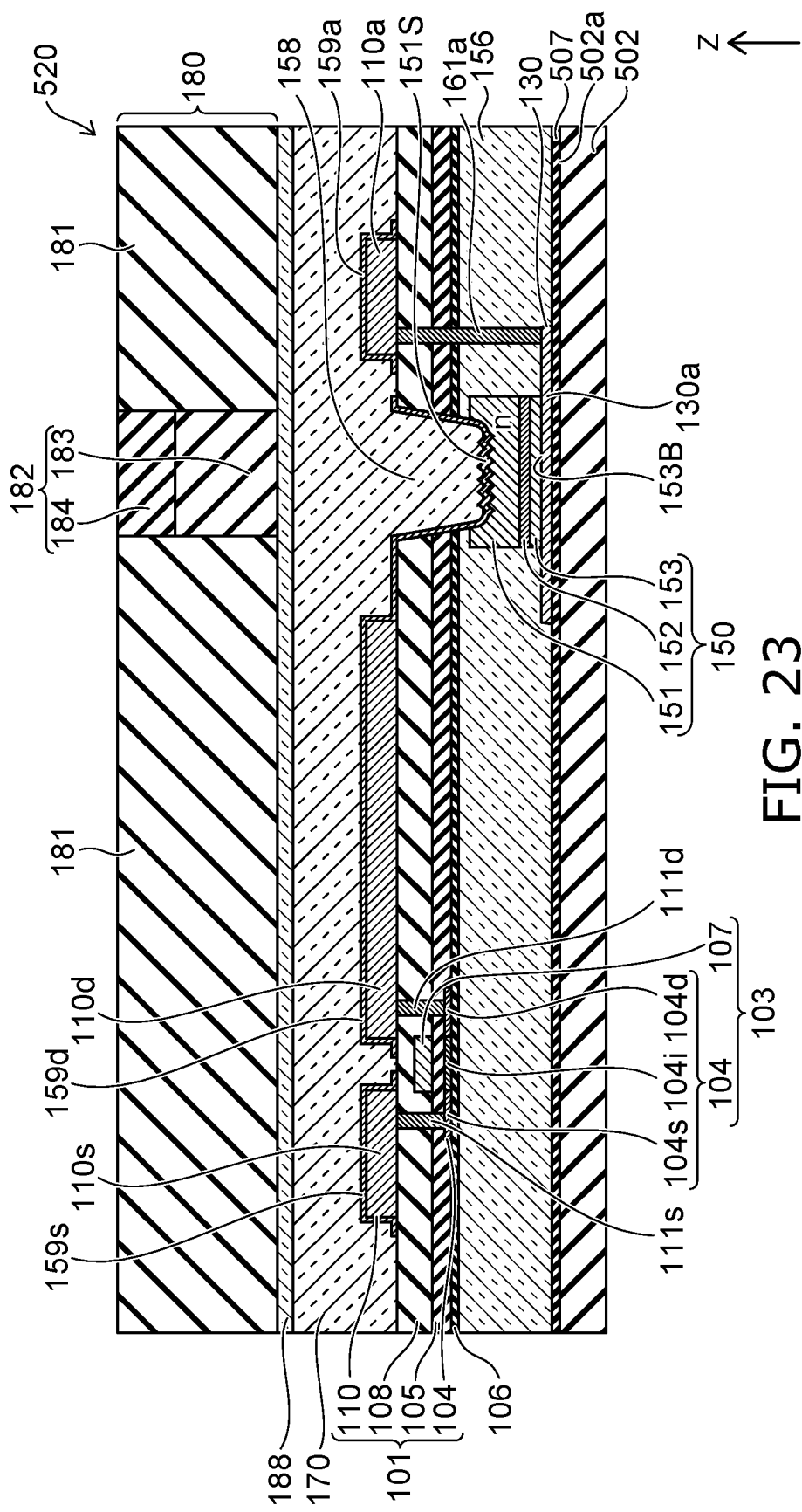
FIG. 23 is a schematic cross-sectional view illustrating a portion of an image display device according to a fifth embodiment.

FIG. 23 is a schematic cross-sectional view illustrating a portion of an image display device according to the embodiment.

The image display device of the embodiment includes a flexible substrate 502 instead of the glass substrate. The light-emitting elements and the circuit elements such as the transistors, etc., are formed on a first surface 502*a* of the substrate 502. Otherwise, the image display device is similar to that of the first embodiment described above; the same components are marked with the same reference numerals, and a detailed description is omitted as appropriate.

As shown in FIG. 23, the image display device of the embodiment includes a subpixel 520. The subpixel 520 includes the substrate 502. The substrate 502 includes the first surface 502*a*. When the substrate 502 is formed of an organic material such as a resin, etc., a layer 507 that includes a silicon compound is formed on the first surface 502*a*. The silicon compound-including layer 507 is formed of $SiO_2$, $SiN_x$, etc. Because the conductive layer 130 is formed of a metal material, the silicon compound-including layer 507 is provided to improve the adhesion between the substrate 502 and the conductive layer 130.

The conductive layer 130 and the connection plate 130*a* are located on the first surface 502*a* with the silicon compound-including layer 507 interposed. The structures and components higher than the conductive layer 130 and the connection plate 130*a* of the example are the same as those of the first embodiment described above, and a detailed description is omitted.

The substrate 502 is flexible. For example, the substrate 502 is formed of a polyimide resin, etc. It is favorable for the first inter-layer insulating film 156, the second inter-layer insulating film 108, the wiring layer 110, etc., to be formed of a material that is somewhat flexible to correspond to the flexibility of the substrate 502. The wiring layer 110, which has the longest wiring length, has the highest risk of damage when bending. When the image display device is bent, the inner surface that is curved contracts due to compressive stress, and the outer surface elongates due to elongation stress. The neutral surface at which both stresses cancel exists inside the image display device, and elongation and contraction due to the stress due to the curving do not occur at the neutral surface. Therefore, by providing the wiring layer 110 at the neutral surface, the damage risk of the wiring layer 110 can be avoided. As necessary, the stress due to the curving may be reduced by providing multiple protective films at the front surface and/or back side of the image display device. Also, it is desirable for the neutral surface to overlap the position of the wiring layer 110 by adjusting the film thicknesses, film properties, materials, etc., of these protective films.

In the example, the structures and components that are higher than the silicon compound-including layer 507 are the same as those of the first embodiment, but can be those of the other embodiments and their modifications described above as well. It is also possible to apply the flexible substrate 502 of the embodiment to the sixth embodiment described below.

A method for manufacturing the image display device of the embodiment will now be described.

Figure 24A:
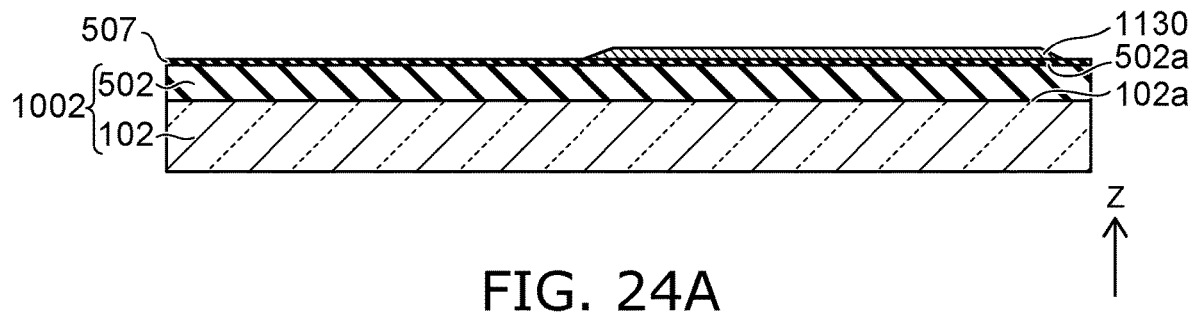
FIG. 24A is a schematic cross-sectional view illustrating a method for manufacturing the image display device of the fifth embodiment.
Figure 24B:
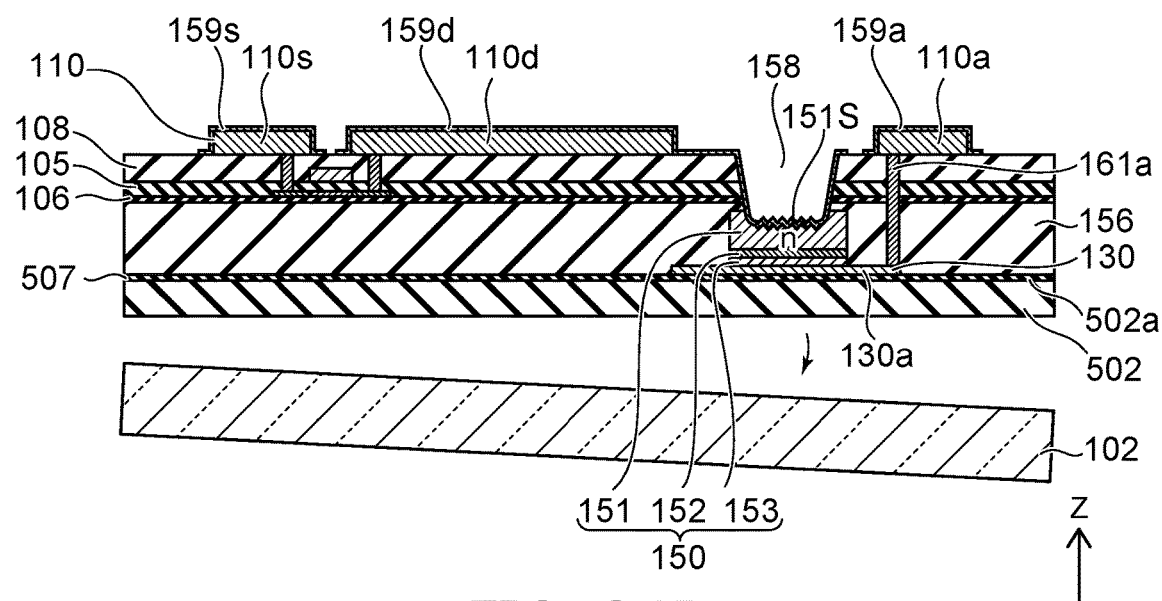
FIG. 24B is a schematic cross-sectional view illustrating the method for manufacturing the image display device of the fifth embodiment.

FIGS. 24A and 24B are schematic cross-sectional views illustrating the method for manufacturing the image display device of the embodiment.

According to the embodiment as shown in FIG. 24A, a different substrate 1002 from that of the other embodiments described above is prepared. The substrate 1002 includes the two layers of the substrates 102 and 502. The substrate (the first substrate) 102 is, for example, a glass substrate. The substrate (a second substrate) 502 is located on the first surface 102*a* of the substrate 102. For example, the substrate 502 is formed by coating polyimide onto the first surface 102*a* and by firing. An inorganic film of $SiN_x$, etc., may be formed on the first surface 102*a* before forming the substrate 502. In such a case, the substrate 502 is formed by coating a polyimide material onto the inorganic film and by firing.

The silicon compound-including layer 507 is formed over the first surface 502*a* of the substrate 502. The first surface 502*a* of the substrate 502 is the surface at the side opposite to the surface on which the substrate 102 is located.

The conductive layer 1130 is formed and patterned on the exposed surface of the silicon compound-including layer 507 formed on such a substrate 1002. Subsequently, for example, the upper structure of the subpixel 520 is formed by applying the processes described above for FIGS. 5B to 7B, FIG. 9, and FIGS. 10A to 10D.

As shown in FIG. 24B, the substrate 102 is removed from the structure body in which the upper structural component including the not-illustrated color filter, etc., is formed. For example, laser lift-off or the like is used to remove the substrate 102.

The removal of the substrate 102 is not limited to the timing described above and can be performed at an appropriate timing. When the substrate 502 is made of an organic resin and there is a process of exposing to a high temperature after removing the substrate 102, there is a risk that the heating may cause the substrate 502 to contract, etc. It is therefore favorable to remove the substrate 102 in a process that is after such a process of exposing to a high temperature. For example, it is favorable to remove the substrate 102 after the process of forming the wiring layer 110 has ended. By removing the substrate 102 at an appropriate timing, discrepancies such as cracking, chipping, etc., in the manufacturing processes may be reduced.

Effects of the image display device of the embodiment will now be described.

The image display device of the embodiment has the following effects in addition to the effects of the other embodiments described above. Namely, because the substrate 502 is flexible, bending of the image display device is possible, and adhering to a curved surface, utilizing in a wearable terminal, etc., can be realized without discomfort.

Sixth Embodiment

Figure 25:
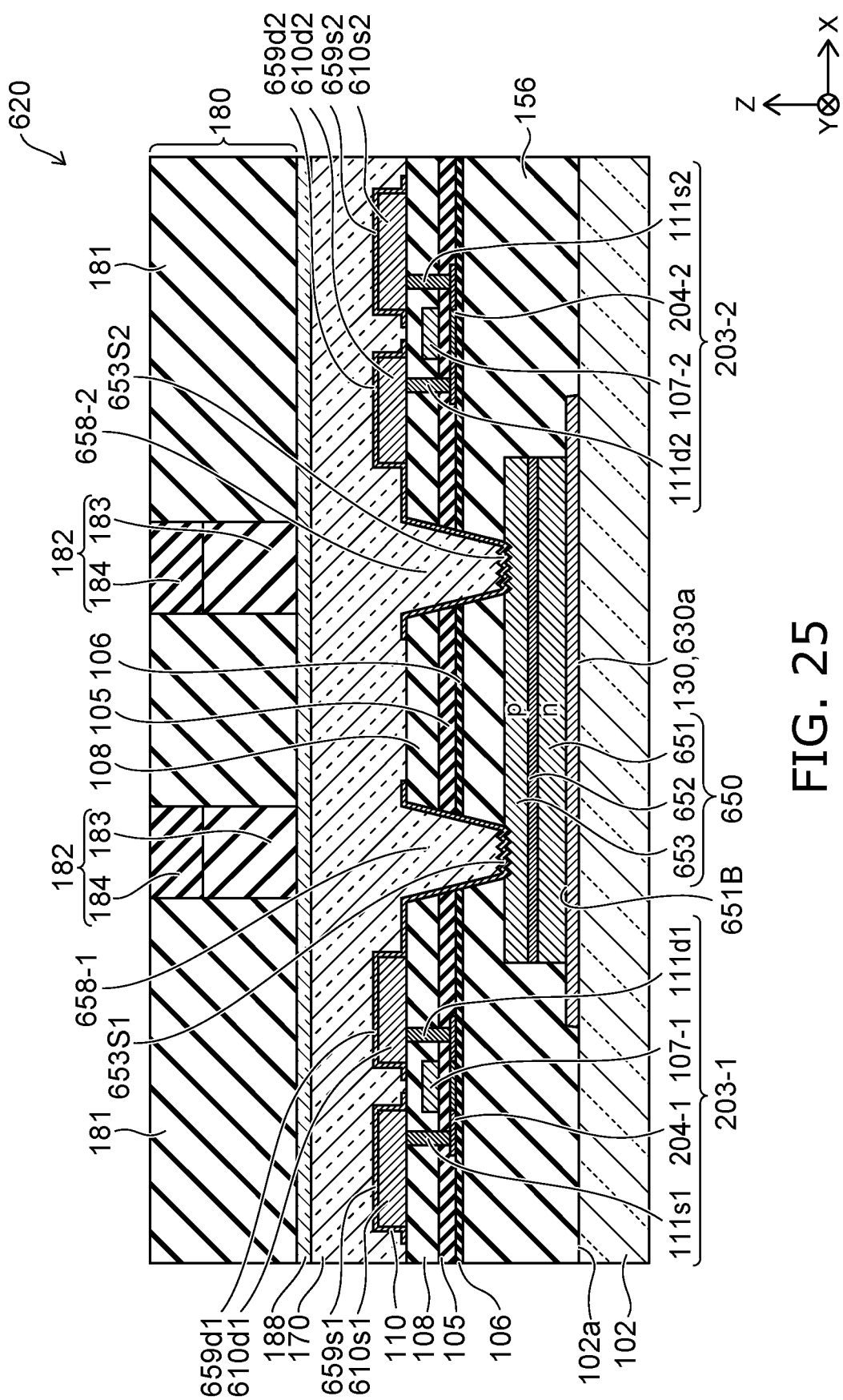
FIG. 25 is a schematic cross-sectional view illustrating a portion of an image display device according to a sixth embodiment.

FIG. 25 is a schematic cross-sectional view illustrating a portion of an image display device according to the embodiment.

According to the embodiment, an image display device that has a higher luminous efficiency is realized by forming multiple light-emitting surfaces 653S1 and 653S2 in a single semiconductor layer 650 that includes a light-emitting layer. In the following description, the same components as those of the other embodiments described above are marked with the same reference numerals, and a detailed description is omitted as appropriate.

As shown in FIG. 25, the image display device of the embodiment includes a subpixel group 620. The subpixel group 620 includes the substrate 102, the conductive layer 130, the semiconductor layer 650, the first inter-layer insulating film 156, multiple transistors 203-1 and 203-2, the second inter-layer insulating film 108, and the wiring layer 110. The conductive layer 130 includes a connection plate 630a. The connection plate (a second part) 630a is located on the first surface 102a of the substrate 102. The semiconductor layer 650 is located on the connection plate 630a. To avoid a complex display in the cross-sectional views of the embodiment, the reference numeral of the conductive layer 130 is labeled next to the reference numeral of the connection plate 630a.

According to the embodiment, for example, the conductive layer 130 and the connection plate 630a are connected to the ground line 4 of the circuit of FIG. 13. By switching the p-channel transistors 203-1 and 203-2 on, electrons are injected from one side of the semiconductor layer 650 via the conductive layer 130 and the connection plate 130a. By switching the p-channel transistors 203-1 and 203-2 on, holes are injected from the other side of the semiconductor layer 650 via the wiring layer 110. The holes and the electrons are injected into the semiconductor layer 650, and a light-emitting layer 652 is caused to emit light by the combination of the holes and electrons.

For example, the circuit configuration shown in FIG. 13 is applied to the drive circuit for driving the light-emitting layer 652. As in the other embodiments described above, a configuration in which an n-channel transistor drives the semiconductor layer also is possible by vertically interchanging the n-type semiconductor layer and p-type semiconductor layer of the semiconductor layer. In such a case, for example, the circuit configuration of FIG. 3 is applied to the drive circuit.

The configuration of the subpixel group 620 will now be described in detail.

The conductive layer 130 is located on the first surface 102a. The conductive layer 130 includes the connection plate 630a. The semiconductor layer 650 is located on the first surface 102a via the connection plate 630a. The semiconductor layer 650 includes a bottom surface 651B, and the connection plate 630a is connected to the bottom surface 651B. When projected onto the XY plane, the outer perimeter of the connection plate 630a is set to contain the outer perimeter of the semiconductor layer 650 when the semiconductor layer 650 is projected onto the connection plate 630a. That is, the outer perimeter of the semiconductor layer 650 is located within the outer perimeter of the connection plate 630a when projected onto the XY plane. The conductive layer 130 and the connection plate 630a are formed of a metal material such as Cu, Hf, etc., and therefore are light-reflective. Accordingly, the connection plate 630a reflects the downward-scattered light of the semiconductor layer 650 upward toward the side of the light-emitting surfaces 653S1 and 653S2. Therefore, the substantial luminous efficiency of the semiconductor layer 650 is increased.

The semiconductor layer 650 includes the multiple light-emitting surfaces 653S1 and 653S2. The semiconductor layer 650 is a prismatic or cylindrical stacked body that has the bottom surface 651B connected to the connection plate 630a. The light-emitting surfaces 653S1 and 653S2 are surfaces at the side opposite to the bottom surface 651B. It is favorable for the light-emitting surfaces 653S1 and 653S2 to be surfaces in a plane substantially parallel to the bottom surface 651B. The plane that includes the light-emitting surface 653S1 and the plane that includes the light-emitting surface 653S2 may be the same plane or different planes. The light-emitting surfaces 653S1 and 653S2 are provided to be separated in the X-axis direction.

The semiconductor layer 650 includes an n-type semiconductor layer 651, the light-emitting layer 652, and a p-type semiconductor layer 653. The n-type semiconductor layer 651, the light-emitting layer 652, and the p-type semiconductor layer 653 are stacked in this order from the bottom surface 651B toward the light-emitting surfaces 653S1 and 653S2.

The bottom surface 651B is an n-type semiconductor, and the n-type semiconductor layer 651 is electrically connected to an external circuit connected via the bottom surface 651B and the connection plate 630a. In this case, the external circuit is, for example, the ground line 4 of the circuit of FIG. 13.

The p-type semiconductor layer 653 includes the two light-emitting surfaces 653S1 and 653S2 at the upper surface. That is, one subpixel group 620 substantially includes two subpixels. According to the embodiment, similarly to the other embodiments described above, a display region is formed by arranging the subpixel group 620 substantially including two subpixels in a lattice shape.

The first inter-layer insulating film (the first insulating film) 156 covers the first surface 102a, the conductive layer 130, the side surface of the n-type semiconductor layer 651, the side surface of the light-emitting layer 652, and the side surface of the p-type semiconductor layer 653. The first inter-layer insulating film 156 covers a portion of the upper surface of the p-type semiconductor layer 653. In the p-type semiconductor layer 653, the light-emitting surfaces 653S1 and 653S2 are not covered with the first inter-layer insulating film 156. Similarly to the other embodiments described above, the first inter-layer insulating film 156 is favorably a white resin.

The TFT underlying film 106 is formed over the first inter-layer insulating film 156. The TFT underlying film 106 is not provided on the light-emitting surfaces 653S1 and 653S2. The TFT underlying film 106 is planarized, and the TFT channels 204-1 and 204-2, etc., are formed on the TFT underlying film 106.

The insulating layer 105 covers the TFT underlying film 106 and the TFT channels 204-1 and 204-2. A gate 107-1 is located on the TFT channel 204-1 with the insulating layer 105 interposed. A gate 107-2 is located on the TFT channel 204-2 with the insulating layer 105 interposed. The transistor 203-1 includes the TFT channel 204-1 and the gate 107-1. The transistor 203-2 includes the TFT channel 204-2 and the gate 107-2.

The second inter-layer insulating film 108 (the second insulating film) covers the insulating layer 105 and the gates 107-1 and 107-2.

The TFT channels 204-1 and 204-2 include regions doped to be of the p-type, and the transistors 203-1 and 203-2 are p-channel TFTs. The transistor 203-1 is located at a position more proximate to the light-emitting surface 653S1 than the light-emitting surface 653S2. The transistor 203-2 is located at a position more proximate to the light-emitting surface 653S2 than the light-emitting surface 653S1.

A light-transmitting electrode 659d1 is provided over the light-emitting surface 653S1. An opening 658-1 is provided above the light-emitting surface 653S1 and the light-transmitting electrode 659d1. A light-transmitting electrode 659d2 is provided over the light-emitting surface 653S2. An opening 658-2 is provided above the light-emitting surface 653S2 and the light-transmitting electrode 659d2. The second inter-layer insulating film 108, the insulating layer 105, the TFT underlying film 106, and the first inter-layer insulating film 156 are not provided in the openings 658-1 and 658-2. The light-emitting surfaces 653S1 and 653S2 are exposed via the openings 658-1 and 658-2 formed by removing portions of the second inter-layer insulating film 108, the insulating layer 105, the TFT underlying film 106, and the first inter-layer insulating film 156. The openings 658-1 and 658-2 are filled with the surface resin layer 170.

The light-emitting surfaces 653S1 and 653S2 are squares, rectangles, other polygons, circles, etc., when projected onto the XY plane. The shapes of the uppermost portions of the openings 658-1 and 658-2 also can be squares, rectangles, other polygons, circles, etc. For example, as in the example, it is favorable for the openings 658-1 and 658-2 to be formed in tapered shapes so that the areas widen upward to reduce loss due to light reflected by the wall surfaces of the openings 658-1 and 658-2. When projected onto the XY plane, the shapes of the light-emitting surfaces 653S1 and 653S2 and the shapes of the uppermost portions of the openings 658-1 and 658-2 may be similar or may not be similar.

The wiring layer 110 is located on the second inter-layer insulating film 108. The wiring layer 110 includes wiring parts 610s1, 610d1, 610d2, and 610s2. For example, the wiring parts 610s1 and 610s2 are connected to the power supply line 3 of the circuit shown in FIG. 13.

Vias 111d1, 111s1, 111d2, and 111s2 are provided to extend through the second inter-layer insulating film 108, the insulating layer 105, and the TFT underlying film 106. The via 111d1 is located between the wiring part 610d1 and one region of the transistor 203-1 doped to be of the p-type. The via 111s1 is located between the wiring part 610s1 and another region of the transistor 203-1 doped to be of the p-type. The via 111d2 is located between the wiring part 610d2 and one region of the transistor 203-2 doped to be of the p-type. The via 111s2 is located between the wiring part 610s2 and another region of the transistor 203-2 doped to be of the p-type.

The wiring part 610d1 is connected to a p-type region corresponding to the drain electrode of the transistor 203-1 by the via 111d1. The wiring part 610s1 is connected to a p-type region corresponding to the source electrode of the transistor 203-1 by the via 111s1. The wiring part 610d2 is connected to a region corresponding to the drain electrode of the transistor 203-2 by the via 111d2. The wiring part 610s2 is connected to a region corresponding to the source electrode of the transistor 203-2 by the via 111s2.

The light-transmitting electrode 659d1 is provided over the light-emitting surface 653S1 and the wiring part 610d1. The light-transmitting electrode 659d1 also is located between the light-emitting surface 653S1 and the wiring part 610d1 and electrically connects the light-emitting surface 653S1 and the wiring part 610d1. A light-transmitting electrode 659s1 is provided over the wiring part 610s1. Accordingly, the p-type semiconductor layer 653 is electrically connected to a region corresponding to the drain electrode of the TFT channel 204-1 via the light-emitting surface 653S1, the light-transmitting electrode 659d1, the wiring part 610d1, and the via 111d1. A region that corresponds to the source electrode of the TFT channel 204-1 is electrically connected to the power supply line 3 by the via 111s1, the wiring part 610s1, and the light-transmitting electrode 659s1.

The light-transmitting electrode 659d2 is provided over the light-emitting surface 653S2 and the wiring part 610d2. The light-transmitting electrode 659d2 also is located between the light-emitting surface 653S2 and the wiring part 610d2 and electrically connects the light-emitting surface 653S2 and the wiring part 610d2. A light-transmitting electrode 659s2 is provided over the wiring part 610s2. Accordingly, the p-type semiconductor layer 653 is electrically connected to a region corresponding to the drain electrode of the TFT channel 204-2 via the light-emitting surface 653S2, the light-transmitting electrode 659d2, the wiring part 610d2, and the via 111d2. A region that corresponds to the source electrode of the TFT channel 204-2 is electrically connected to the power supply line 3 by the via 111s2, the wiring part 610s2, and the light-transmitting electrode 659s2.

The transistors 203-1 and 203-2 are, for example, drive transistors of adjacent subpixels and are sequentially driven. Holes that are supplied from one of the two transistors 203-1 and 203-2 are injected into the light-emitting layer 652, electrons that are supplied from the connection plate 630a are injected into the light-emitting layer 652, and the light-emitting layer 652 emits light.

According to the embodiment, the drift current that flows in a direction parallel to the XY plane is suppressed by the resistance of the n-type semiconductor layer 651 and the p-type semiconductor layer 653. Therefore, the holes that are injected from the light-emitting surfaces 653S1 and 653S2 and the electrons that are injected from the connection plate 630a both travel along the stacking direction of the semiconductor layer 650. Because a light emission source substantially does not operate further outward of the light-emitting surfaces 653S1 and 653S2, the multiple light-emitting surfaces 653S1 and 653S2 that are located in one semiconductor layer 650 can be selectively caused to emit light respectively by the transistors 203-1 and 203-2.

Thus, the light emission source of the semiconductor layer 650 is substantially determined by the arrangement of the light-emitting surfaces 653S1 and 653S2.

A method for manufacturing the image display device of the embodiment will now be described.

FIGS. 26A to 28B are schematic cross-sectional views illustrating the method for manufacturing the image display device of the embodiment.

The method for manufacturing the image display device of the embodiment can be similar to that of the other embodiment described above up to the formation of the patterned conductive layer on the first surface 102a and the formation of the conductive layer 1130a by monocrystallizing the conductive layer that is formed. In the description, the process of FIG. 26A is applied after the conductive layer 1130a is formed on the first surface 102a in the process of FIG. 5A.

Figure 26A:
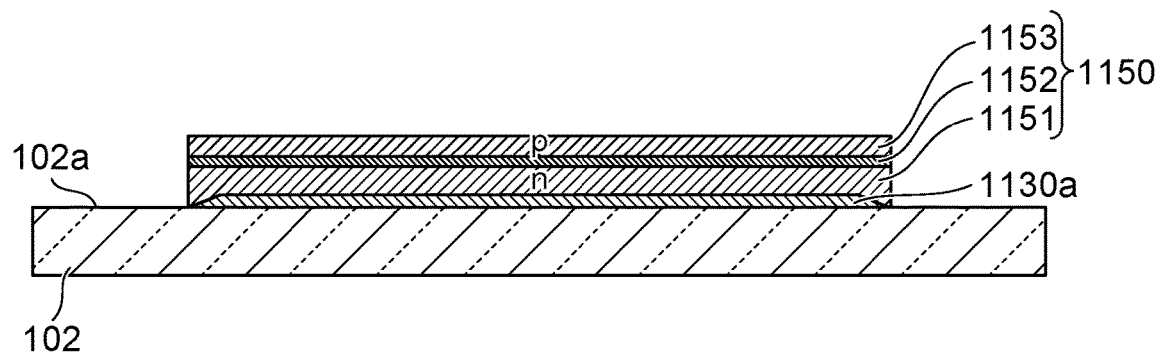
FIG. 26A is a schematic cross-sectional view illustrating a method for manufacturing the image display device of the sixth embodiment.
Figure 26A:
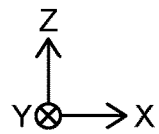

As shown in FIG. 26A, the semiconductor layer 1150 is formed over the conductive layer 1130a. For example, the semiconductor layer 1150 is formed by low-temperature sputtering.

Figure 26B:
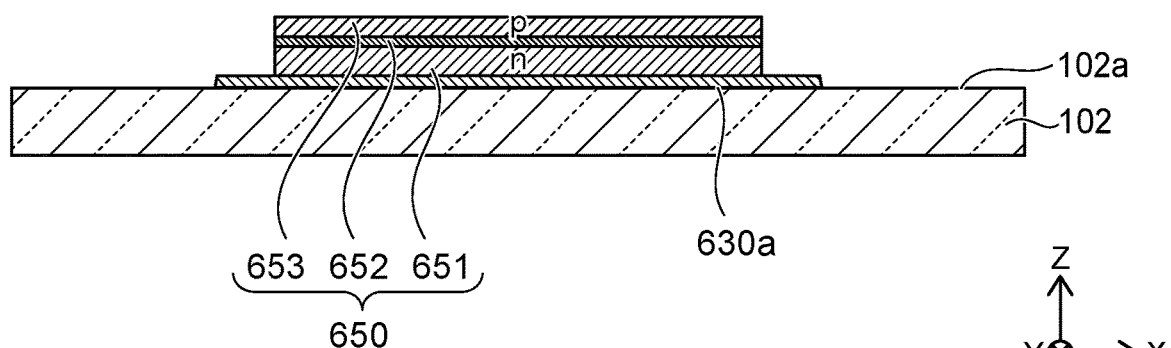
FIG. 26B is a schematic cross-sectional view illustrating the method for manufacturing the image display device of the sixth embodiment.
Figure 26B:
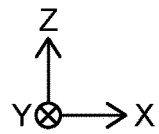

As shown in FIG. 26B, the semiconductor layer 1150 shown in FIG. 26A is shaped into the semiconductor layer 650 of the desired shape by using dry etching such as RIE, etc. The desired shape is, for example, a square, rectangle, other polygon, circle, etc., when projected onto the XY plane. Subsequently, the conductive layer 1130a is shaped by etching, etc., to form the conductive layer 130 including the connection plate 630a. When projected onto the XY plane, the outer perimeter of the connection plate 630a is set to contain the outer perimeter of the semiconductor layer 650 when the semiconductor layer 650 is projected onto the connection plate 630a. That is, the outer perimeter of the semiconductor layer 650 is located within the outer perimeter of the connection plate 630a when projected onto the XY plane.

Figure 27A:
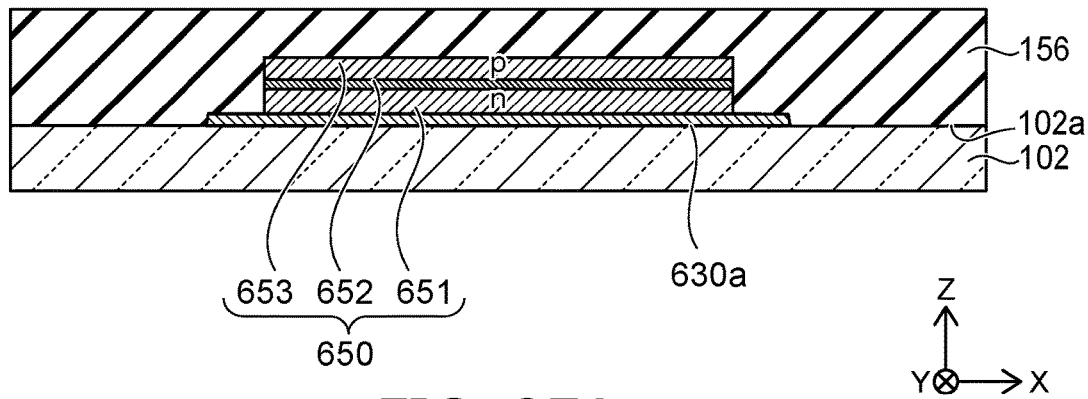
FIG. 27A is a schematic cross-sectional view illustrating the method for manufacturing the image display device of the sixth embodiment.

As shown in FIG. 27A, the first inter-layer insulating film 156 is formed to cover the first surface 102a, the conductive layer 130, and the semiconductor layer 650.

Figure 27B:
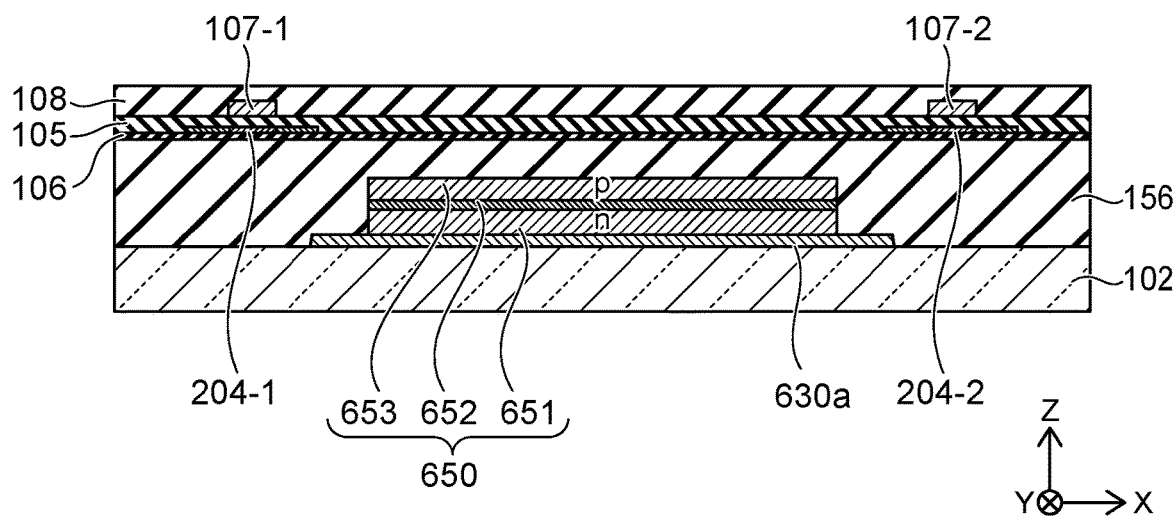
FIG. 27B is a schematic cross-sectional view illustrating the method for manufacturing the image display device of the sixth embodiment.

As shown in FIG. 27B, the TFT underlying film 106 is formed over the first inter-layer insulating film 156, and the TFT channels 204-1 and 204-2 are formed on the TFT underlying film 106. The insulating layer 105 is formed over the TFT underlying film 106 and the TFT channels 204-1 and 204-2. The gate 107-1 is formed on the TFT channel 204-1 with the insulating layer 105 interposed. The gate 107-2 is formed on the TFT channel 204-2 with the insulating layer 105 interposed. The second inter-layer insulating film 108 is formed over the insulating layer 105 and the gates 107-1 and 107-2. The formation method, material, and the like of the TFT channels 204-1 and 204-2, the insulating layer 105, the gates 107-1 and 107-2, etc., can be similar to those of the other embodiments described above.

Figure 28A:
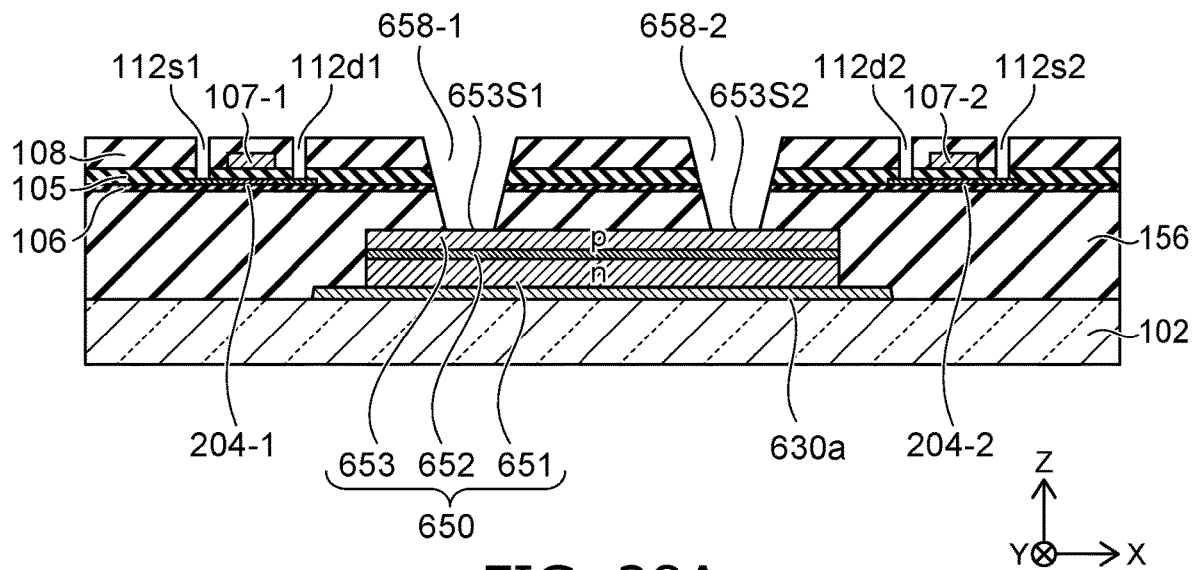
FIG. 28A is a schematic cross-sectional view illustrating the method for manufacturing the image display device of the sixth embodiment.

As shown in FIG. 28A, via holes 112d1 and 112s1 that extend through the second inter-layer insulating film 108 and the insulating layer 105 and reach the TFT channel 204-1 are formed. Via holes 112d2 and 112s2 that extend through the second inter-layer insulating film 108 and the insulating layer 105 and reach the TFT channel 204-2 are formed. The opening 658-1 that reaches the light-emitting surface 653S1 is formed by removing a portion of the second inter-layer insulating film 108, a portion of the insulating layer 105, a portion of the TFT underlying film 106, and a portion of the first inter-layer insulating film 156. The opening 658-2 that reaches the light-emitting surface 653S2 is formed by removing a portion of the second inter-layer insulating film 108, a portion of the insulating layer 105, a portion of the TFT underlying film 106, and a portion of the first inter-layer insulating film 156.

Figure 28B:
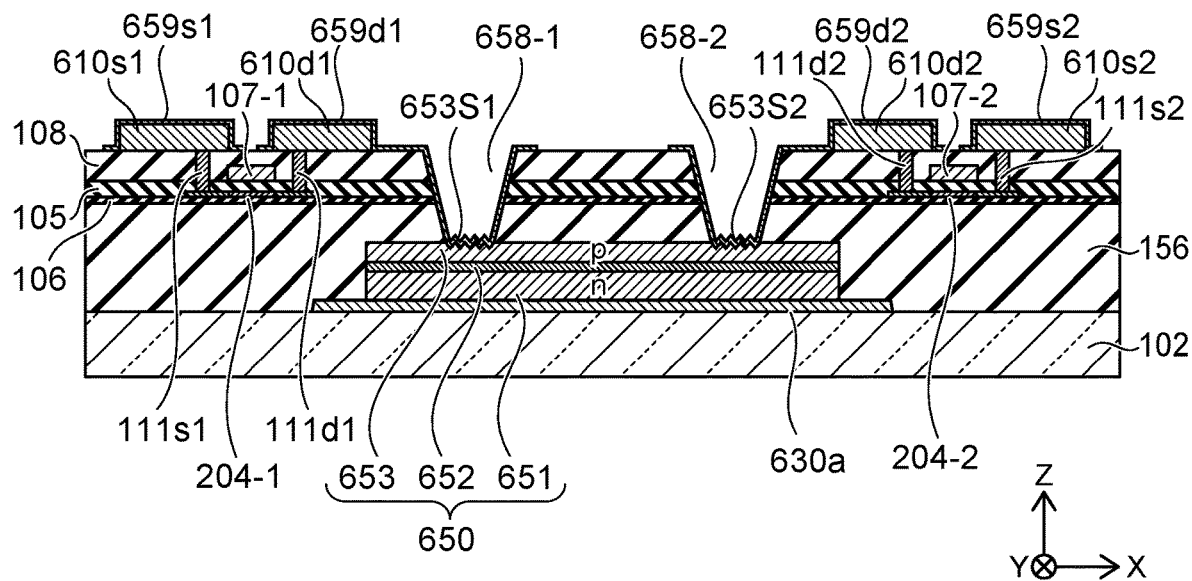
FIG. 28B is a schematic cross-sectional view illustrating the method for manufacturing the image display device of the sixth embodiment.

As shown in FIG. 28B, the vias 111d1, 111s1, 111d2, and 111s2 are formed by filling a conductive material into the via holes 112d1, 112s1, 112d2, and 112s2. The wiring layer 110 that includes the wiring parts 610d1, 610s1, 610d2, and 610s2 is formed on the second inter-layer insulating film 108. The wiring parts 610d1, 610s1, 610d2, and 610s2 are connected respectively to the vias 111d1, 111s1, 111d2, and 111s2.

The light-emitting surfaces 653S1 and 653S2 each are roughened. Subsequently, the light-transmitting electrodes 659d1, 659s1, 659d2, and 659s2 are formed by providing a transmissive conductive film to cover the wiring layer 110. The light-transmitting electrode 659d1 is formed to cover the light-emitting surface 653S1 and electrically connects the light-emitting surface 653S1 and the wiring part 610d1. The light-transmitting electrode 659d2 is formed to cover the light-emitting surface 653S2 and electrically connects the light-emitting surface 653S2 and the wiring part 610d2.

Subsequently, the upper structures such as the color filter, etc., are formed.

Thus, the subpixel group 620 that includes the semiconductor layer 650 including the two light-emitting surfaces 653S1 and 653S2 is formed.

Although two light-emitting surfaces 653S1 and 653S2 are provided in one semiconductor layer 650 according to the example, the number of light-emitting surfaces is not limited to two; three or more light-emitting surfaces can be provided in one semiconductor layer 650. As an example, one column or two columns of subpixel s may be realized by a single semiconductor layer 650. As described below, the recombination current that does not contribute to the light emission per light-emitting surface can be reduced thereby, and the effect of realizing a finer light-emitting element can be increased.

(Modification)

Figure 29:
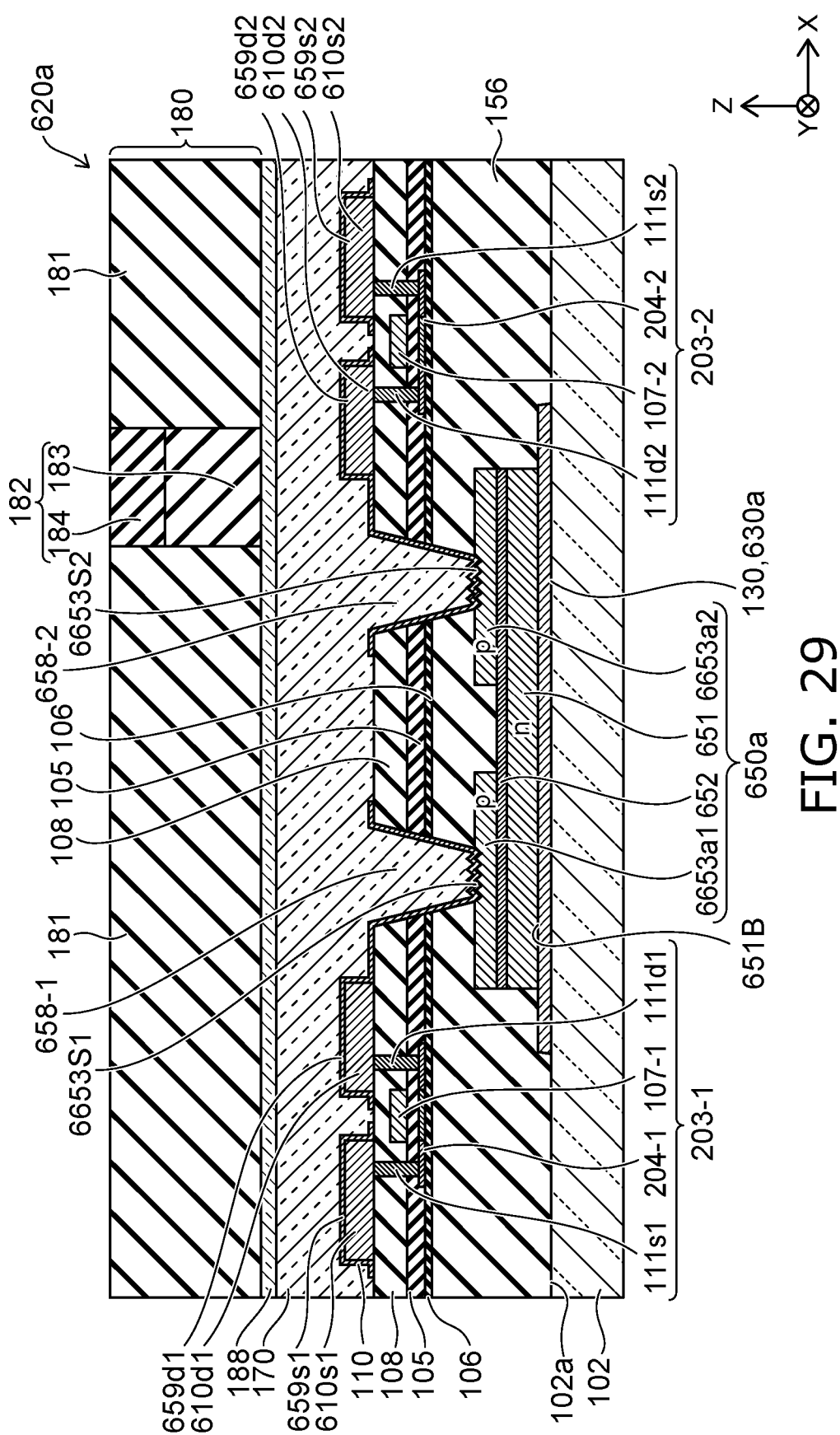
FIG. 29 is a schematic cross-sectional view illustrating a portion of an image display device according to a modification of the sixth embodiment.

FIG. 29 is a schematic cross-sectional view illustrating a portion of an image display device according to a modification of the embodiment.

The modification differs from the sixth embodiment described above in that two p-type semiconductor layers 6653a1 and 6653a2 are located on the light-emitting layer 652. Otherwise, the modification is the same as the sixth embodiment; the same components are marked with the same reference numerals, and a detailed description is omitted as appropriate.

As shown in FIG. 29, the image display device of the modification includes a subpixel group 620a. The subpixel group 620a includes a semiconductor layer 650a. The semiconductor layer 650a includes the n-type semiconductor layer 651, the light-emitting layer 652, and the p-type semiconductor layers 6653a1 and 6653a2. The light-emitting layer 652 is stacked on the n-type semiconductor layer 651. The p-type semiconductor layers 6653a1 and 6653a2 each are stacked on the light-emitting layer 652.

The p-type semiconductor layers 6653a1 and 6653a2 are formed in an island configuration on the light-emitting layer 652 and, in the example, are arranged to be separated along the X-axis direction. The first inter-layer insulating film 156 is located between the p-type semiconductor layers 6653a1 and 6653a2, and the p-type semiconductor layers 6653a1 and 6653a2 are divided by the first inter-layer insulating film 156.

In the example, the p-type semiconductor layers 6653a1 and 6653a2 have substantially the same shape when projected onto the XY plane, and the shape may be substantially a square, rectangle, other polygon, circle, etc.

The p-type semiconductor layer 6653a1 includes a light-emitting surface 6653S1. The p-type semiconductor layer 6653a2 includes a light-emitting surface 6653S2. The light-emitting surface 6653S1 is exposed via the opening 658-1 formed by removing portions of the first inter-layer insulating film 156, the TFT underlying film 106, the insulating layer 105, and the second inter-layer insulating film 108. The exposed light-emitting surface 6653S1 is a surface of the p-type semiconductor layer 6653a1. The light-emitting surface 6653S2 is exposed via the opening 658-2 formed by removing portions of the first inter-layer insulating film 156, the TFT underlying film 106, the insulating layer 105, and the second inter-layer insulating film 108. The exposed light-emitting surface 6653S2 is a surface of the p-type semiconductor layer 6653a2.

Similarly to the shapes of the light-emitting surfaces according to the sixth embodiment, the shapes of the light-emitting surfaces 6653S1 and 6653S2 when projected onto the XY plane are substantially the same shape and are substantially a square, etc. The shape of the light-emitting surfaces 6653S1 and 6653S2 is not limited to a rectangle such as that of the embodiment and may be circular, elliptical, polygonal such as hexagonal, etc. The shape of the light-emitting surfaces 6653S1 and 6653S2 may be similar to or different from the shapes of the openings 658-1 and 658-2.

The light-transmitting electrode 659d1 is provided over the light-emitting surface 6653S1 and provided over the wiring part 610d1. The light-transmitting electrode 659d1 is located between the light-emitting surface 6653S1 and the wiring part 610d1 and electrically connects the light-emitting surface 6653S1 and the wiring part 610d1. The light-transmitting electrode 659d2 is provided over the light-emitting surface 6653S2 and provided over the wiring part 610d2. The light-transmitting electrode 659d2 is located between the light-emitting surface 6653S2 and the wiring part 610d2 and electrically connects the light-emitting surface 6653S2 and the wiring part 610d2.

A manufacturing method of the modification will now be described.

FIGS. 30A to 31B are schematic cross-sectional views illustrating the method for manufacturing the image display device of the modification.

Figure 30A:
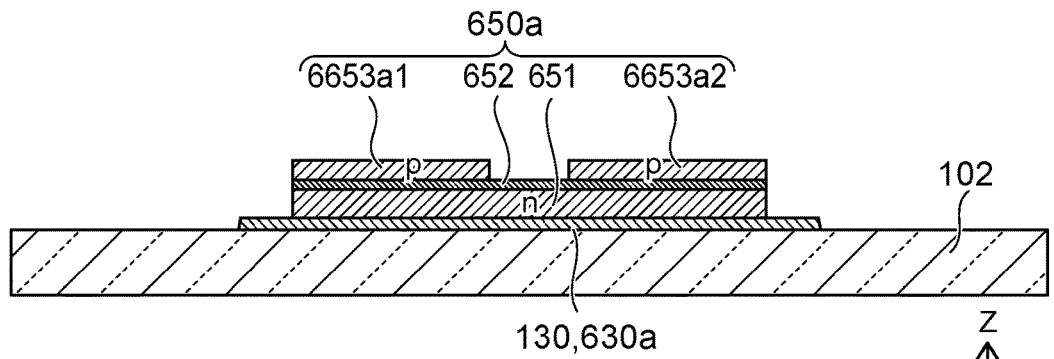
FIG. 30A is a schematic cross-sectional view illustrating a method for manufacturing the image display device of the modification of the sixth embodiment.

In the description of the modification, the processes up to the process shown in FIG. 26A are similar to those of the sixth embodiment, and the process of FIG. 30A and subsequent processes are applied after the process shown in FIG. 26A.

According to the modification as shown in FIG. 30A, the light-emitting layer 652 and the n-type semiconductor layer 651 are formed by etching the semiconductor layer 1150 shown in FIG. 26A. The two p-type semiconductor layers 6653a1 and 6653a2 are formed by further etching.

The etching may be deeper when forming the p-type semiconductor layers 6653a1 and 6653a2. For example, the etching for forming the p-type semiconductor layers 6653a1 and 6653a2 may be performed to exceed a depth that reaches the light-emitting layer 652 and the n-type semiconductor layer 651. Thus, when the p-type semiconductor layers are formed by performing deep etching, it is desirable to etch outward of the outer perimeters of the light-emitting surfaces 6653S1 and 6653S2 shown in FIG. 25 by not less than 1 µm. The recombination current can be suppressed by separating the etching position outward from the outer perimeters of the light-emitting surfaces 6653S1 and 6653S2.

After the semiconductor layer 650a is formed, the conductive layer 130 that includes the connection plate 630a is formed by etching the conductive layer 1130a shown in FIG. 26A. Similarly to the other embodiments described above, the connection plate 630a may be formed by etching the conductive layer 1130a together with the semiconductor layer 1150, and the semiconductor layer 650 may be formed subsequently.

Figure 30B:
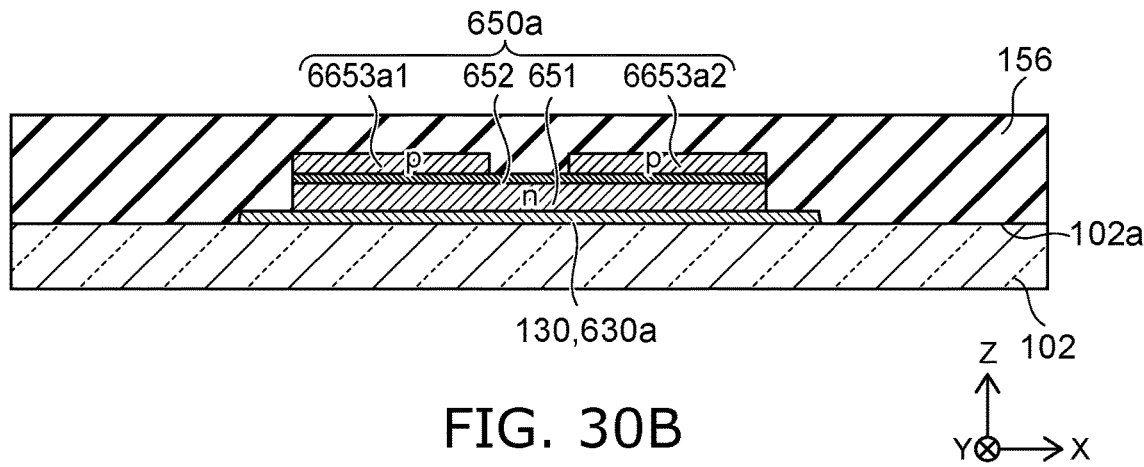
FIG. 30B is a schematic cross-sectional view illustrating the method for manufacturing the image display device of the modification of the sixth embodiment.

As shown in FIG. 30B, the first inter-layer insulating film 156 is formed to cover the first surface 102a, the conductive layer 130, and the semiconductor layer 650a.

Figure 30C:
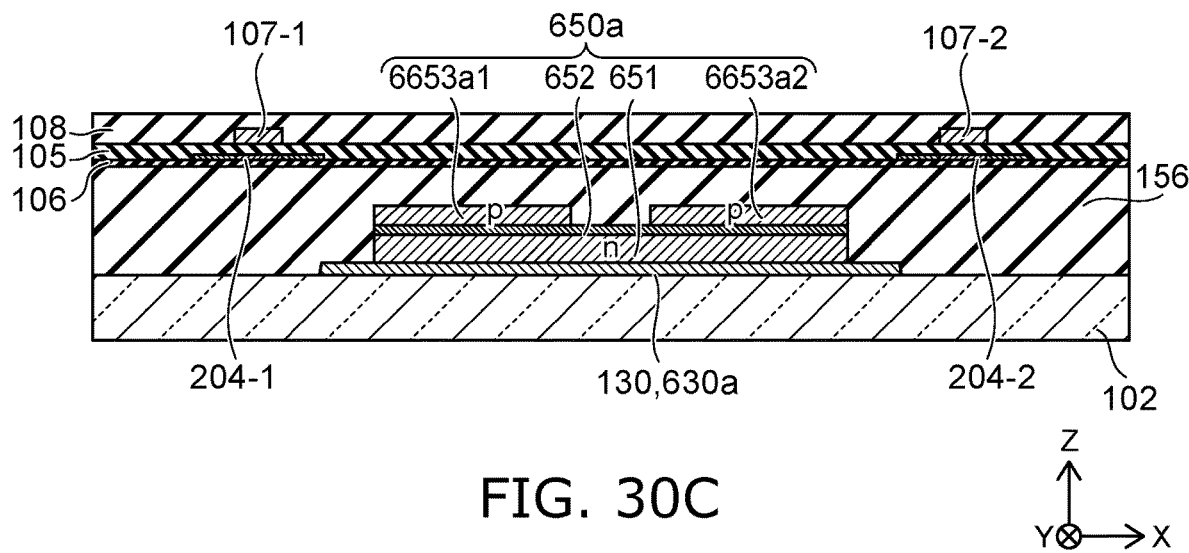
FIG. 30C is a schematic cross-sectional view illustrating the method for manufacturing the image display device of the modification of the sixth embodiment.

As shown in FIG. 30C, the TFT underlying film 106 is formed on the first inter-layer insulating film 156, and the TFT channels 204-1 and 204-2 are formed on the TFT underlying film 106. Also, the insulating layer 105 is formed on the TFT channels 204-1 and 204-2, and the gates 107-1 and 107-2 are formed on the insulating layer 105. The second inter-layer insulating film 108 is formed to cover the insulating layer 105 and the gates 107-1 and 107-2.

Figure 31A:
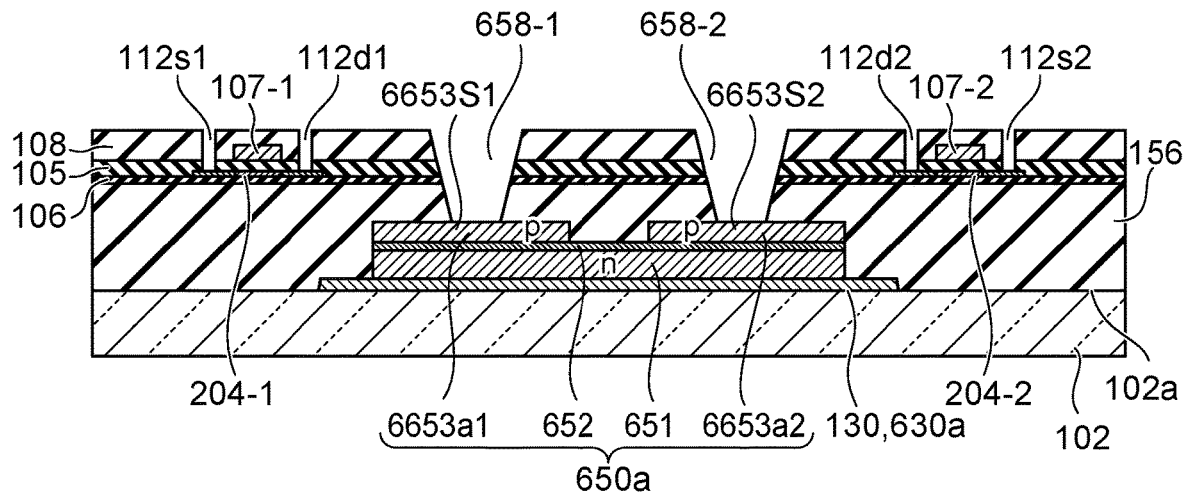
FIG. 31A is a schematic cross-sectional view illustrating the method for manufacturing the image display device of the modification of the sixth embodiment.
Figure 31A:
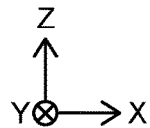

As shown in FIG. 31A, the via holes 112d1, 112s1, 112d2, and 112s2 are formed similarly to those of the sixth embodiment. The opening 658-1 is formed to reach the light-emitting surface 6653S1 by removing a portion of the second inter-layer insulating film 108, a portion of the insulating layer 105, a portion of the TFT underlying film 106, and a portion of the first inter-layer insulating film 156. The opening 658-2 is formed to reach the light-emitting surface 6653S2 by removing a portion of the second inter-layer insulating film 108, a portion of the insulating layer 105, a portion of the TFT underlying film 106, and a portion of the first inter-layer insulating film 156.

Figure 31B:
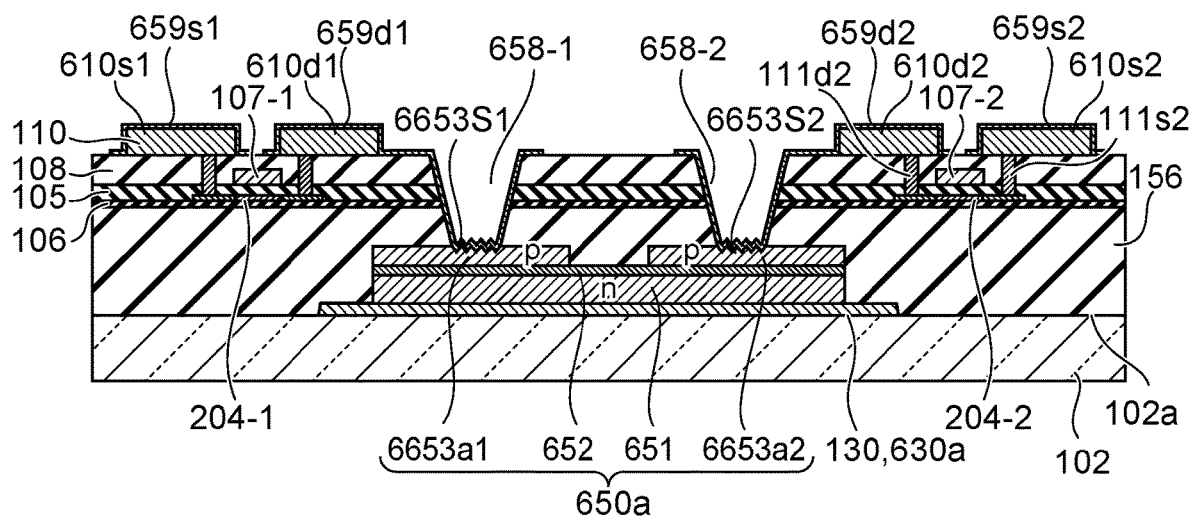
FIG. 31B is a schematic cross-sectional view illustrating the method for manufacturing the image display device of the modification of the sixth embodiment.
Figure 31B:
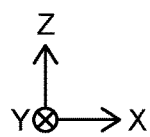

As shown in FIG. 31B, the wiring layer 110 that includes the wiring parts 610d1, 610s1, 610d2, and 610s2 is formed similarly to that of the sixth embodiment. Subsequently, a transmissive conductive film is formed to cover the wiring layer 110. The transmissive conductive film is shaped into the light-transmitting electrodes 659d1, 659s1, 659d2, and 659s2.

The upper structures such as the color filter, etc., are formed similarly to those of the sixth embodiment.

Thus, the subpixel group 620a that includes the two light-emitting surfaces 6653S1 and 6653S2 is formed.

According to the modification as well, similarly to the sixth embodiment, the number of light-emitting surfaces is not limited to two; three or more light-emitting surfaces may be provided in one semiconductor layer 650a.

Effects of the image display device of the embodiment will now be described.

Figure 32:
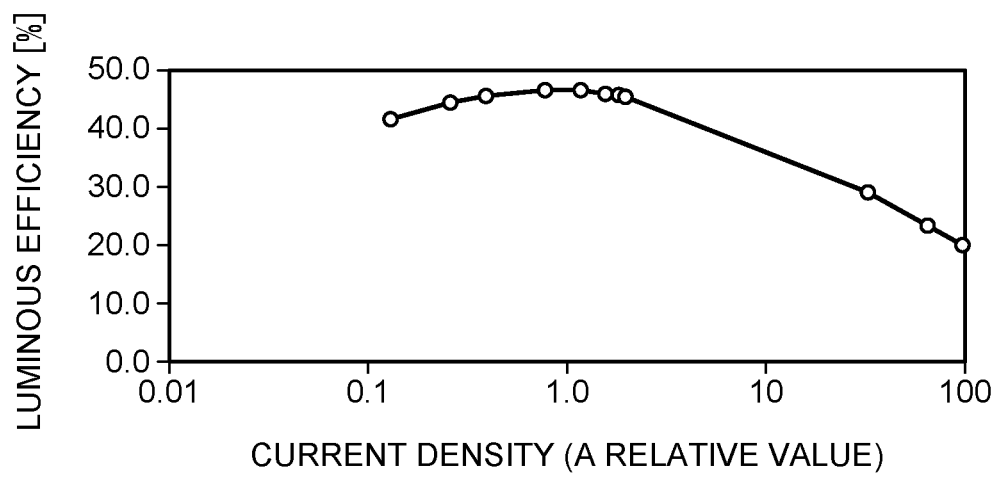
FIG. 32 is a graph illustrating a characteristic of a pixel LED element.

FIG. 32 is a graph illustrating a characteristic of a pixel LED element.

The vertical axis of FIG. 32 is the luminous efficiency (%) of the pixel LED element. The horizontal axis is the current density of the current caused to flow in the pixel LED element shown as a relative value.

As shown in FIG. 32, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 32 that there is a tendency for the current density to decrease and for the luminous efficiency to decrease for a low current density.

As described in the first to fifth embodiments, the light-emitting element is formed by individually singulating by etching or the like of all of the layers of the semiconductor layer 1150 that includes the light-emitting layer. At this time, the bonding surface between the light-emitting layer and the p-type semiconductor layer is exposed at the end portion of the light-emitting element. Similarly, the bonding surface between the light-emitting layer and the n-type semiconductor layer is exposed at the end portion.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the bonding surfaces that contribute to the light emission at the end portions.

When two light-emitting elements that have cubic shapes of the same dimension emit light, end portions are formed at four side surfaces for each light-emitting element; therefore, the two light-emitting elements have a total of eight end portions, and recombination may occur at eight end portions.

In contrast, according to the embodiment, the semiconductor layers 650 and 650a include four side surfaces, and there are four end portions of the two light-emitting surfaces. However, the region between the openings 658-1 and 658-2 substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission is reduced. By reducing the recombination that does not contribute to the light emission, the drive current per light-emitting surface is reduced.

When reducing the distance between the subpixels for higher definition of the image display device or the like, when the current density is relatively high, etc., the distance between the light-emitting surface 653S1 and the light-emitting surface 653S2 becomes substantially short in the subpixel group 620 of the sixth embodiment. In such a case, when the p-type semiconductor layer is shared as in the sixth embodiment, there is a risk that a portion of the holes injected into the light-emitting surface being driven may shunt, and the light-emitting surface that is not being driven may have a micro light emission. In the subpixel group 620a of the modification, the p-type semiconductor layer is divided into two, and each p-type semiconductor layer includes a light-emitting surface; therefore, the micro light emission of the light-emitting surface at the side that is not driven can be reduced.

According to the embodiment, the semiconductor layer that includes the light-emitting layer is formed by crystal growth from the n-type semiconductor layer on the connection plate 630a, and is favorable from the perspective of reducing the manufacturing cost. Similarly to the other embodiments, the p-type semiconductor layer, the light-emitting layer, and the n-type semiconductor layer may be stacked in this order from the connection plate 630a side as described above instead of the stacking order of the n-type semiconductor layer and the p-type semiconductor layer.

According to the embodiment and the modifications, by using the connection plate 630a as a wiring part, the semiconductor layers of the lower layers of the semiconductor layers 650 and 650a can be electrically connected with the external circuit without vias for each light-emitting surface. It is therefore unnecessary to ensure a region on the connection plate 630a for via connection; therefore, a high density arrangement of the circuit elements is possible. Also, a yield increase is expected because the draw-out structure of the wiring parts for connecting with the external wiring is simplified.

Specific examples of the subpixels and subpixel groups of the image display devices of the embodiments are described above. Each specific example is an example, and other configuration examples are possible by appropriately combining the configurations and procedures of processes of these embodiments. For example, a connection plate may be used to connect to a power supply line or a ground line without using a via according to the first to fifth embodiments, and the electrical connection of the light-emitting element may be performed using a via according to the sixth embodiment.

Seventh Embodiment

The image display device described above can be used as an image display module having the appropriate number of pixels in, for example, a computer display, a television, a portable terminal such as a smartphone, car navigation, etc.

Figure 33:
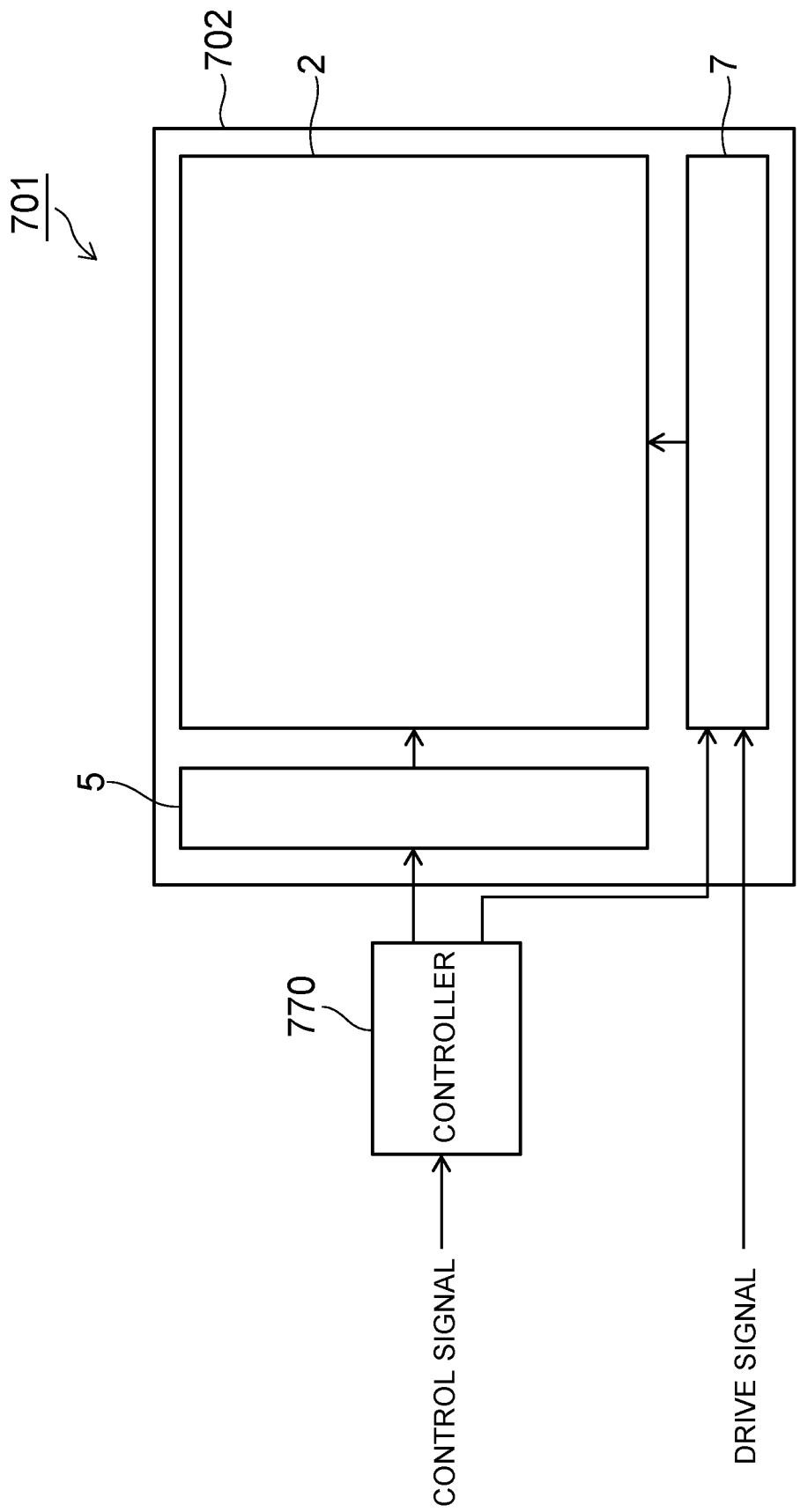
FIG. 33 is a block diagram illustrating an image display device according to a seventh embodiment.

FIG. 33 is a block diagram illustrating an image display device according to the embodiment.

FIG. 33 shows the major parts of the configuration of a computer display.

As shown in FIG. 33, the image display device 701 includes an image display module 702. The image display module 702 is, for example, an image display device that includes the configuration according to the first embodiment described above. The image display module 702 includes the display region 2 in which the multiple subpixels including the subpixels 20 are arranged, the row selection circuit 5, and the signal voltage output circuit 7.

The image display device 701 further includes a controller 770. The controller 770 receives input of control signals that are separated and generated by not-illustrated interface circuitry, and controls the driving and the drive sequence of the subpixels in the row selection circuit 5 and the signal voltage output circuit 7.

(Modification)

The image display device described above can be used as an image display module including the appropriate number of pixels in, for example, a computer display, a television, a portable terminal such as a smartphone, car navigation, etc.

Figure 34:
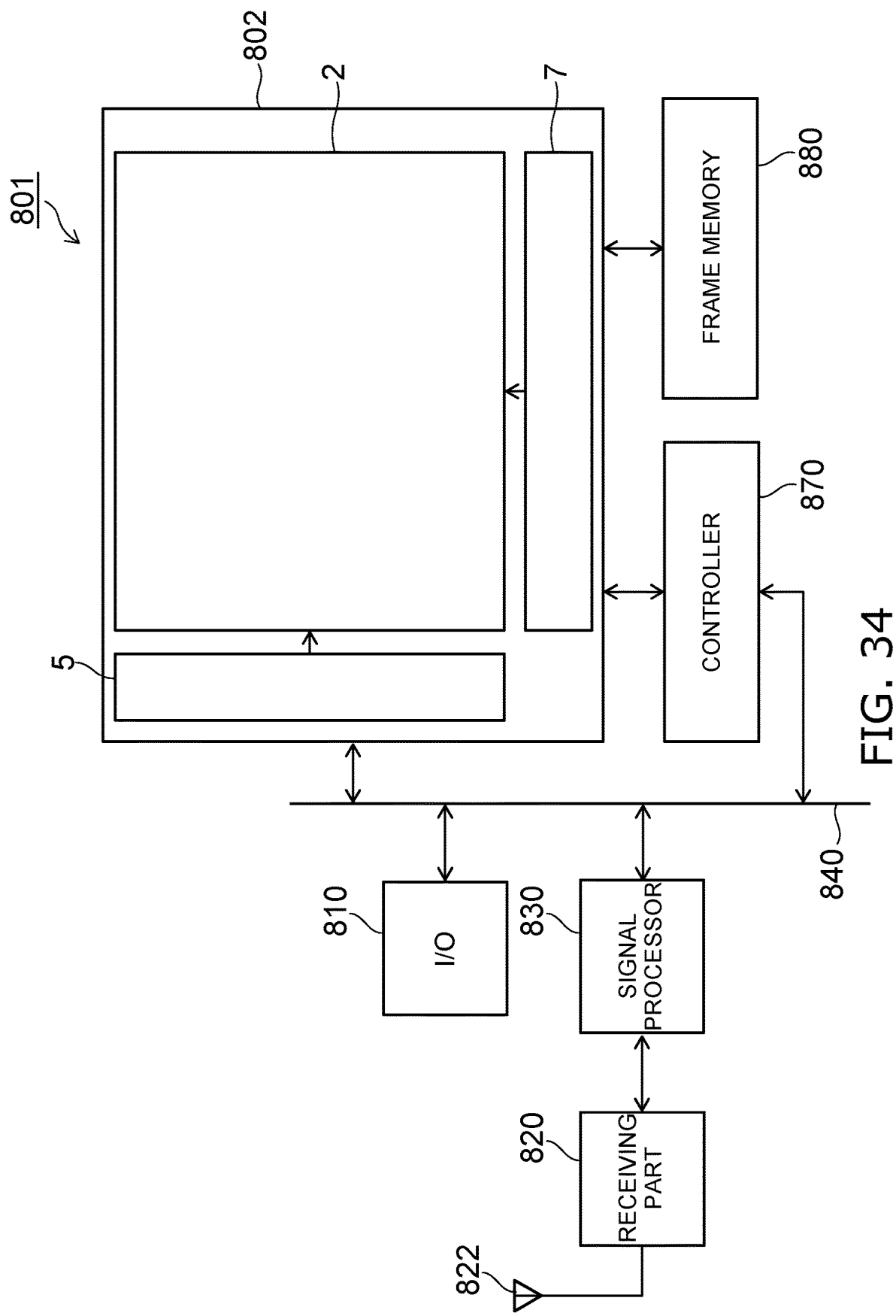
FIG. 34 is a block diagram illustrating an image display device according to a modification of the seventh embodiment.

FIG. 34 is a block diagram illustrating an image display device according to a modification of the embodiment.

FIG. 34 shows the configuration of a high-definition thin television.

As shown in FIG. 34, the image display device 801 includes an image display module 802. The image display module 802 is, for example, the image display device 1 that includes the configuration according to the first embodiment described above. The image display device 801 includes a controller 870 and a frame memory 880. The controller 870 controls the drive sequence of the subpixels of the display region 2 based on a control signal supplied by a bus 840. The frame memory 880 stores one frame of display data and is used for smooth processing such as video image reproduction, etc.

The image display device 801 includes an I/O circuit 810. The I/O circuit 810 is labeled as simply "I/O" in FIG. 34. The I/O circuit 810 provides interface circuitry for connecting with an external terminal, a device, etc. The I/O circuit 810 includes, for example, an audio interface, a USB interface that connects an external hard disk device, etc.

The image display device 801 includes a receiving part 820 and a signal processor 830. An antenna 822 is connected to the receiving part 820, and the necessary signal is separated and generated from the radio wave received by the antenna 822. The signal processor 830 includes a DSP (Digital Signal Processor), a CPU (Central Processing Unit), etc., and the signal that is separated and generated by the receiving part 820 is separated and generated into image data, voice data, etc., by the signal processor 830.

Other image display devices also can be made by using the receiving part 820 and the signal processor 830 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used. Also, it goes without saying that the configurations of the image display modules according to the embodiment and modifications include many subpixels as shown in FIG. 11.

According to the embodiments described above, a method for manufacturing an image display device and an image display device can be realized in which a transfer process of a light-emitting element is reduced, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions and equivalents recited in the claims. Also, the embodiments described above can be implemented in combination with each other.

What is claimed is:

1. A method for manufacturing an image display device, the method comprising:
    forming a conductive layer on a first substrate, wherein at least a part of the conductive layer is formed of a single-crystal metal;
    forming a semiconductor layer on said part of the conductive layer, the semiconductor layer comprising a light-emitting layer;
    forming a light-emitting element by patterning the semiconductor layer, the light-emitting element including:
        a bottom surface facing said part of the conductive layer, and
        a light-emitting surface at a side opposite to the bottom surface;
    forming a first insulating film that covers the first substrate, the conductive layer, and the light-emitting element;
    forming a circuit element on the first insulating film;
    forming a second insulating film that covers the first insulating film and the circuit element;
    exposing a surface that includes the light-emitting surface by removing a portion of the first insulating film and a portion of the second insulating film; and
    forming a wiring layer on the second insulating film.

2. The method for manufacturing the image display device according to claim 1, wherein:
    the forming of the conductive layer includes:
        forming a metal layer on the first substrate, and
        forming said part of the conductive layer by annealing treatment of the metal layer; and
    in a plan view, an outer perimeter of the light-emitting element is located within an outer perimeter of said part of the conductive layer.

3. The method for manufacturing the image display device according to claim 2, wherein:
    the forming of the conductive layer comprises, before the annealing treatment of the metal layer, patterning the metal layer.

4. The method for manufacturing the image display device according to claim 1, wherein:
    the first substrate comprises a light-transmitting substrate.

5. The method for manufacturing the image display device according to claim 4, wherein:
    the first substrate further comprises a flexible substrate located on the light-transmitting substrate; and
    the method further comprises, after the wiring layer is formed, removing the light-transmitting substrate.

6. The method for manufacturing the image display device according to claim 1, further comprising:
    before the forming of the semiconductor layer, forming a graphene-including layer on said part of the conductive layer.

7. The method for manufacturing the image display device according to claim 1, further comprising:
    forming a light-transmitting electrode on the light-emitting surface.

8. The method for manufacturing the image display device according to claim 1, further comprising:
    forming a via that extends through the first and second insulating films, the via being located between said part of the conductive layer and the wiring layer and electrically connecting said part of the conductive layer and the wiring layer.

9. The method for manufacturing the image display device according to claim 1, wherein:
    the semiconductor layer comprises a gallium nitride compound semiconductor.

10. The method for manufacturing the image display device according to claim 1, further comprising:
    forming a wavelength conversion member on the light-emitting element.

11. An image display device comprising:
    a substrate including a first surface;
    a conductive layer located on the first surface, wherein at least a part of the conductive layer is formed of a single-crystal metal;
    a light-emitting element located on said part of the conductive layer, the light-emitting element including:
        a bottom surface electrically connected to said part of the conductive layer, and a light-emitting surface at a side opposite to the bottom surface;

a first insulating film that covers the conductive layer, the first surface, and a side surface of the light-emitting element;

a circuit element located on the first insulating film;

a second insulating film that covers the first insulating film and the circuit element; and a wiring layer located on the second insulating film.

12. The image display device according to claim 11, wherein:

the substrate comprises a light-transmitting substrate.

13. The image display device according to claim 11, wherein:

the substrate comprises a flexible substrate.

14. The image display device according to claim 11, wherein:

in a plan view, an outer perimeter of the light-emitting element is located within an outer perimeter of said part of the conductive layer.

15. The image display device according to claim 11, wherein:

the light-emitting element comprises:
a first semiconductor layer of a first conductivity type,
a light-emitting layer located on the first semiconductor layer, and
a second semiconductor layer located on the light-emitting layer, the second semiconductor layer being of a second conductivity type different from the first conductivity type;

the first semiconductor layer, the light-emitting layer, and the second semiconductor layer are stacked in this order from the bottom surface toward the light-emitting surface; and the first semiconductor layer is located on said part of the conductive layer and electrically connected to said part of the conductive layer.

16. The image display device according to claim 15, wherein:

the first conductivity type is a p-type, and the second conductivity type is an n-type.

17. The image display device according to claim 11, further comprising:

a via extending through the first and second insulating films, the via being located between said part of the conductive layer and the wiring layer and electrically connecting said part of the conductive layer and the wiring layer.

18. The image display device according to claim 17, wherein:

the wiring layer includes:
a first wiring part connected to the via, and
a second wiring part connected to a surface that includes the light-emitting surface; and the light-emitting element is electrically connected to the circuit element via the second wiring part and the surface including the light-emitting surface.

19. The image display device according to claim 17, wherein:

the wiring layer includes:
a third wiring part connected to the via, and
a fourth wiring part connected to a surface that includes the light-emitting surface; and the light-emitting element is electrically connected to the circuit element by said part of the conductive layer, the via, and the third wiring part.

20. The image display device according to claim 11, further comprising:

a graphene-including layer located between said part of the conductive layer and the light-emitting element.

21. The image display device according to claim 11, further comprising:

a light-transmitting electrode located on the light-emitting surface.

22. The image display device according to claim 11, wherein:

the light-emitting element includes a gallium nitride compound semiconductor.

23. The image display device according to claim 11, further comprising:

a wavelength conversion member on the light-emitting element.

24. An image display device comprising:

a substrate including a first surface;

a conductive layer located on the first surface, wherein at least a part of the conductive layer is formed of a single-crystal metal;

a semiconductor layer located on said part of the conductive layer, the semiconductor layer including:
a bottom surface electrically connected to said part of the conductive layer, and
a plurality of light-emitting surfaces at a surface at a side opposite to the bottom surface;

a first insulating film that covers the conductive layer, the first surface, and a side surface of the semiconductor layer;

a plurality of transistors located on the first insulating film;

a second insulating film that covers the first insulating film and the plurality of transistors; and a wiring layer located on the second insulating film.

25. The image display device according to claim 24, wherein:

the semiconductor layer includes:
a first semiconductor layer,
a light-emitting layer located on the first semiconductor layer, and
a second semiconductor layer located on the light-emitting layer;

the first semiconductor layer, the light-emitting layer, and the second semiconductor layer are stacked in this order from the bottom surface toward the plurality of light-emitting surfaces, and the second semiconductor layer is divided by the first insulating film.

* * * * *